United States Patent
Sueki et al.

(10) Patent No.: US 10,657,917 B2
(45) Date of Patent: May 19, 2020

(54) SHIFT REGISTER AND DISPLAY DEVICE INCLUDING SAME

(71) Applicant: SHARP KABUSHIKI KAISHA, Sakai, Osaka (JP)

(72) Inventors: Toshitsugu Sueki, Sakai (JP); Yasuaki Iwase, Sakai (JP); Takuya Watanabe, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 225 days.

(21) Appl. No.: 15/767,510

(22) PCT Filed: Oct. 12, 2016

(86) PCT No.: PCT/JP2016/080189
§ 371 (c)(1),
(2) Date: Apr. 11, 2018

(87) PCT Pub. No.: WO2017/069021
PCT Pub. Date: Apr. 27, 2017

(65) Prior Publication Data
US 2018/0308444 A1 Oct. 25, 2018

(30) Foreign Application Priority Data
Oct. 19, 2015 (JP) ................ 2015-205265

(51) Int. Cl.
G11C 19/00 (2006.01)
G09G 3/36 (2006.01)
G11C 19/28 (2006.01)

(52) U.S. Cl.
CPC ......... G09G 3/3674 (2013.01); G09G 3/3677 (2013.01); G11C 19/28 (2013.01);
(Continued)

(58) Field of Classification Search
None
See application file for complete search history.

(56) References Cited

U.S. PATENT DOCUMENTS 8,519,764 B2 * 8/2013 Iwamoto ............. G09G 3/3685
327/199
8,531,224 B2 * 9/2013 Iwamoto ............. G09G 3/3685
327/199

(Continued)

FOREIGN PATENT DOCUMENTS

JP 2012-134475 A 7/2012
JP 2014-007399 A 1/2014

(Continued)

Primary Examiner — Tuan T Lam
(74) Attorney, Agent, or Firm — ScienBiziP, P.C.

(57) ABSTRACT

A shift register is implemented that can increase the reliability of long-term operation regarding the driving of gate bus lines over a conventional configuration. The shift register is allowed to operate by clock signals of eight or more phases with an on-duty of less than ½. A stabilization node control portion brings a stabilization node (NB) to an on level for a period less than 50 percent of a normal operation period, based on two or more clock signals among the clock signals of eight or more phases, the stabilization node (NB) being connected to a gate terminal of a thin film transistor that contributes to the drawing of a potential of an output control node (NA) to a VSS potential.

12 Claims, 44 Drawing Sheets

(52) U.S. Cl.
    CPC . *G09G 2310/0286* (2013.01); *G09G 2310/08* (2013.01); *G09G 2330/021* (2013.01)

(56) References Cited

U.S. PATENT DOCUMENTS

| | | | |
|---|---|---|---|
| 8,860,706 B2* | 10/2014 | Sakamoto | G11C 19/28 345/204 |
| 2006/0267911 A1* | 11/2006 | Jang | G11C 19/00 345/100 |
| 2011/0002438 A1* | 1/2011 | Kim | G11C 19/28 377/67 |
| 2011/0199354 A1 | 8/2011 | Iwase et al. | |
| 2012/0138922 A1 | 6/2012 | Yamazaki et al. | |
| 2012/0188210 A1* | 7/2012 | Zhang | G09G 3/3677 345/204 |
| 2012/0218245 A1* | 8/2012 | Morii | G09G 3/3677 345/211 |
| 2013/0320334 A1 | 12/2013 | Yamazaki et al. | |
| 2014/0286076 A1 | 9/2014 | Aoki et al. | |
| 2016/0247479 A1* | 8/2016 | Cho | G09G 3/3677 |
| 2016/0253975 A1* | 9/2016 | Yang | G11C 19/28 345/58 |
| 2017/0032731 A1* | 2/2017 | Shim | G09G 3/3677 |

FOREIGN PATENT DOCUMENTS

| | | |
|---|---|---|
| JP | 2014-209727 A | 11/2014 |
| WO | 2010/067641 A1 | 6/2010 |

\* cited by examiner

SHIFT REGISTER AND DISPLAY DEVICE INCLUDING SAME

TECHNICAL FIELD

The present invention relates to a display device and more particularly to a shift register for driving gate bus lines (scanning signal lines) disposed in a display unit of a display device.

BACKGROUND ART

Conventionally, there is known a liquid crystal display device including a display unit that includes a plurality of source bus lines (video signal lines) and a plurality of gate bus lines (scanning signal lines). For such a liquid crystal display device, conventionally, a gate driver (scanning signal line drive circuit) for driving the gate bus lines is often mounted, as an integrated circuit (IC) chip, on the periphery of a substrate forming a liquid crystal panel. However, in recent years, the formation of the gate driver directly on a TFT substrate which is one of two glass substrates forming the liquid crystal panel has been gradually increasing. Such a gate driver is called "monolithic gate driver", etc.

In the liquid crystal display device, a pixel formation portion that forms a pixel is provided at an intersection of a source bus line and a gate bus line. Each pixel formation portion includes a thin film transistor which is a switching element connected at its gate terminal to a gate bus line passing through a corresponding intersection and connected at its source terminal to a source bus line passing through the intersection; a pixel capacitance for holding a pixel voltage value; and the like. The liquid crystal display device is also provided with the above-described gate driver and a source driver (video signal line drive circuit) for driving the source bus lines.

A video signal representing a pixel voltage value is transmitted by a source bus line. However, each source bus line cannot transmit video signals at a time (simultaneously), the video signals representing pixel voltage values for a plurality of rows. Hence, writing (charging) of video signals to the pixel capacitances in the plurality of pixel formation portions provided in the display unit is sequentially performed row by row. Hence, the gate driver is composed of a shift register including a plurality of stages, so that the plurality of gate bus lines can be sequentially selected for a predetermined period. Then, by sequentially outputting active scanning signals from the respective stages of the shift register, writing of video signals to the pixel capacitances is sequentially performed row by row as described above. Note that, in this specification, a circuit that forms each stage of the shift register is referred to as "unit circuit".

FIG. 43 is a circuit diagram, of a conventional unit circuit having the simplest configuration. The unit circuit includes four thin film transistors T81 to T84 and one capacitor CAP. In addition, the unit circuit has one output terminal 80 and four input terminals 81 to 84, in addition to input terminals for a low-level direct-current power supply potential VSS. A gate terminal of the thin film transistor T81, a source terminal of the thin film transistor T83, and a drain terminal of the thin film transistor T84 are connected to each other. A region in which they are connected to each other is referred to as "output control node". The output control node is denoted by reference character NA. Note that in general one of a drain and a source with a higher potential is called a drain, but in the description of this specification, since one is defined as a drain and the other as a source, a source potential may be higher than a drain potential. In addition, the potential magnitude of the low-level direct-current power supply potential VSS is referred to as "VSS potential" for convenience sake.

An output signal G is outputted from the output terminal 80. The output signal G is provided as a scanning signal to a gate bus line connected to this unit circuit, and provided as a control signal to a unit circuit of the previous stage and a unit circuit of the subsequent stage. A clock signal CKa is provided to the input terminal 81. A clock signal CKb is provided to the input terminal 82. Note that the clock signal CKa and the clock signal CKb are shifted in phase by 180 degrees relative to each other. An output signal G outputted from the unit circuit of the previous stage is provided as a set signal S to the input terminal 83. An output signal G outputted from the unit circuit of the subsequent stage is provided as a reset signal R to the input terminal 84. Note that in the following the "unit circuit of the previous stage" may be simply abbreviated as "previous stage", and the "unit circuit of the subsequent stage" may be simply abbreviated as "subsequent stage".

The thin film transistor T81 is connected at its gate terminal to the output control node NA, connected at its drain terminal to the input terminal 81, and connected at its source terminal to the output terminal 80. The thin film transistor T82 is connected at its gate terminal to the input terminal 82, connected at its drain terminal to the output terminal 80, and connected at its source terminal to am input terminal for a direct-current power supply potential VSS. The thin film transistor T83 is connected at its gate and drain terminals to the input terminal 83 (i.e., diode-connected) and connected at its source terminal to the output control node NA. The thin film transistor T84 is connected at its gate terminal to the input terminal 84, connected at its drain terminal to the output control node NA, and connected at its source terminal to an input terminal for a direct-current power supply potential VSS. The capacitor CAP is connected at its one end to the output control node NA and connected at its other end to the output terminal 80.

Next, with reference to FIG. 44, the operation of the unit circuit of the configuration shown in FIG. 43 will be described. Note that in the following, for each unit circuit, a period during which operation is performed to write (charge) to pixel capacitances in pixel formation portions connected to a corresponding gate bus line is referred to as "write operation period". Note also that a period other than the write operation period is referred to as "normal operation period". In FIG. 44, a period from time point t80 to time point t82 is a write operation period, and a period before time point t80 and a period after time point t82 are normal operation periods.

First, operation performed during the write operation period will be described. At time point t80, a pulse of the set signal S is provided to the input terminal 83. Since the thin film transistor T83 is diode-connected as shown in FIG. 43, by the pulse of the set signal S, the thin film, transistor T83 goes into an on state and the capacitor CAP is charged. By this, the potential of the output control node NA increases and the thin film transistor T81 goes into an on state. Here, during a period from time point t80 to time point t81, the clock signal CKa is at a low level. Hence, during this period, the output signal G is maintained at a low level. In addition, during the period from time point t80 to time point t81, since the reset signal R is at a low level, the thin film transistor T84 is maintained in an off state. Hence, the potential of the output control node NA does not decrease during this period.

At time point t81, the clock signal CKa changes from the low level to a high level. At this time, since the thin film transistor T81 is in the on state, the potential of the output terminal 80 increases with an increase in the potential of the input terminal 81. Here, since the capacitor CAP is provided between the output control node NA and the output terminal 80 as shown in FIG. 43, the potential of the output control node NA also increases with the increase in the potential of the output terminal 80 (the output control node NA is bootstrapped). As a result, a large voltage is applied to the gate terminal of the thin film transistor T81, and the potential of the output signal G increases to a high-level potential of the clock signal CKa. By this, the gate bus line connected to the output terminal 80 of this unit circuit goes into a selected state. Note that during a period from time point t81 to time point t82, the clock signal CKb is at a low level. Hence, since the thin film transistor T82 is maintained in an off state, the potential of the output signal G does not decrease during this period.

At time point t82, the clock signal CKa changes from the high level to a low level. By this, the potential of the output terminal 80 decreases with a decrease in the potential of the input terminal 81, and the potential of the output control node NA also decreases through the capacitor CAP. In addition, at time point t82, a pulse of the reset signal R is provided to the input terminal 84. By this, the thin film transistor T84 goes into an on state. As a result, the potential of the output control node NA changes from the high level to a low level. In addition, at time point t82, the clock signal CKb changes from the low level to a high level. By this, the thin film transistor T82 goes into an on state. As a result, the potential of the output signal G goes to a low level.

In the above-described manner, during the second half-period of the write operation period, an active scanning signal is provided to the gate bus line corresponding to this unit circuit. An output signal G outputted from a unit circuit of any stage is provided as a set signal S to the subsequent stage. By this, the plurality of gate bus lines provided to the liquid crystal display device sequentially go into a selected state, and writing to the pixel capacitances is performed row by row.

However, according to the above-described configuration, during the normal operation period, the potential of the output signal G (scanning signal) which is supposed to be fixed at a low level may fluctuate due to noise caused by the clock signal CKa, which will be described below. A parasitic capacitance is formed between the electrodes of a thin film transistor in a unit circuit that forms the shift register. Therefore, in the configuration shown in FIG. 43, a parasitic capacitance is formed between the gate and drain of the thin film transistor T81 and also between the gate and source of the thin film transistor T81. Hence, when the clock signal CKa changes from a low level to a nigh level, the gate potential of the thin film transistor T81 increases through the parasitic capacitance. That is, despite the fact that the potential of the output control node NA is supposed to be fixed at a low level, the potential of the output control node NA increases somewhat (the potential of the output control node NA floats). By this, a leakage current flows through the thin film transistor T81 and accordingly the potential of the output signal G fluctuates. As can be grasped from FIG. 44, the clock signal CKa changes from a low level to a high level in a predetermined cycle throughout an operation period of the liquid crystal display device. Therefore, the potential of the output signal G (scanning signal) fluctuates in the predetermined cycle during the normal operation period. As a result, abnormal operation or an increase in power consumption is caused.

In view of this, in general, the unit circuit is provided with a circuit for maintaining the potential of the output control node NA at a low level throughout the normal operation period (hereinafter, referred to as "output control node stabilization portion"). FIG. 45 is a diagram schematically showing a configuration of a unit circuit having the output control node stabilization portion. As shown in FIG. 45, the unit circuit is provided with an output control node stabilization portion 950, in addition to a buffer 910, a scanning signal stabilization portion 920, an output control node setting portion 930, and an output control node resetting portion 940. Note that the thin film transistor T81, the thin film transistor T82, the thin film transistor T83, and the thin film transistor T84 of FIG. 43 correspond to the buffer 910, the scanning signal stabilization portion 920, the output control node setting portion 930, and the output control node resetting portion 940 of FIG. 45, respectively.

A specific configuration of a conventional unit circuit having an output control node stabilization portion is disclosed in, for example, WO 2010/067641 A. FIG. 46 is a circuit diagram showing a configuration of a unit circuit disclosed in WO 2010/067641 A. The unit circuit shown in FIG. 46 includes 10 thin film transistors T91 to T100 and one capacitor CAP. In addition, the unit circuit has one output terminal 90 and six input terminals 91 to 96. A gate terminal of the thin film, transistor T91, a drain terminal of the thin film transistor T92, a source terminal of the thin film transistor T95, a gate terminal of the thin film transistor T96, and a drain terminal of the thin film transistor T97 are connected to each other through an output control node NA. A gate terminal of the thin film transistor T92, a source terminal of the thin film transistor T93, a drain terminal of the thin film transistor T94, a drain terminal of the thin film transistor T96, and a gate terminal of the thin film transistor T100 are connected to each other. A region in which they are connected to each other is referred to as "stabilization node". The stabilization node is denoted by reference character NB.

The thin film transistor T91 is connected at its gate terminal to the output control node NA, connected at its drain terminal to the input terminal 91, and connected at its source terminal to the output terminal 90. The thin film transistor T92 is connected at its gate terminal to the stabilization node NB, connected at its drain terminal to the output control node NA, and connected at its source terminal to an input terminal for a direct-current power supply potential VSS. The thin film transistor T93 is connected at its gate and drain terminals to the input terminal 93 (i.e., diode-connected) and connected at its source terminal to the stabilization node NB. The thin film transistor T94 is connected at its gate terminal to the input terminal 94, connected at its drain terminal to the stabilization node NB, and connected at its source terminal to an input terminal for a direct-current power supply potential VSS. The thin film transistor T95 is connected at its gate and drain terminals to the input terminal 95 (i.e., diode-connected) and connected at its source terminal to the output control node NA. The thin film transistor T96 is connected at its gate terminal to the output control node NA, connected at its drain terminal to the stabilization node NB, and connected at its source terminal to an input terminal for a direct-current power supply potential VSS. The thin film transistor T97 is connected at its gate terminal to the input terminal 96, connected at its drain terminal to the output control node NA, and connected at its source terminal to an input terminal for a direct-current power supply potential VSS. The thin film transistor T98 is connected at its gate terminal to the input terminal 96, connected at its drain terminal to the output terminal 90, and connected at its source terminal to an input terminal for a direct-current power supply potential VSS. The thin film transistor T99 is connected at its gate terminal to the input terminal 92, connected at its drain terminal to the output terminal 90, and connected at its source terminal to an input terminal for a direct-current power supply potential VSS. The thin film transistor T100 is connected at its gate terminal to the stabilization node NB, connected at its drain terminal to the output terminal 90, and connected at its source terminal to an input terminal for a direct-current power supply potential VSS. The capacitor CAP is connected at its one end to the output control node NA and connected at its other end to the output terminal 90. In a configuration such as that described above, the above-described output control node stabilization portion 950 is implemented by the thin film transistors T92, T93, T94, and T96.

FIG. 47 is a signal waveform diagram for describing the operation of the unit circuit of the configuration shown in FIG. 46. As can be grasped from FIG. 47, the unit circuit operates based on 4-phase clock signals (a clock signal CKa, a clock signal CKb, a clock signal CKc, and a clock signal CKd) which are shifted in phase by 90 degrees relative to each other. In FIG. 47, attention is focused on a normal operation period. During the normal operation period, since the potential of the output control node NA is maintained at a low level, the thin film transistor T96 is maintained in an off state. In addition, during a period during which the clock signal CKc is at a high level and the clock signal CKd is at a low level, the thin film transistor T93 is in an on state and the thin film transistor T94 is in an off state. In addition, during a period during which the clock signal CKc is at a low level and the clock signal CKa is at a high level, the thin film transistor T93 is in an off state and the thin film transistor T94 is in an on state. By the above, as shown in FIG. 47, during the normal operation period, the potential of the stabilization node NB goes to a high level every predetermined period. By this, during the normal operation period, the thin film transistor T92 goes into an on state every predetermined period, and the potential of the output control node NA is drawn to the VSS potential. In the above-described manner, the potential of the output control node NA is prevented from floating during the normal operation period, implementing a monolithic gate driver that does not cause abnormal operation. Note that the thin film transistor T96 is provided to prevent the potential of the stabilization node NB from going to a high level during the write operation period.

PRIOR ART DOCUMENT

Patent Document

[Patent Document 1] WO 2010/067641 A

SUMMARY OF THE INVENTION

Problems to be Solved by the Invention

However, in the configuration shown in FIG. 46, the potential of the stabilization node NB is at a high level for substantially a half-period of the operation period of the device. Hence, the thin film transistor T92 which is provided to draw the potential of the output control node NA to the VSS potential is likely to cause a threshold shift (threshold voltage fluctuation). Therefore, when the use period of the device is long, it becomes difficult to maintain the potential of the output control node NA at a low level throughout the normal operation period due to the threshold shift of the thin film transistor T92. As such, according to the conventional configuration, the reliability of long-term operation regarding the driving of the gate bus lines is not sufficiently ensured.

An object of the present invention is therefore to implement a shift register capable of increasing the reliability of long-term operation regarding the driving of the gate bus lines over the conventional configuration.

Means for Solving the Problems

A first aspect of the present invention is directed to a shift register for driving scanning signal lines, the shift register including a plurality of stages and sequentially outputting active output signals from the plurality of stages based on a plurality of clock signals that periodically repeat an on level and an off level, wherein
a unit circuit that forms each of the plurality of stages includes:
an output node configured to output the output signal;
an output control transistor having a control terminal, a first conduction terminal to which one of the plurality of clock signals is provided, and a second conduction terminal connected to the output node;
an output control node connected to the control terminal of the output control transistor;
an output control node setting portion configured to bring the output control node to an on level, based on an output signal outputted from a preceding stage; and
a target node control portion configured to maintain a target node at an off level during a normal operation period, the target node being at least one of the output node and the output control node,
the target node control portion includes:
at least one stabilization transistor having a control terminal, a first conduction terminal connected to a corresponding target node, and a second conduction terminal to which an off-level potential is provided;
a stabilization node connected to the control terminal of the stabilization transistor; and
a stabilization node control portion configured to control a level of the stabilization node,
the plurality of clock signals are clock signals of eight or more phases with an on-duty of less than ½, and
the stabilization node control portion brings the stabilization node to an on level for a period less than 50 percent of the normal operation period, based on two or more clock signals among the plurality of clock signals.

According to a second aspect of the present invention, in the first aspect of the present invention,
the target node control portion regards both of the output node and the output control node as target nodes, and
the stabilization transistor includes:
an output control node stabilization transistor having a first conduction terminal connected to the output control node; and
an output node stabilization transistor having a first conduction terminal connected to the output node.

According to a third aspect of the present invention, in the first aspect of the present invention,
the plurality of clock signals are 8-phase clock signals with an on-duty of ¼, and during the normal operation period, the stabilization node control portion brings the stabilization node to an on level, based on a clock signal whose phase is advanced by 45 degrees relative to a phase of the clock signal provided to the first conduction terminal of the output control transistor, and brings the stabilization node to an off level, based on a clock signal whose phase is delayed by 45 degrees relative to the phase of the clock signal provided to the first conduction terminal of the output control transistor.

According to a fourth aspect of the present invention, in the first aspect of the present invention, the plurality of clock signals are 8-phase clock signals with an on-duty of $3/8$, and during the normal operation period, the stabilization node control portion brings the stabilization node to an on level, based on a clock signal whose phase is advanced by 90 degrees relative to a phase of the clock signal provided to the first conduction terminal of the output control transistor, and brings the stabilization node to an off level, based on a clock signal whose phase is delayed by 45 degrees relative to the phase of the clock signal provided to the first conduction terminal of the output control transistor.

According to a fifth aspect of the present invention, in the first aspect of the present invention, the plurality of clock signals are 8-phase clock signals with an on-duty of $1/4$, and during the normal operation period, the stabilization node control portion brings the stabilization node to an on level, based on a clock signal whose phase is advanced by 90 degrees relative to a phase of the clock signal provided to the first conduction terminal of the output control transistor, and brings the stabilization node to an off level, based on a clock signal whose phase is delayed by 45 degrees relative to the phase of the clock signal provided to the first conduction terminal of the output control transistor.

According to a sixth aspect of the present invention, in the first aspect of the present invention, the target node control portion further includes a plurality of target node stabilization transistors per target node, each of the plurality of target node stabilization transistors having a control terminal connected to a stabilization node in a unit circuit forming a stage other than this stage, a first conduction terminal connected to a corresponding target node, and a second conduction terminal to which an off-level potential is provided, and during a period in the normal operation period other than a period during which the stabilization node in the unit circuit forming this stage is at an on level, at all times, at least one of the stabilization nodes connected to the respective control terminals of the plurality of target node stabilization transistors is at an on level.

According to a seventh aspect of the present invention, in the sixth aspect of the present invention, the plurality of clock signals are 8-phase clock signals with an on-duty of $1/4$, during the normal operation period, the stabilization node control portion brings the stabilization node to an on level, based on a clock signal whose phase is advanced by 45 degrees relative to a phase of the clock signal provided to the first conduction terminal of the output control transistor, and brings the stabilization node to an off level, based on a clock signal whose phase is delayed by 45 degrees relative to the phase of the clock signal provided to the first conduction terminal of the output control transistor, and the plurality of target node stabilization transistors include:

a first target node stabilization transistor having a control terminal connected to a stabilization node in a unit circuit forming a stage two stages before this stage;

a second target node stabilization transistor having a control terminal connected to a stabilization node in a unit circuit forming a stage two stages after this stage; and a third target node stabilization transistor having a control terminal connected to a stabilization node in a unit circuit forming a stage four stages after this stage.

According to an eighth aspect of the present invention, in the sixth aspect of the present invention, the plurality of clock signals are 8-phase clock signals with an on-duty of $3/8$, during the normal operation period, the stabilization node control portion brings the stabilization node to an on level, based on a clock signal whose phase is advanced by 90 degrees relative to a phase of the clock signal provided to the first conduction terminal of the output control transistor, and brings the stabilization node to an off level, based on a clock signal whose phase is delayed by 45 degrees relative to the phase of the clock signal provided to the first conduction terminal of the output control transistor, and the plurality of target node stabilization transistors include:

a first target node stabilization transistor having a control terminal connected to a stabilization node in a unit circuit forming a stage two stages before this stage; and a second target node stabilization transistor having a control terminal connected to a stabilization node in a unit circuit forming a stage three stages after this stage.

According to a ninth aspect of the present invention, in the first aspect of the present invention, the transistors included in the unit circuit are thin film transistors having amorphous silicon.

According to a tenth aspect of the present invention, in the first aspect of the present invention, the transistors included in the unit circuit are thin film transistors having an oxide semiconductor layer.

An eleventh aspect of the present invention is directed to a display device including a display unit in which a plurality of scanning signal lines are disposed; and a shift register according to the first aspect of the present invention, the shift register including a plurality of stages provided so as to have a one-to-one correspondence with the plurality of scanning signal lines.

Effects of the Invention

According to the first aspect of the present invention, during the normal operation period, in every predetermined period, the potential of the stabilization node goes to an on level and the stabilization transistor goes into an on state. By this, during the normal operation period, the potential of a target node (at least one of the output node and the output control node) is drawn to an off level (e.g., a VDD potential) every predetermined period. As a result, the occurrence of abnormal operation caused by the clock operation of a clock signal is prevented. Here, by adopting clock signals of eight or more phases with an on-duty (duty cycle) of less than $1/2$ as clock signals for allowing the shift register to operate, a period in the normal operation period during which the potential of the stabilization node is at an on level becomes a period less than 50 percent. As such, the length of the period during which the potential of the stabilization node is at an on level is shorter than that of the conventional configuration. Therefore, the occurrence of a threshold shift of a transistor that contributes to the drawing of the potential of the target node to an off level is suppressed. By the above, the reliability of long-term operation regarding the driving of the scanning signal lines can be increased over the conventional configuration.

According to the second aspect of the present invention, during the normal operation period, even if noise caused by the clock operation of a clock signal occurs, both of the potential of the output node and the potential of the output control node are maintained at an off level.

According to the third aspect of the present invention, a period in the normal operation period during which the potential of the stabilization node is at an on level is a ¼ period. Hence, the same effect as that obtained in the first aspect of the present invention can be more securely obtained.

According to the fourth aspect of the present invention, a period in the normal operation period during which the potential of the stabilization node is at an on level is a ⅜ period. Hence, the same effect as that obtained in the first aspect of the present invention can be more securely obtained.

According to the fifth aspect of the present invention, a period in the normal operation period during which the potential of the stabilization node is at an on level is a ⅜ period. Hence, the same effect as that obtained in the first aspect of the present invention can be more securely obtained.

According to the sixth to eighth aspects of the present invention, in the unit circuit, a plurality of target node stabilization transistors for drawing the potential of a target node to an off level are provided per target node. Then, at least one of the plurality of target node stabilization transistors and the stabilization transistor is always in an on state during the normal operation period. Hence, the potential of the target node is always drawn to an off level during the normal operation period. By the above, the reliability of long-term operation regarding the driving of the scanning signal lines can be increased over the conventional configuration, and the stability of circuit operation can be remarkably increased.

According to the ninth aspect of the present invention, thin film transistors having amorphous silicon are used. Since thin film transistors having amorphous silicon are likely to cause a threshold shift, the same effect as that obtained in the first aspect of the present invention can be remarkably obtained.

According to the tenth aspect of the present invention, thin film transistors having an oxide semiconductor layer are used. Hence, while excellent display quality is maintained, power consumption can be significantly reduced.

According to the eleventh aspect of the present invention, a display device including a shift register that can obtain the same effect as that of any of the first to tenth aspects of the present invention is implemented.

According to the twelfth aspect of the present invention, circuits and wiring lines for driving the scanning signal lines do not need to be formed in a picture-frame region, enabling to implement a so-called oddly shaped display (a display device whose screen shape is not rectangular).

MODES FOR CARRYING OUT THE INVENTION

Embodiments of the present invention will be described below with reference to the accompanying drawings. Note that in the following description, a gate terminal (gate electrode) of a thin film transistor corresponds to a control terminal, a drain terminal (drain electrode) thereof corresponds to a first conduction terminal, and a source terminal (source electrode) thereof corresponds to a second conduction terminal.

1. First Embodiment

<1.1 Overall Configuration and Operation Overview>

Figure 2:
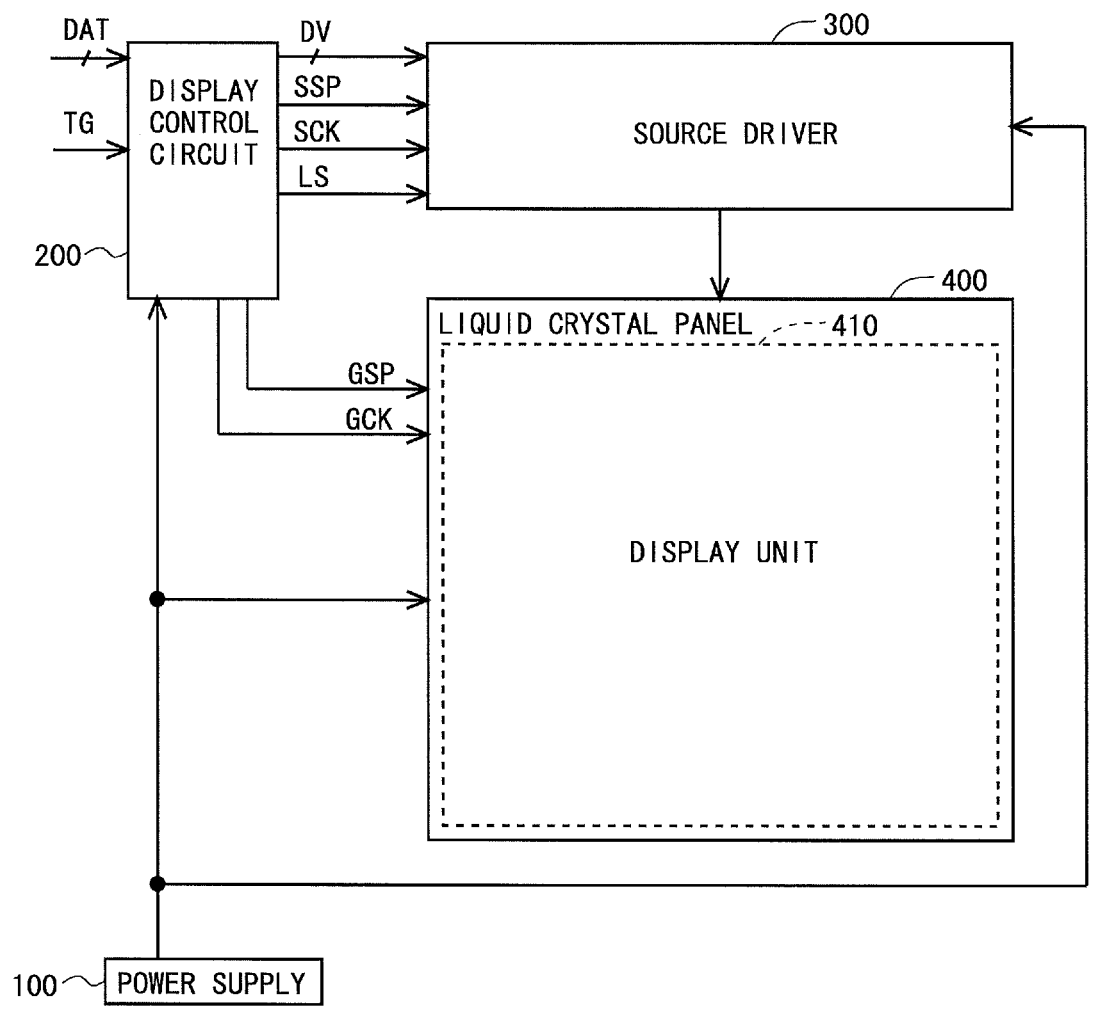
FIG. 2 is a block diagram, showing an overall configuration of the liquid crystal display device according to the first embodiment.

FIG. 2 is a block diagram showing an overall configuration of a liquid crystal display device according to a first embodiment of the present invention. As shown in FIG. 2, the liquid crystal display device includes a power supply 100, a display control circuit 200, a source driver (video signal line drive circuit) 300, and a liquid crystal panel 400. The liquid crystal panel 400 includes a display unit (pixel region) 410 that displays an image.

Figure 3:
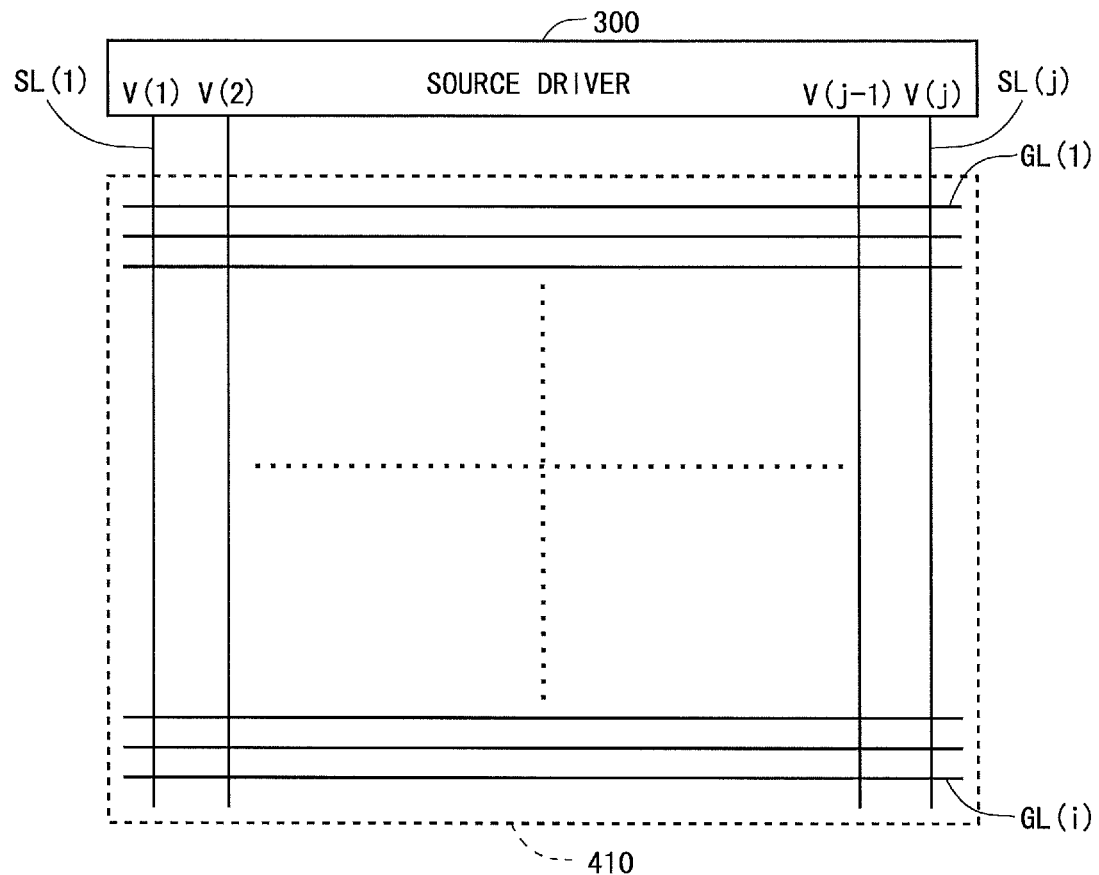
FIG. 3 is a diagram for describing a display unit of the first embodiment.
Figure 4:
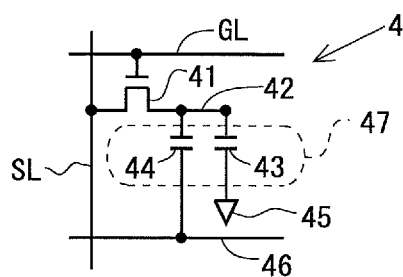
FIG. 4 is a diagram showing a configuration of a pixel formation portion in the first embodiment.

In the display unit 410, as shown in FIG. 3, there are disposed a plurality of (j) source bus lines (video signal lines) SL(1) to SL(j) and a plurality of (i) gate bus lines (scanning signal lines) GL(1) to GL(i). In addition, pixel formation portions each forming a pixel are provided at the respective intersections of the source bus lines SL and the gate bus lines GL. FIG. 4 is a circuit diagram showing a configuration of a pixel formation portion 4. The pixel formation portion 4 includes a thin film transistor (TFT) 41 which is a switching element connected at its gate terminal to a gate bus line GL passing through a corresponding intersection, and connected at its source terminal to a source bus line SL passing through the intersection; a pixel electrode 42 connected to a drain terminal of the thin film transistor 41; a common electrode 45 and an auxiliary capacitance electrode 46 which are provided so as to be shared by the plurality of pixel formation portions 4; a liquid crystal capacitance 43 formed by the pixel electrode 42 and the common electrode 45; and an auxiliary capacitance 44 formed by the pixel electrode 42 and the auxiliary capacitance electrode 46. By the liquid crystal capacitance 43 and the auxiliary capacitance 44, a pixel capacitance 47 is formed. Note that the configuration of the pixel formation portion 4 is not limited to that shown in FIG. 4. For example, a configuration in which the auxiliary capacitance 44 and the auxiliary capacitance electrode 46 are not provided can also be adopted.

Figure 5:
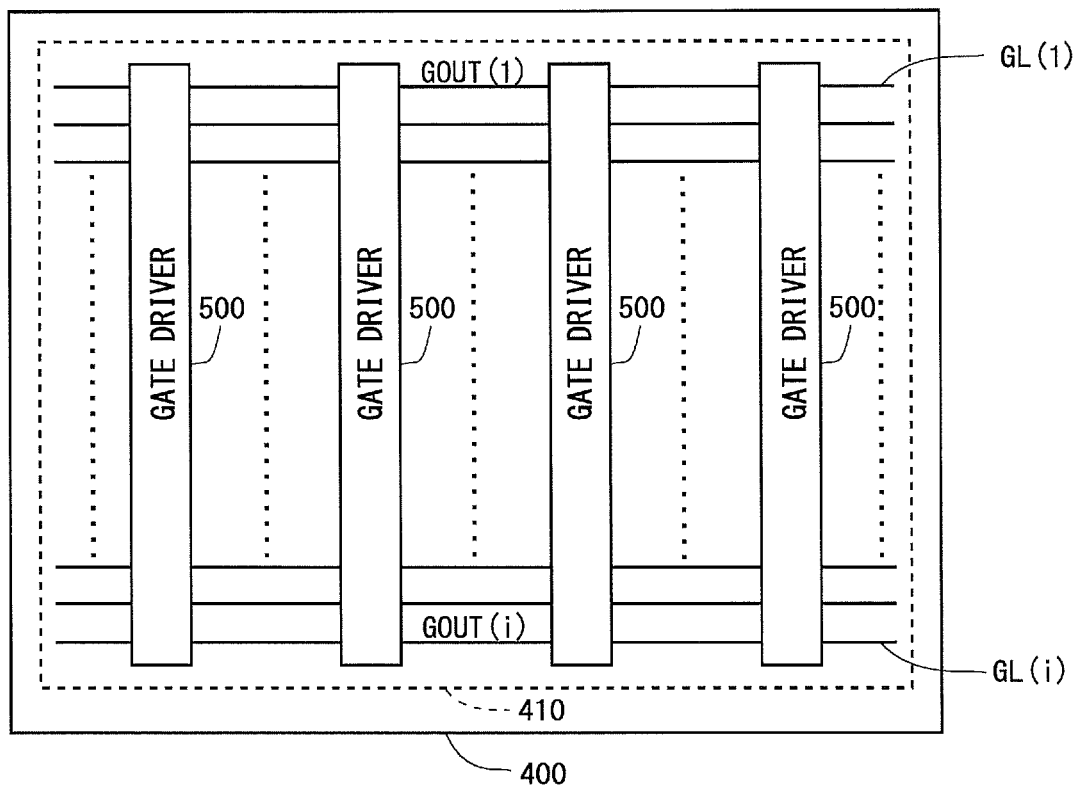
FIG. 5 is a diagram for describing gate drivers of the first embodiment.
Figure 6:
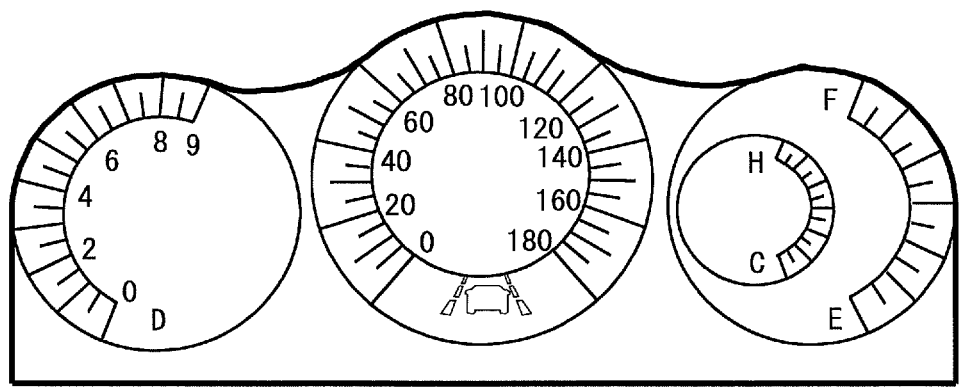
FIG. 6 is a diagram showing an example of the shape of a display unit of the first embodiment.

In addition, in the present embodiment, gate drivers (scanning signal line drive circuits) 500 that drive the gate bus lines GL are, as shown in FIG. 5, formed in the display unit 410. Conventionally, a gate driver is provided in a picture-frame region (outside the display unit), and thus, scanning signals are provided from the picture-frame region into the display unit. On the other hand, in the present embodiment, scanning signals are outputted from the gate drivers 500 provided in the display unit 410. Since such a configuration is adopted, circuits and wiring lines for driving the gate bus lines GL do not need to be formed in the picture-frame region, enabling to implement a so-called oddly shaped display (a display device whose screen shape is not rectangular). Hence, it is assumed that the liquid crystal display device according to the present embodiment is a liquid crystal display device for in-vehicle application that has a shape such as that shown in FIG. 6, for example. Therefore, although FIG. 3, etc., show the display unit 410 in rectangular shape, in practice, the display unit 410 has a shape such as that shown in FIG. 6, for example.

Note that, when the configuration in which the gate drivers 500 are formed in the display unit 410 as shown in FIG. 5 is adopted, the screen shape can be designed freely. Therefore, a display device having such a configuration has been called "FFD" in recent years. FFD is an abbreviation of "Free Form Display". In addition, a technology for forming the gate drivers 500 in the display unit 410 (i.e., in the pixel region) has been called "IPGDM technology" in recent years. IPGDM is an abbreviation of "In-Pixel Gate Driver Monolithic".

An operation overview of the components shown in FIGS. 2 and 5 will be described below. The power supply 100 supplies a predetermined power supply voltage to the display control circuit 200, the source driver 300, and the liquid crystal panel 400 (more specifically, the gate drivers 500 in the liquid crystal panel 400). The display control circuit 200 receives an image signal DAT and a timing signal group TG such as a horizontal synchronizing signal and a vertical synchronizing signal, which are transmitted from an external source, and outputs a digital video signal DV, and a source start pulse signal SSP, a source clock signal SCK, a latch strobe signal LS, a gate start pulse signal GSP, and gate clock signals GCK which are for controlling image display on the display unit 410. Note that, in the present embodiment, the gate clock signals GCK include 8-phase clock signals.

The source driver 300 receives the digital video signal DV, the source start pulse signal SSP, the source clock signal SCK, and the latch strobe signal LS which are outputted from the display control circuit 200, and applies driving video signals V(1) to V(j) to the source bus lines SL(1) to SL(j), respectively. The gate drivers 500 repeat the application of active scanning signals GOUT(1) to GOUT(i) to the respective gate bus lines GL(1) to GL(i), based on the gate start pulse signal GSP and the gate clock signals GCK which are outputted from the display control circuit 200, with one vertical scanning period being a cycle. Note that a detailed description of the gate drivers 500 will be made later.

In the above-described manner, the driving video signals V(1) to V(j) are applied to the source bus lines SL(1) to SL(j), respectively, and the scanning signals GOUT(1) to GOUT(i) are applied to the gate bus lines GL(1) to GL(i), respectively, by which an image based on the image signal DAT transmitted from the external source is displayed on the display unit 410.

<1.2 Thin Film Transistor>

In the present embodiment, the thin film transistors 41 in the respective pixel formation portions 4 are all of an n-channel type. In addition, in the present embodiment, for the thin film transistors 41, an oxide semiconductor TFT (a thin film transistor having an oxide semiconductor layer) is adopted. Furthermore, in the present embodiment, for the structure of the thin film transistors 41, a channel-etched type is adopted. Note, however, that an etch-stop type can also be adopted. Regarding these matters, the same also applies to thin film transistors included in each unit circuit 5 of a shift register 510 (described later) that forms each gate driver 500. By using an oxide semiconductor TFT, while excellent display quality is maintained, the number of times the liquid crystal panel 400 is driven is significantly reduced, enabling to significantly reduce the power consumption of the liquid crystal display device. Note that a thin film transistor having amorphous silicon and an etch-stop oxide semiconductor TFT are likely to cause a threshold shift. Therefore, in terms of effectiveness, more effect can be obtained with the case of adopting a thin film transistor having amorphous silicon or an etch-stop oxide semiconductor TFT.

Figure 7:
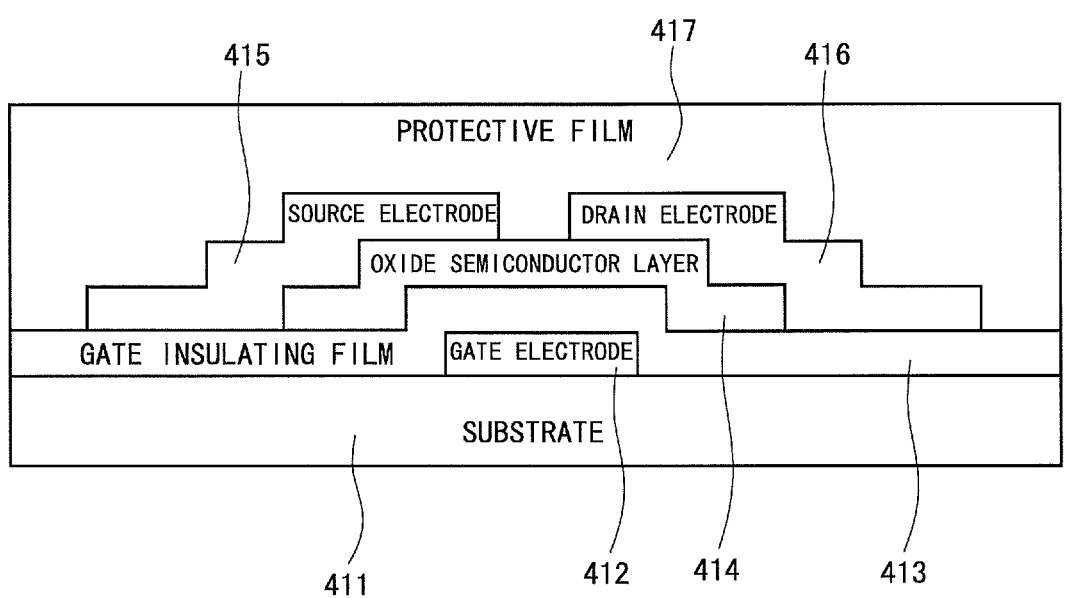
FIG. 7 is a diagram showing a configuration of a channel-etched TFT in the first embodiment.

FIG. 7 is a diagram, showing a configuration of a channel-etched TFT. As shown in FIG. 7, the channel-etched TFT has a structure in which a gate electrode 412, a gate insulating film 413, an oxide semiconductor layer 414, a source electrode 415, and a drain electrode 416 are stacked on top of each other on a substrate 411 and a protective film 417 is formed thereon. A portion of the oxide semiconductor layer 414 above the gate electrode 412 functions as a channel region. In the channel-etched TFT, am etch-stop layer is not formed in the channel region, and the bottom surfaces of edge portions on the channel side of the source electrode 415 and the drain electrode 416 are placed, in contact with the top surface of the oxide semiconductor layer 414. The channel-etched TFT is formed by, for example, forming a conductive film for source and drain electrodes on the oxide semiconductor layer 414 and separating a source and a drain.

On the other hand, in an etch-stop TFT, an etch-stop layer is formed in a channel region. The bottom surfaces of edge portions on the channel side of a source electrode and a drain electrode are located, for example, on the etch-stop layer. The etch-stop TFT is formed by, for example, forming an etch-stop layer that covers a portion, of an oxide semiconductor layer that serves as a channel region, and then forming a conductive film for source and drain electrodes on the oxide semiconductor layer and the etch-stop layer and separating a source and a drain.

Next, an oxide semiconductor will be described. An oxide semiconductor included in an oxide semiconductor layer may be an amorphous oxide semiconductor or may be a crystalline oxide semiconductor having a crystalline portion. Crystalline oxide semiconductors include a polycrystalline oxide semiconductor, a microcrystalline oxide semiconductor, a crystalline oxide semiconductor with a c-axis aligned roughly perpendicularly to a layer surface, etc.

The oxide semiconductor layer may have a stacked layer structure of two or more layers. When the oxide semiconductor layer has a stacked layer structure, the oxide semiconductor layer may include an amorphous oxide semiconductor layer and a crystalline oxide semiconductor layer. Alternatively, the oxide semiconductor layer may include a plurality of crystalline oxide semiconductor layers of different crystal structures. Alternatively, the oxide semiconductor layer may include a plurality of amorphous oxide semiconductor layers. When the oxide semiconductor layer has a two-layer structure including an upper layer and a lower layer, it is preferred that the energy gap of an oxide semiconductor included in the upper layer be larger than that of an oxide semiconductor included in the lower layer. Note, however, that when the difference in energy gap between the layers is relatively small, the energy gap of the oxide semiconductor in the lower layer may be larger than that of the oxide semiconductor in the upper layer.

The materials, structures, deposition methods for the amorphous oxide semiconductor and the above-described crystalline oxide semiconductors, the configuration of an oxide semiconductor layer having a stacked layer structure, etc., are described in, for example, Japanese Laid-Open Patent Publication No. 2014-7399. For reference, the entire disclosure content of Japanese Laid-Open Patent Publication No. 2014-7399 is incorporated in this specification.

The oxide semiconductor layer may contain, at least one kind of metal element selected from indium (In), gallium (Ga), and zinc (Zn), for example. In the present embodiment, the oxide semiconductor layer includes, for example, an In—Ga—Zn—O-based semiconductor (e.g., indium gallium zinc oxide). The In—Ga—Zn—O-based semiconductor is a ternary oxide of In, Ga, and Zn. The proportions (composition ratio) of In, Ga, and Zn are not particularly limited. For example, proportions such as In:Ga:Zn=2:2:1, In:Ga:Zn=1:1:1, or In:Ga:Zn=1:1:2 can be adopted. Such an oxide semiconductor layer can be formed from am oxide semiconductor film including an In—Ga—Zn—O-based semiconductor.

The In—Ga—Zn—O-based semiconductor may be amorphous or may be crystalline. For a crystalline In—Ga—Zn—O-based semiconductor, it is preferred to adopt a crystalline In—Ga—Zn—O-based semiconductor with a c-axis aligned roughly perpendicularly to a layer surface.

Note that the crystal structure of the crystalline In—Ga—Zn—O-based semiconductor is disclosed in, for example, Japanese Laid-open Patent Publication No. 2014-7399, Japanese Laid-Open Patent Publication No. 2012-134475, Japanese Laid-Open Patent Publication No. 2014-209727, etc. For reference, the entire disclosure contents of Japanese Laid-Open Patent Publication No. 2012-134475 and Japanese Laid-Open Patent Publication No. 2014-209727 are incorporated in this specification. A TFT having an In—Ga—Zn—O-based semiconductor layer has high mobility (mobility over 20 times compared to an a-SiTFT) and a low leakage current (a leakage current less than $\frac{1}{100}$ compared to an a-SiTFT).

The oxide semiconductor layer may include other oxide semiconductors instead of an In—Ga—Zn—O-based semiconductor. The oxide semiconductor layer may include, for example, an In—Sn—Zn—O-based semiconcluctor (e.g., $In_2O_3$—$SnO_2$—ZnO; InSnZnO). The In—Sn—Zn—O-based semiconductor is a ternary oxide of indium (In), tin (Sn), and zinc (Zn). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, etc. Here, Al represents aluminum, Ti represents titanium, Cd represents cadmium, Ge represents germanium, Pb represents lead, Mg represents magnesium, Zr represents zirconium, and Hf represents hafnium.

<1.3 Configuration, and Operation of the Gate Driver>

Figure 8:
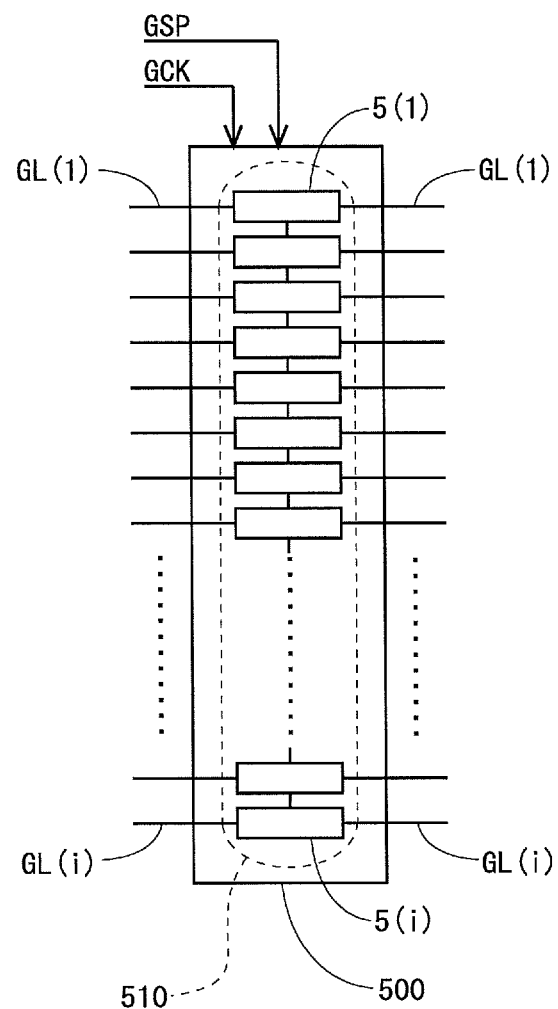
FIG. 8 is a block diagram for describing a configuration of a gate driver of the first embodiment.

Next, with reference to FIGS. 8 to 12, an overview of the configuration and operation of the gate driver 500 of the present embodiment will be described. As shown in FIG. 8, the gate driver 500 is composed of a shift register 510 including a plurality of stages. The stages of the shift register 510 are provided so as to have a one-to-one correspondence with the i gate bus lines GL(1) to GL(i) formed in the display unit 410. That is, the shift register 510 includes i unit circuits 5(1) to 5(i).

Figure 9:
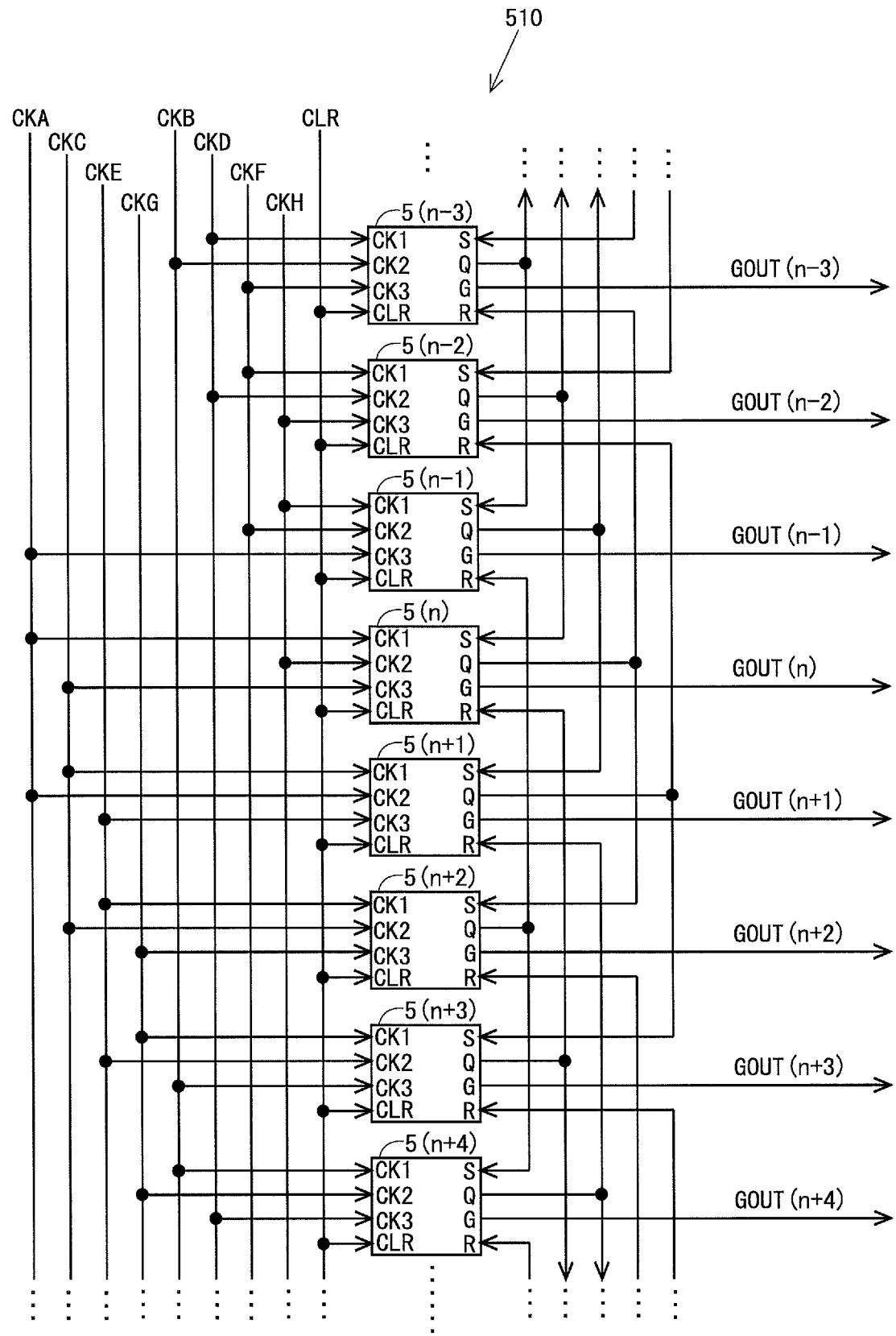
FIG. 9 is a block diagram showing a configuration of a shift register in the gate driver in the first embodiment.

FIG. 9 is a block diagram showing a configuration of the shift register 510 in the gate driver 500. As described above, the shift register 510 is composed of the i unit circuits 5(1) to 5(i). Note that FIG. 9 shows unit circuits 5(n−3) to 5(n+4) of an (n−3)th stage to an (n+4)th stage. In the following, when the i unit circuits 5(1) to 5(i) do not need to be distinguished from, each other, the unit circuits are denoted by reference character 5.

Each unit circuit 5 is provided with an input terminal for receiving a clock signal CK1; an input terminal for receiving a clock signal CK2; an input terminal for receiving a clock, signal CK3; an input terminal for receiving a clear signal CLR; an input terminal for receiving a set signal S; an input terminal for receiving a reset signal R; an output terminal for output ting an output signal Q; and an output terminal for outputting an output signal G. Note that the unit circuit 5 is also provided with an input terminal for a low-level direct-current power supply potential VSS (not shown in FIG. 9).

Figure 10:
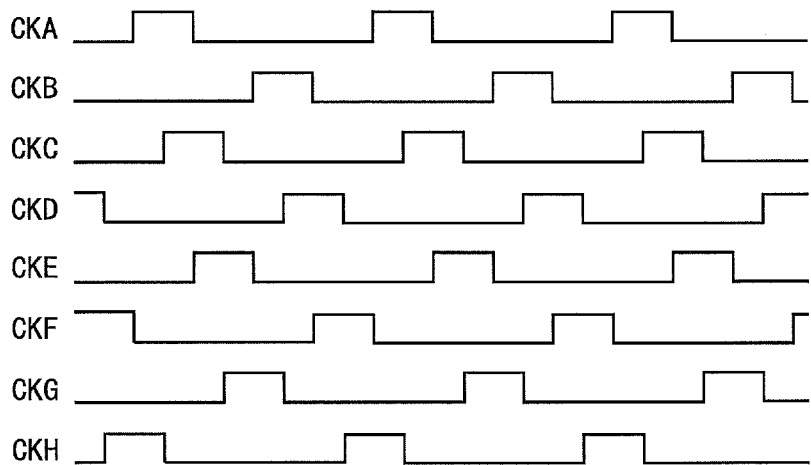
FIG. 10 is a signal waveform diagram showing the waveforms of gate clock signals (8-phase clock signals) which are provided to the shift register in the first embodiment.

As gate clock signals GCK, 8-phase clock signals (a clock signal CKA, a clock signal CKB, a clock signal CKC, a clock signal CKD, a clock signal CKE, a clock signal CKF, a clock signal CKG, and a clock signal CKH) having waveforms such as those shown in FIG. 10 are provided to the shift register 510. For example, for the unit circuit 5(n) of the nth stage, the clock signal CKA is provided, as a clock signal CK1, the clock, signal CKH is provided as a clock signal CK2, and the clock signal CKC is provided as a clock signal CK3. In addition, for example, for the unit circuit 5(n+1) of the (n+1)th stage, the clock signal CKC is provided as a clock signal CK1, the clock signal CKA is provided as a clock signal CK2, and the clock signal CKE is provided as a clock signal CK3. As described above, when attention is focused on two consecutive unit circuits, to the subsequent unit circuit are provided three clock signals whose phases are delayed by 45 degrees relative to those of three clock signals that are provided to the preceding unit circuit. In addition, regarding three clock signals provided to each unit circuit 5, the phase of the clock signal CK2 is advanced by 45 degrees relative to the phase of the clock signal CK1, and the phase of the clock signal CK3 is delayed by 45 degrees relative to the phase of the clock signal CK1. Note that, in the present embodiment, the on-duty (duty cycle) of the 8-phase clock signals is ⅜. In addition, the clear signal CLR is provided to all unit circuits 5(1) to 5(i) in a shared manner.

Figure 11:
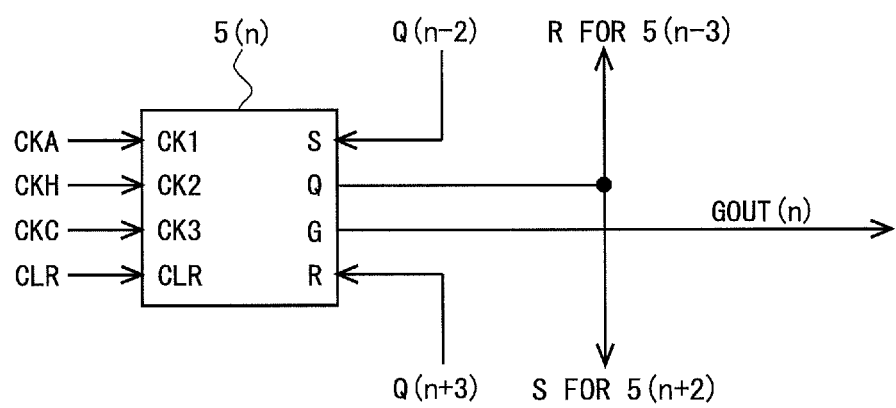
FIG. 11 is a diagram for describing input and output signals to/from a unit circuit of an nth stage of the shift register in the first embodiment.

In addition, as shown in FIG. 11, for a unit circuit 5(n) of any stage (here, the nth stage), an output signal Q(n−2) outputted from the unit circuit 5(n−2) of a stage two stages before the nth stage is provided as a set signal S, and an output signal Q(n+3) outputted from the unit circuit 5(n+3) of a stage three stages after the nth stage is provided as a reset signal R. Note, however, that for the unit circuit 5(1) of the first stage and the unit circuit 5(2) of the second stage, a gate start pulse signal GSP is provided as a set signal S. In addition, as shown in FIG. 11, an output signal Q outputted from the unit circuit 5(n) of any stage is provided as a reset signal R to the unit circuit 5(n−3) of a stage three stages before the nth stage and provided as a set signal S to the unit circuit 5(n+2) of a stage two stages after the nth stage, and an output signal G outputted from the unit circuit 5(n) of any stage is provided as a scanning signal GOUT(n) to a gate bus line GL(n).

Figure 12:
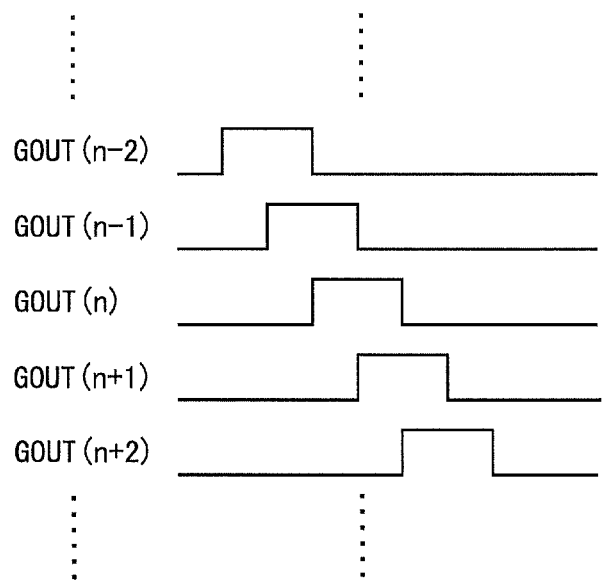
FIG. 12 is a signal waveform diagram showing the waveforms of scanning signals which are provided to gate bus lines in the first embodiment.

In a configuration such as that described above, when a pulse of the gate start pulse signal GSP serving as a set signal S is provided to the unit circuit 5(1) of the first stage and the unit circuit 5(2) of the second stage of the shift register 510, a shift pulse included in an output signal Q which is outputted from each unit circuit 5 is sequentially transferred from the unit circuit 5(1) of the first stage to the unit circuit 5(i) of the ith stage, based on the clock operation of the 8-phase clock signals. Then, according to the shift pulse transfer, an output signal G outputted from each unit circuit 5 sequentially goes to a high level. By this, scanning signals GOUT having waveforms such as those shown in FIG. 12 are provided to the gate bus lines GL in the display unit 410.

<1.4 Configuration of the Unit Circuit>

Figure 13:
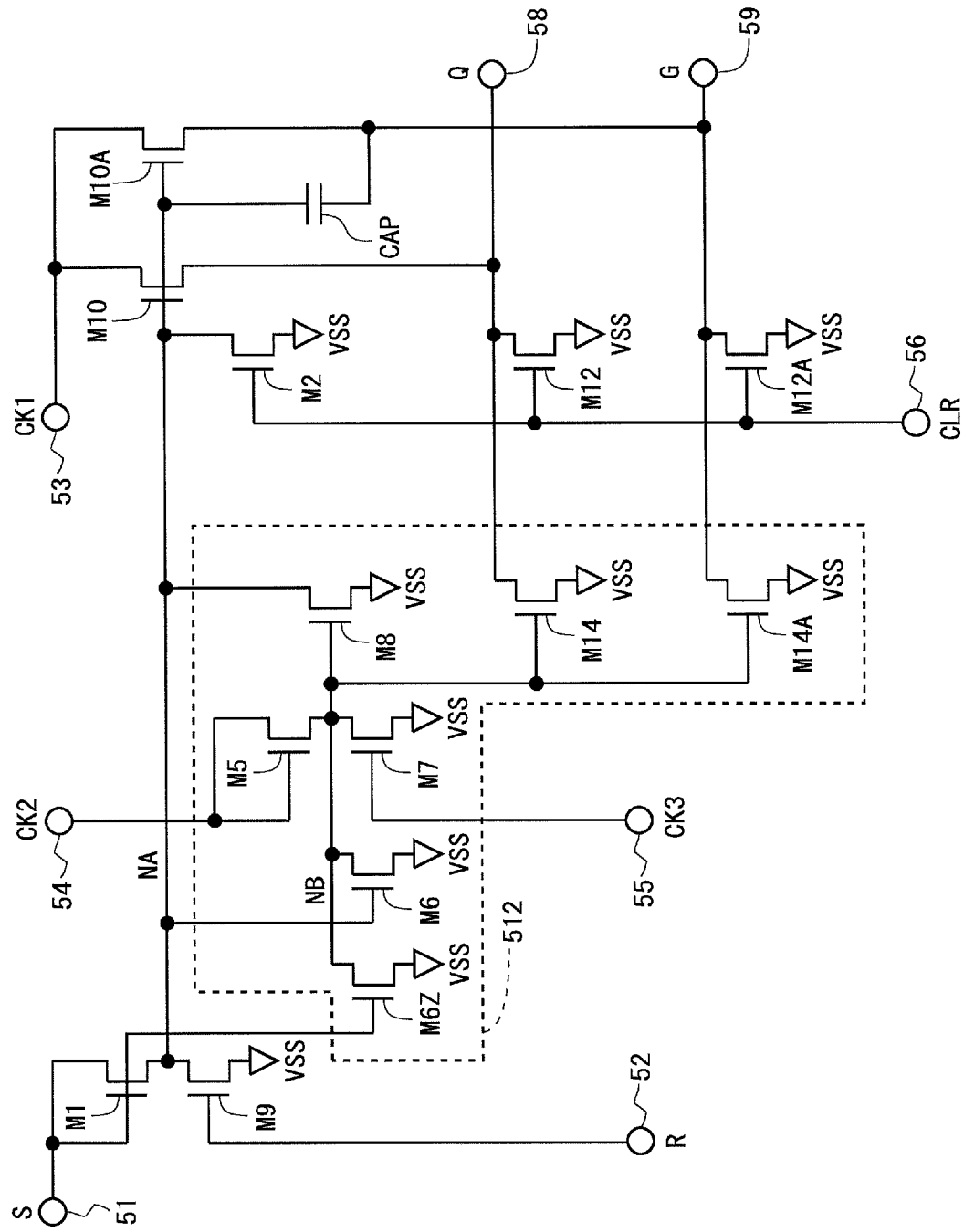
FIG. 13 is a circuit diagram showing a configuration of a unit circuit (a configuration of a portion of the shift register for one stage) of the first embodiment.

FIG. 13 is a circuit diagram, showing a configuration of a unit circuit 5 (a configuration of a portion of the shift register 510 for one stage) of the present embodiment. As shown in FIG. 13, the unit circuit 5 includes 14 thin film transistors M1, M2, M5, M6, M6Z, M7, M8, M9, M10, M10A, M12, M12A, M14, and M14A and one capacitor CAP. In addition, the unit circuit 5 has six input terminals 51 to 56 and two output terminals (output nodes) 58 and 59, in addition to input terminals for a low-level direct-current power supply potential VSS. Here, an input terminal that receives a set signal S is denoted by reference character 51, an input terminal that receives a reset signal R is denoted by reference character 52, an input terminal that receives a clock signal CK1 is denoted by reference character 53, an input terminal that receives a clock signal CK2 is denoted by reference character 54, an input terminal that receives a clock signal CK3 is denoted by reference character 55, and an input terminal that receives a clear signal CLR is denoted by reference character 56. In addition, an output terminal for outputting an output signal Q is denoted by reference character 58, and an output terminal for outputting an output signal G is denoted by reference character 59. Mote that the thin film transistors M1, M2, M5, M6, M6Z, M7, M8, M9, M10, M10A, M12, M12A, M14, and M14A in the unit circuit 5 are implemented by thin film transistors of the same type as the thin film transistor 41 in the above-described pixel formation portion 4 (see FIG. 4) (e.g., a thin film transistor containing indium gallium zinc oxide).

Next, a connection relationship between the components in the unit circuit 5 will be described. A source terminal of the thin film transistor M1, a drain terminal of the thin film transistor M2, a gate terminal of the thin film transistor M6, a drain terminal of the thin film, transistor M8, a drain, terminal of the thin film transistor M9, a gate terminal of the thin film transistor M10, a gate terminal of the thin film transistor M10A, and one end of the capacitor CAP are connected to each other through, an output control node NA. A source terminal, of the thin film transistor M5, a drain terminal, of the thin film transistor M6, a drain terminal of the thin film transistor M6Z, a drain terminal of the thin film transistor M7, a gate terminal of the thin film transistor M8, a gate terminal of the thin film transistor M14, and a gate terminal of the thin film transistor M14A are connected to each other through a stabilization node NB.

The thin film transistor M1 is connected at its gate and drain terminals to the input terminal 51 (i.e., diode-connected) and connected at its source terminal to the output control node NA. The thin film transistor M2 is connected at its gate terminal to the input terminal 56, connected at its drain terminal to the output control node NA, and connected at its source terminal to an input terminal for a direct-current power supply potential VSS. The thin film transistor M5 is connected at its gate and drain terminals to the input terminal 54 (i.e., diode-connected) and connected at its source terminal to the stabilization node NB. The thin film transistor M6 is connected at its gate terminal to the output control node NA, connected at its drain terminal to the stabilization node NB, and connected at its source terminal to an input terminal for a direct-current power supply potential VSS. The thin film transistor M6Z is connected at its gate terminal to the input terminal 51, connected at its drain terminal to the stabilization node NB, and connected at its source terminal to an input terminal for a direct-current power supply potential VSS.

The thin film transistor M7 is connected at its gate terminal to the input terminal 55, connected at its drain terminal to the stabilization node NB, and connected at its source terminal to an input terminal for a direct-current power supply potential VSS. The thin film transistor M8 is connected at its gate terminal to the stabilization node NB, connected at its drain terminal to the output control node NA, and connected at its source terminal to an input terminal for a direct-current power supply potential VSS. The thin film transistor M9 is connected at its gate terminal to the input terminal 52, connected at its drain terminal to the output control node NA, and connected at its source terminal to an input terminal for a direct-current power supply potential VSS. The thin film transistor M10 is connected at its gate terminal to the output control node NA, connected at its drain terminal to the input terminal 53, and connected at its source terminal to the output terminal 58. The thin film transistor M10A is connected at its gate terminal to the output control node NA, connected at its drain terminal to the input terminal 53, and connected at its source terminal to the output terminal 59.

The thin film transistor M12 is connected at its gate terminal to the input terminal 56, connected at its drain terminal to the output terminal 58, and connected at its source terminal to an input terminal for a direct-current power supply potential VSS. The thin film transistor M12A is connected at its gate terminal to the input terminal 56, connected at its drain terminal to the output terminal 59, and connected at its source terminal to an input terminal for a direct-current power supply potential VSS. The thin film transistor M14 is connected at its gate terminal to the stabilization node NB, connected at its drain terminal to the output terminal 58, and connected at its source terminal to an input terminal for a direct-current power supply potential VSS. The thin film transistor M14A is connected at its gate terminal to the stabilization node NB, connected at its drain terminal to the output terminal 59, and connected at its source terminal to am input terminal for a direct-current power supply potential VSS. The capacitor CAP is connected at its one end to the output control node NA and connected at its other end to the output terminal 59.

Note that the other end of the capacitor CAP may be connected to the output terminal 58, but it is preferred that the other end of the capacitor CAP be connected to the output terminal 59. The reasons therefor are as follows. During a normal operation period, the potential of the output control node NA can fluctuate due to the clock operation of the clock signal CK1 which is provided to the input terminal 53. When the other end of the capacitor CAP is connected to a wiring line having a larger capacitance, the fluctuations of the potential of the output control node NA can be suppressed. In addition, when the other end of the capacitor CAP is connected to a wiring line having a larger capacitance, the bootstrap effect of the output control node NA can be more stably obtained upon a change in the clock signal CK1 from a low level to a high level during a write operation period.

Next, the function of each component in the unit circuit 5 will be described. The thin film transistor M1 changes the potential of the output control node NA toward a high level when the set signal S is at a high level. The thin film transistor M2 changes the potential of the output control node NA toward the VSS potential when the clear signal CLR is at a high level. The thin film transistor M5 changes the potential of the stabilization node NB toward a high level when the clock signal CK2 is at a high level. The thin film transistor M6 changes the potential of the stabilization node NB toward the VSS potential when the potential of the output control node NA is at a high level. The thin film transistor M6Z changes the potential of the stabilization node NB toward the VSS potential when the set signal S is at a high level.

The thin film transistor M7 changes the potential of the stabilization node NB toward the VSS potential when the clock signal CK3 is at a high level. The thin film transistor M8 changes the potential of the output control node NA toward the VSS potential when the potential of the stabilization node NB is at a high level. The thin film transistor M9 changes the potential of the output control node NA toward the VSS potential when the reset signal R is at a high level. The thin film transistor M10 provides the potential of the clock signal CK1 to the output terminal 58 when the potential of the output control node NA is at a high level. The thin film transistor M10A provides the potential of the clock signal CK1 to the output terminal 59 when the potential of the output control node NA is at a high level.

The thin film transistor M12 changes the potential of the output terminal 58 toward the VSS potential when the clear signal CLR is at a high level. The thin film transistor M12A, changes the potential of the output terminal 59 toward the VSS potential when the clear signal CLR is at a high level. The thin film transistor M14 changes the potential of the output terminal 58 toward the VSS potential when the potential of the stabilization node NB is at a high level. The thin film transistor M14A changes the potential of the output terminal 59 toward the VSS potential when the potential of the stabilization node NB is at a high level. The capacitor CAP functions as a compensation capacitance for maintaining the potential of the output control node NA at a high level during the write operation period.

Note that, in the present embodiment, an output control transistor is implemented by the thin film transistors M10 and M10A, and a stabilization transistor is implemented by the thin film transistors M8, M14, and M14A. In addition, an output control node stabilization transistor is implemented by the thin film transistor M8, and an output node stabilization transistor is implemented by the thin film transistors M14 and M14A. Furthermore, an output control node setting portion is implemented by the thin film transistor M1, a target node control portion 512 is implemented by the thin film transistors M5, M6, M6Z, M7, M8, M14, and M14A, and a stabilization node control portion is implemented by the thin film transistors M5, M6, M6Z, and M7.

Figure 14:
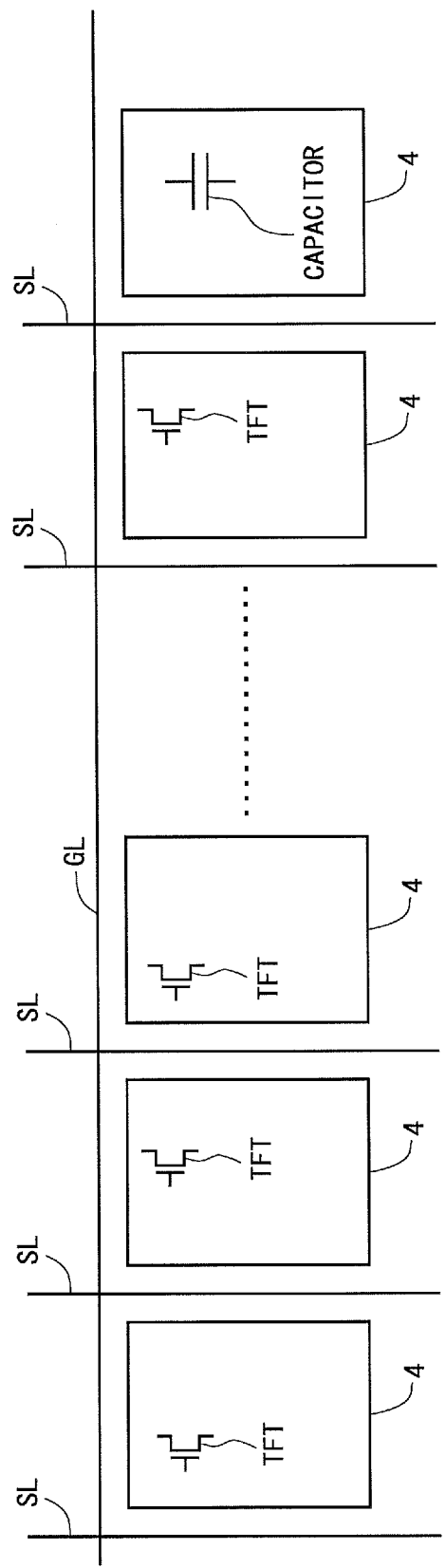
FIG. 14 is a diagram for describing the placement of thin film transistors (TFTs) and a capacitor that are included in a unit circuit in the first embodiment.

Meanwhile, in the present embodiment, the unit circuits 5 are formed in the display unit 410 (i.e., in the pixel region). Regarding this, in order to reduce the difference in aperture ratio between the pixels, thin film transistors (TFTs) and a capacitor that are included in each unit circuit 5 are, as schematically shown in FIG. 14, placed in a plurality of pixel formation portions 4 in a distributed manner. In addition, in order to reduce the difference in aperture ratio between the pixels, the pixel formation portions 4 are provided with a dummy wiring line, as necessary. These matters are disclosed in WO 2010/067641 A.

<1.5 Operation of the Unit Circuit>

Figure 1:
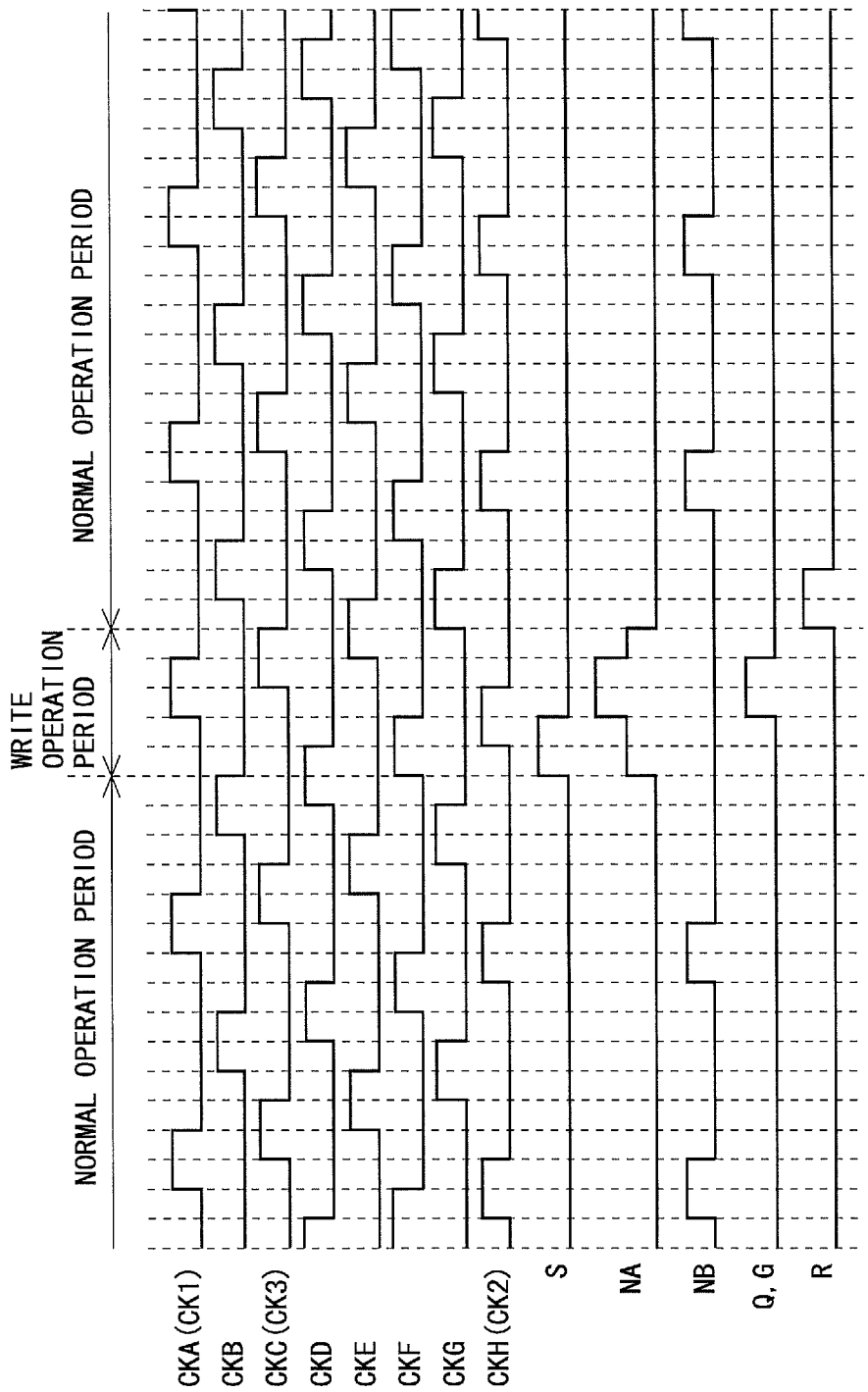
FIG. 1 is an overall signal waveform diagram for an operation period of a liquid crystal display device according to a first embodiment of the present invention.
Figure 15:
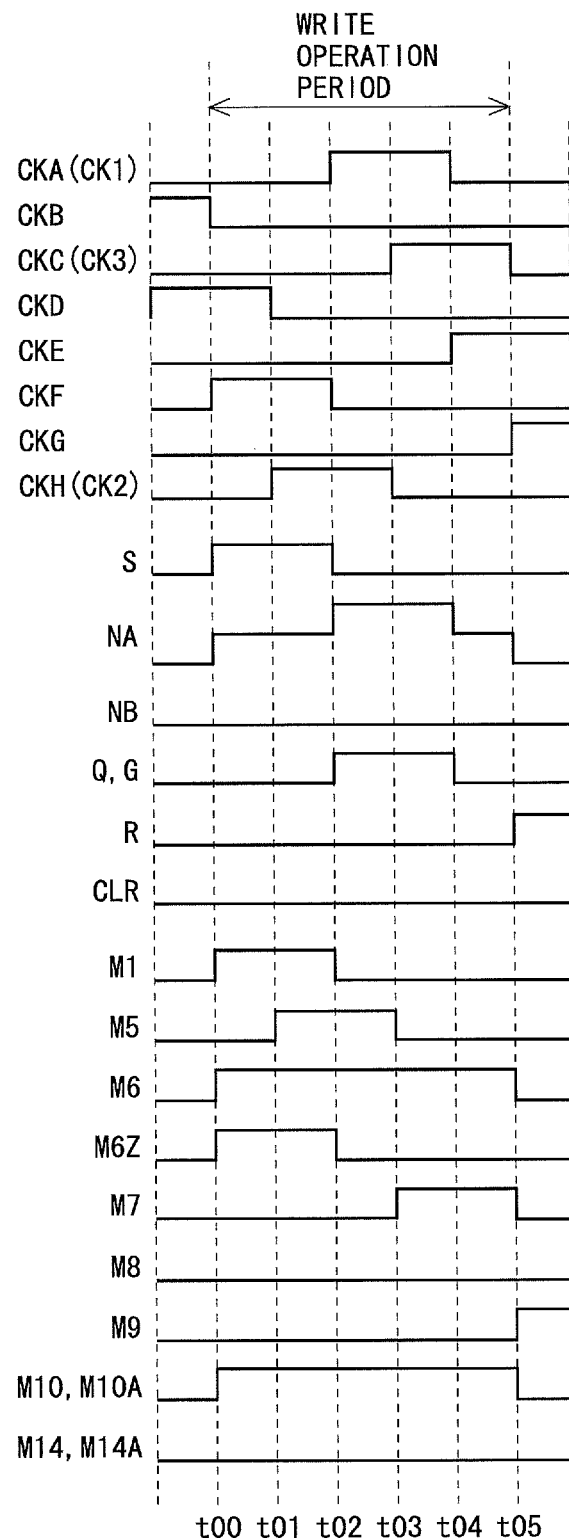
FIG. 15 is a signal waveform diagram for describing operation performed during a write operation period in the first embodiment.

Next, the operation of the unit circuit 5 of the present embodiment will be described. Here, attention is focused on the unit circuit 5(n) of the nth stage. First, with reference to FIGS. 1, 9, 13, and 15, operation performed during a write operation period will be described. FIG. 1 is an overall signal waveform diagram for an operation period of the liquid crystal display device. FIG. 15 is a signal waveform diagram for describing operation performed during a write operation period. Note that, regarding FIG. 15, the waveforms of M1, M5, M6, M6Z, M7, M8, M9, M10, M10A, M14, and M14A show whether the thin film transistors are in an on state or an off state.

At time point t00, the set signal S (output signal Q(n−2)) changes from a low level to a high level. Since the thin film transistor M1 is diode-connected as shown in FIG. 13, the thin film transistor M1 goes into an on state by a pulse of the set signal S, and the capacitor CAP is charged. By this, the potential of the output control node NA increases and the thin film transistors M6, M10, and M10A go into an on state. In addition, by the pulse of the set signal S, the thin film transistor M6Z goes into an on state. By the thin film transistors M6 and M6Z going into an on state, the potential of the stabilization node NB is drawn to the VSS potential. Here, during a period from time point t00 to time point t02, the clock signal CKA (CK1) is at a low level. Hence, during this period, the output signals Q and G are maintained sit a low level. In addition, during the period from time point t00 to time point t02, the reset signal P, (output signal Q(n+3)), the clear signal CLR, and the potential of the stabilization node NB are at a low level, and thus, the thin film transistors M9, M2, and M8 are maintained in an off state. Hence, the potential of the output control node NA does not decrease during this period.

At time point t01, the clock signal CKH (CK2) changes from a low level to a high level. Hence, the thin film transistor M5 goes into an on state. At this time, since the thin film transistors M6 and M6Z are in the on state as described above, even when the thin film transistor M5 changes from an off state to an on state, the potential of the stabilization node NB is maintained at the low level.

At time point t02, the clock signal CKA (CK1) changes from the low level to a high level. At this time, since the thin film transistors M10 and M10A are in the on state, the potentials of the output terminals 58 and 59 also increase with an increase in the potential of the input terminal 53. Here, since the capacitor CAP is provided between the output control node NA and the output terminal 59 as shown in FIG. 13, the potential of the output control node NA also increases with the increase in the potential of the output terminal 59 (the output control node NA is bootstrapped). As a result, a large voltage is applied to the gate terminals of the thin film transistors M10 and M10A, and the potentials of the output signals Q and G (the potentials of the output terminals 58 and 59) increase to a high-level potential of the clock signal CKA (CK1). Here, during a period from time point t02 to time point t04, since the reset signal R is at the low level, the thin film transistor M9 is maintained in the off state. In addition, during this period, since the clear signal CLR is at the low level, the thin film transistors M2, M12, and M12A are maintained in an off state. Furthermore, during this period, since the potential of the stabilization node NB is at the low level, the thin film transistors M8, M14, and M14A are maintained in an off state. By the above, the potential of the output control node NA, the potential of the output signal Q, and the potential of the output signal G do not decrease during the period from time point t02 to time point t04.

At time point t03, the clock signal CKC (CK3) changes from a low level to a high level. Hence, the thin film transistor M7 goes into an on state. By this, the potential of the stabilization node NB is drawn to the VSS potential.

At time point t04, the clock signal CKA (CK1) changes from the high level to a low level. By this, with a decrease in the potential of the input terminal 53, the potentials of the output terminals 58 and 59 (the potentials of the output signals Q and G) decrease. When the potential of the output terminal 59 decreases, the potential of the output control node NA also decreases through the capacitor CAP.

At time point t05, the reset signal R changes from the low level to a high level. By this, the potential of the output control node NA goes to a low level.

By each unit circuit 5 performing operation such as that described above, the plurality of gate bus lines GL(1) to GL(i) provided to the liquid crystal display device sequentially go into a selected state, and writing to the pixel capacitances is performed row by row.

Figure 16:
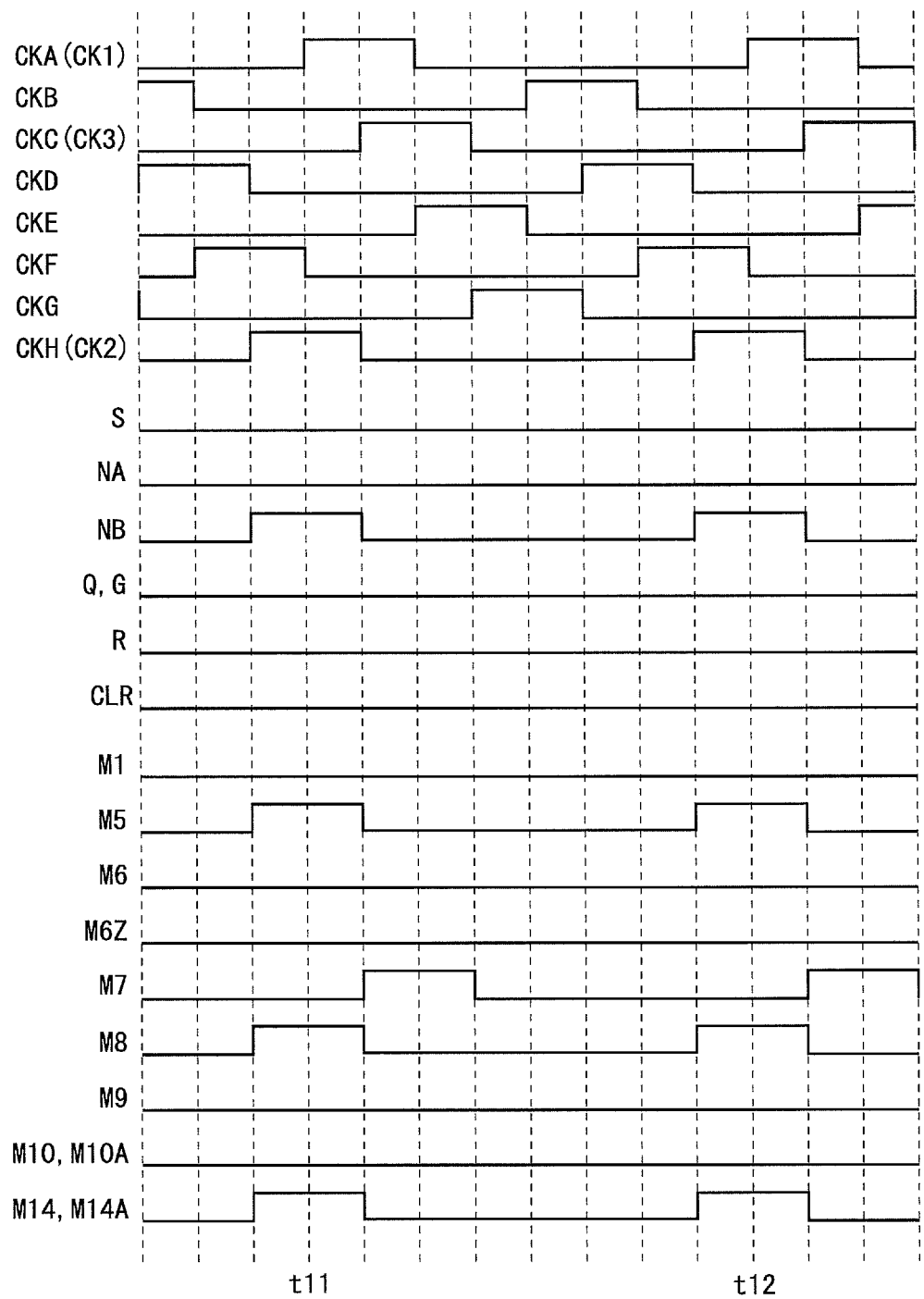
FIG. 16 is a signal waveform diagram for describing operation performed during a normal operation period in the first embodiment.

Next, with reference to FIGS. 1, 9, 13, and 16, operation performed during a normal operation period will be described. FIG. 16 is a signal waveform diagram for describing operation performed during a normal operation period. During the normal operation period, by the clock signal CKH (CK2) changing from a low level to a high level, the thin film transistor M5 goes into an on state and the potential of the stabilization node NB changes from a low level to a high level. In addition, during the normal operation period, by the clock signal CKC (CK3) changing from a low level to a high level, the thin film transistor M7 goes into an on state and the potential of the stabilization node NB changes from the nigh level to a low level. As such, during the normal operation period, the potential of the stabilization node NB goes to a high level every predetermined period. Meanwhile, during the normal operation period, the clock signal CKA (CK1) changes from a low level to a high level every predetermined period. Therefore, for example, at time point t11 and time point t12 of FIG. 16, fluctuations can occur in the potential of the output control node NA due to the parasitic capacitances of the thin film transistors M10 and M10A. That is, during the normal operation period, the potential of the output control node NA can go into a floating state every predetermined period. In addition, due to this, a leakage current flows through the thin film transistors M10 and M10A and thus fluctuations can occur in the potentials of the output signals Q and G. However, during a period during which the potential of the stabilization node NB is at a high level, the thin film transistors M8, M14, and M14A are in an on state. By this, the potential of the output control node NA, the potential of the output signal Q, and the potential of the output signal G are drawn to the VSS potential. By the above, during the normal operation period, even when noise caused by the clock operation of the clock signal CKA (CK1) occurs, the potential of the output control node NA, the potential of the output signal Q, and the potential of the output signal G are maintained at the VSS potential.

Note that the clear signal CLR is brought to a high level, for example, during a vertical flyback period and immediately after the start-up of the device. When the clear signal CLR goes to a high level, in all unit circuits 5 the thin film transistors M2, M12, and M12A go into an on state. By this, in all unit circuits 5, the potential of the output control node NA, the potential of the output signal Q, and the potential of the output signal G are drawn to the VSS potential. By thus using the clear signal, the stability of circuit operation can be increased.

<1.6 Effects>

Figure 46:
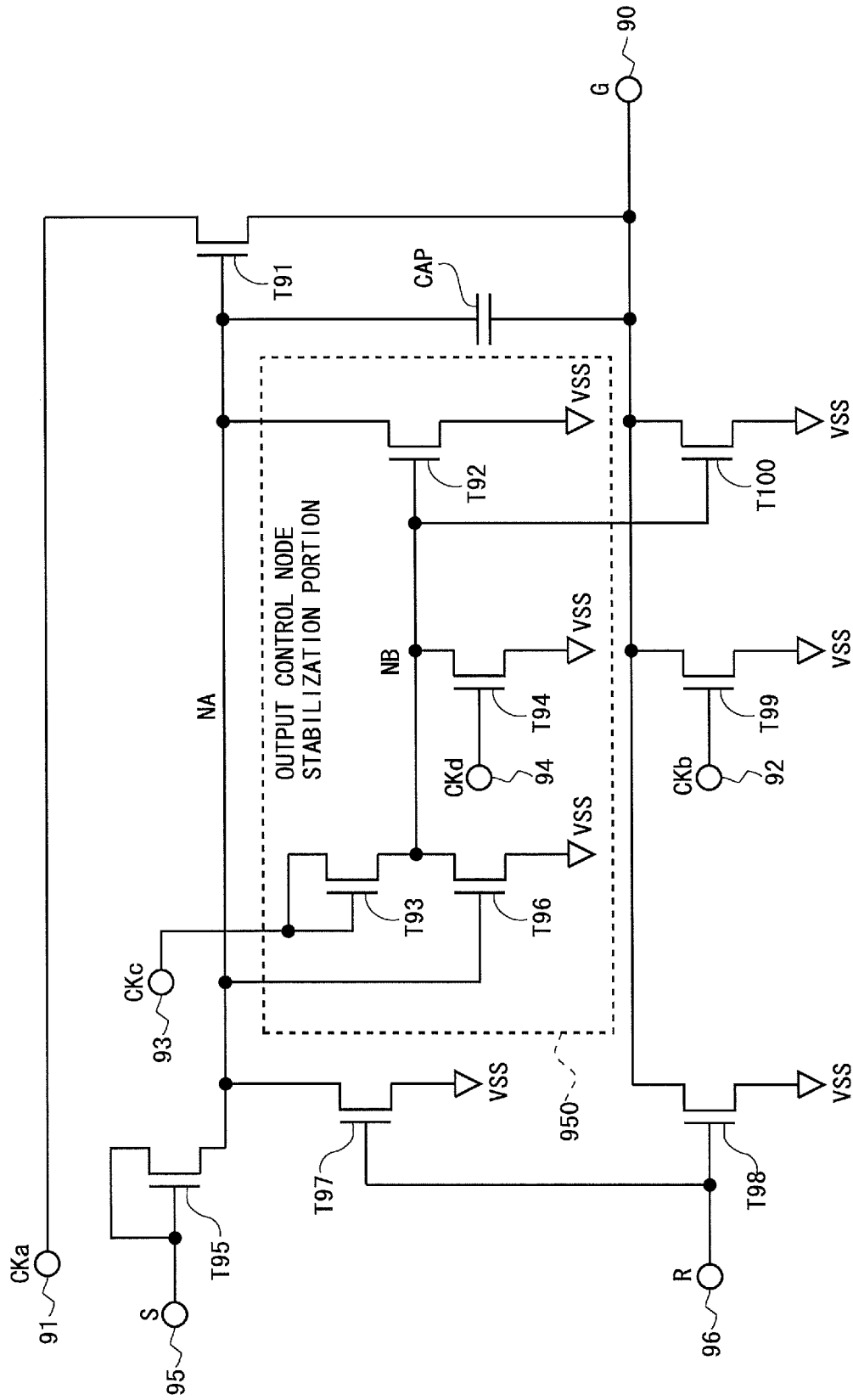
FIG. 46 is a circuit diagram showing a configuration of a unit circuit disclosed in WO 2010/067641 A.
Figure 47:
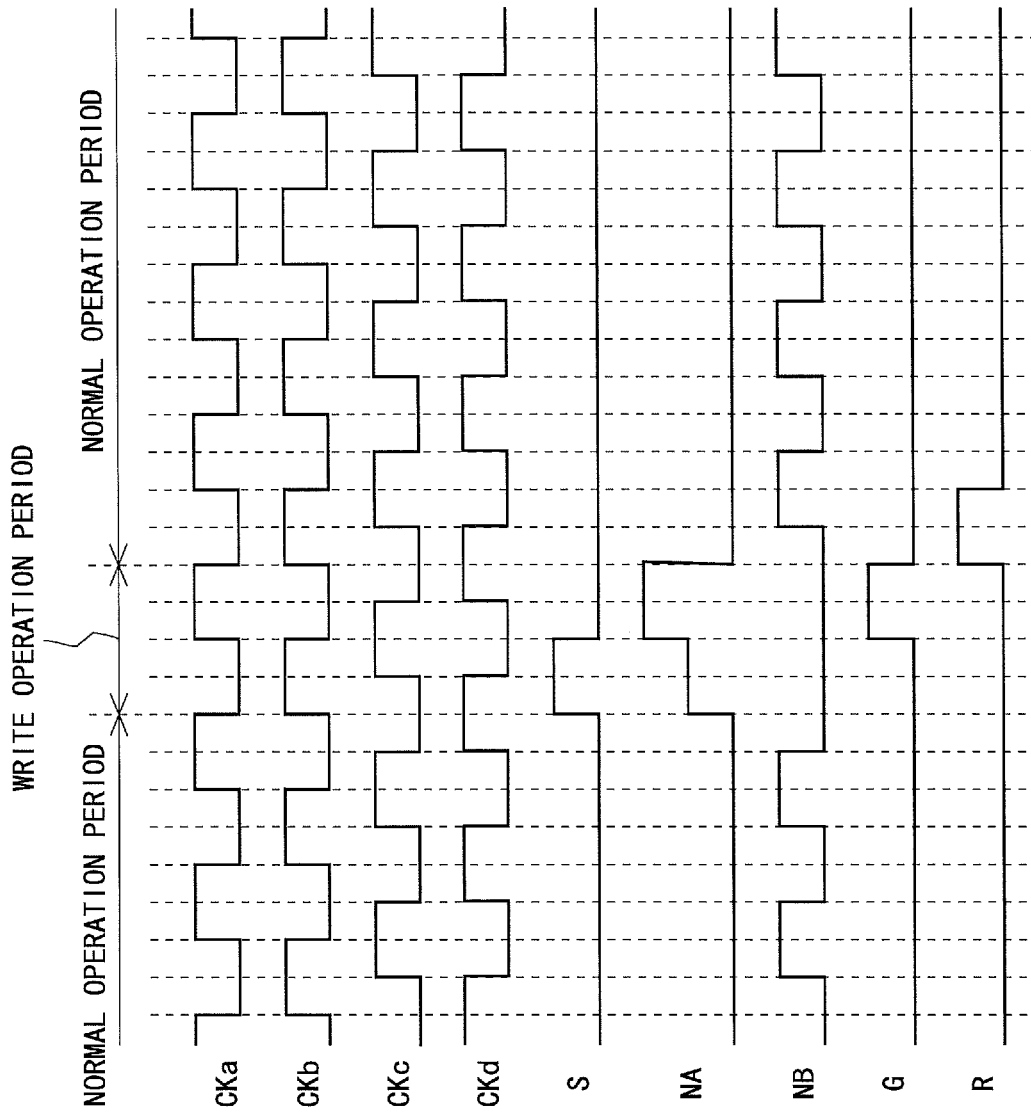
FIG. 47 is a signal waveform diagram for describing the operation of the unit circuit of the configuration shown in FIG. 46.

According to the present embodiment, during the normal operation period, in every predetermined period, the potential of the stabilization node NB goes to a high level and the thin film transistors M8, M14, and M14A go into an on state. By this, during the normal operation period, the potential of the output control node NA, the potential of the output signal Q, and the potential of the output signal G are drawn to the VSS potential every predetermined period. As a result, the occurrence of abnormal operation caused by the clock operation of a clock signal is prevented. Here, in the present embodiment, 8-phase clock signals are adopted as clock signals for allowing the shift register 510 that forms the gate driver 500 to operate, and the on-duty (duty cycle) of the 8-phase clock signals is ⅖. In addition, the phase of the clock signal CKC (CK3) that changes the potential of the stabilization node NB from a high level to a low level is delayed by 90 degrees relative to the phase of the clock signal CKH (CK2) that changes the potential of the stabilization node NB from a low level to a high level. By the above, a period during which the potential of the stabilization node NB is at a high level is substantially a ¼ period of the operation period of the device. On the other hand, in the conventional configuration (the configuration shown in FIG. 46), the potential of the stabilization node NB is at a high level for substantially a half-period of the operation period of the device. As such, according to the present embodiment, the length of the period during which the potential of the stabilization node NB is at a high level is shorter than that of the conventional configuration. Therefore, the occurrence of a threshold shift of the thin film transistor M8 that contributes to the drawing of the potential of the output control node NA to the VSS potential is suppressed. By the above, according to the present embodiment, the reliability of long-term operation regarding the driving of the gate bus lines GL can be increased over the conventional configuration.

<1.7 Variants>

In the above-described first embodiment, for the configuration of the unit circuits 5 in the shift register 510, the configuration shown in FIG. 13 is adopted. However, the present invention is not limited thereto and, for example, configurations of the following first to third variants can also be adopted. Note that the same configurations as those of the first to third variants can also be applied to second to fifth embodiments which will be described later.

<1.7.1 First Variant>

Figure 17:
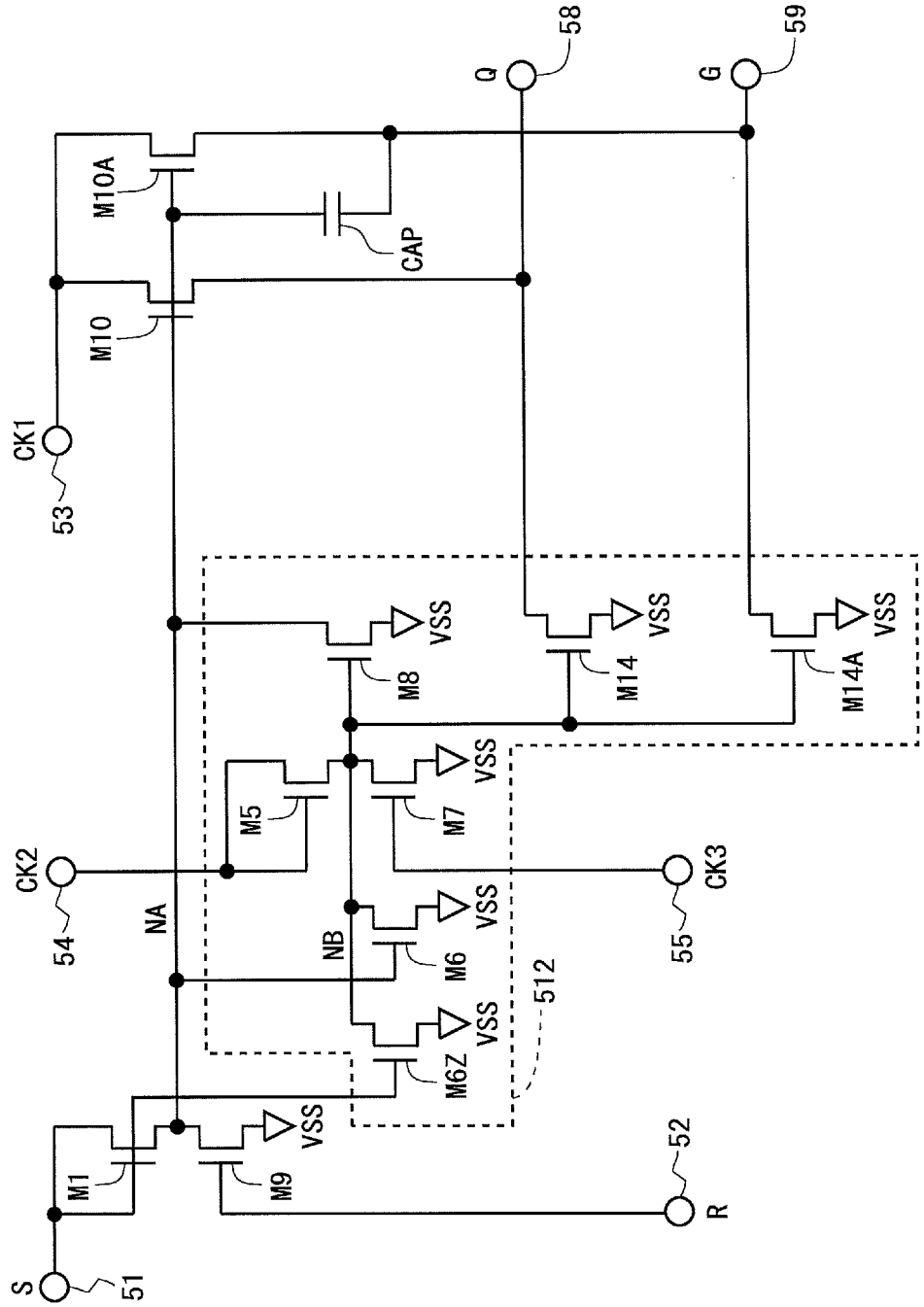
FIG. 17 is a circuit diagram showing a configuration of a unit circuit (a configuration of a portion of the shift register for one stage) of a first variant of the first embodiment.

FIG. 17 is a circuit diagram showing a configuration of a unit circuit 5 (a configuration of a portion of the shift register 510 for one stage) of the first variant of the first embodiment. In the present variant, unlike the first embodiment, the unit circuit 5 is not provided with thin film transistors (the thin film transistor M2, the thin film transistor M12, and the thin film transistor M12A) that are controlled by a clear signal CLR. Hence, although the stability of circuit operation is poorer than that of the first embodiment, since the number of circuit elements can be reduced, cost reduction and miniaturization of the device can be achieved.

<1.7.2 Second Variant>

Figure 18:
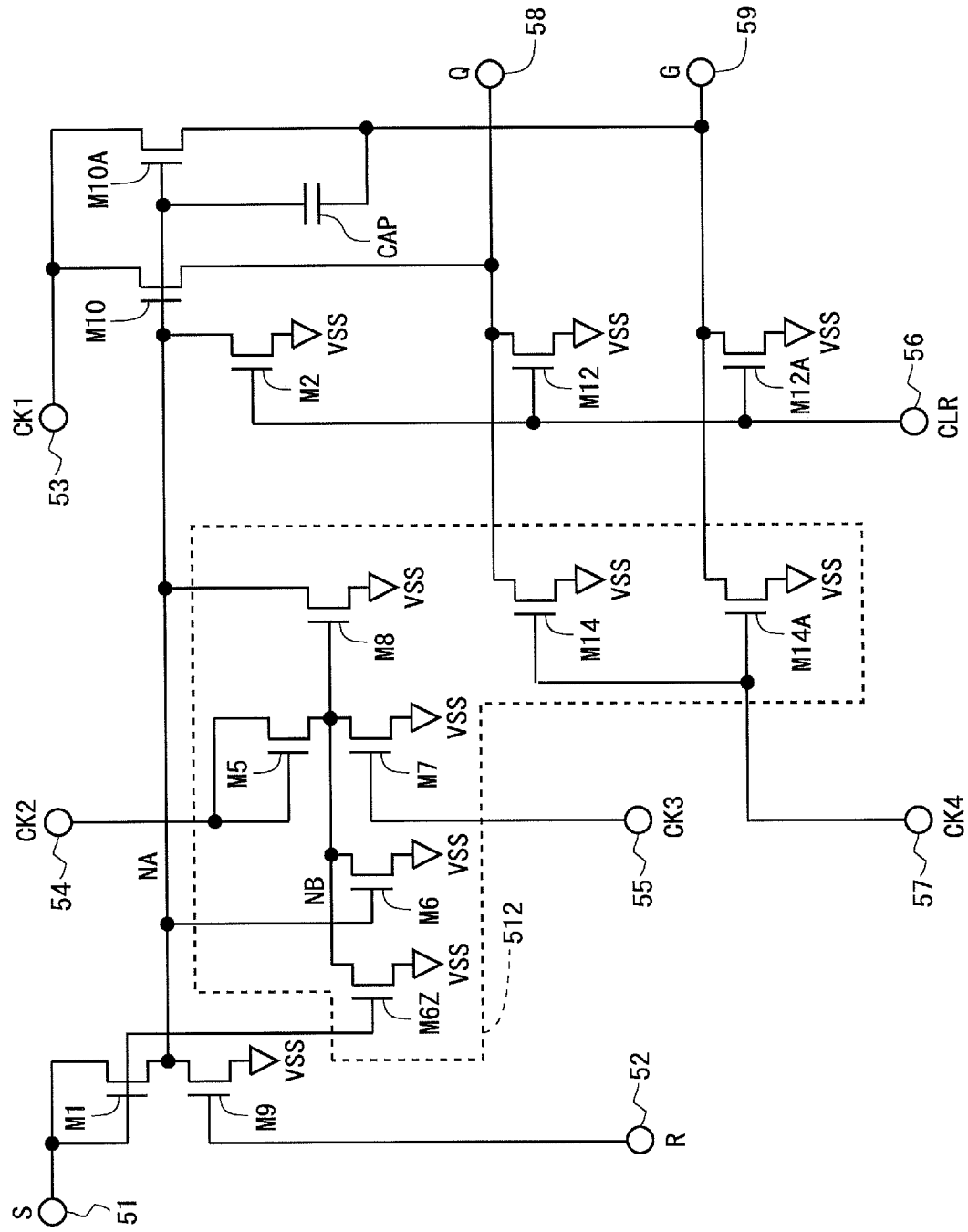
FIG. 18 is a circuit diagram showing a configuration of a unit circuit (a configuration of a portion of the shift register for one stage) of a second variant of the first embodiment.

FIG. 18 is a circuit diagram showing a configuration of a unit circuit 5 (a configuration of a portion of the shift register 510 for one stage) of the second variant of the first embodiment. In the first embodiment, the gate terminals of the thin film transistors M14 and M14A are connected to the stabilization node NB. On the other hand, in the present variant, the gate terminals of the thin film transistors M14 and M14A are connected to an input terminal 57 for a clock signal CK4. Then, in a unit circuit 5(n) of an nth stage, for example, a clock signal CKE is provided as a clock signal CK4. As such, the states of the thin film transistors M14 and M14A may be directly controlled by a clock signal.

<1.7.3 Third Variant>

Figure 19:
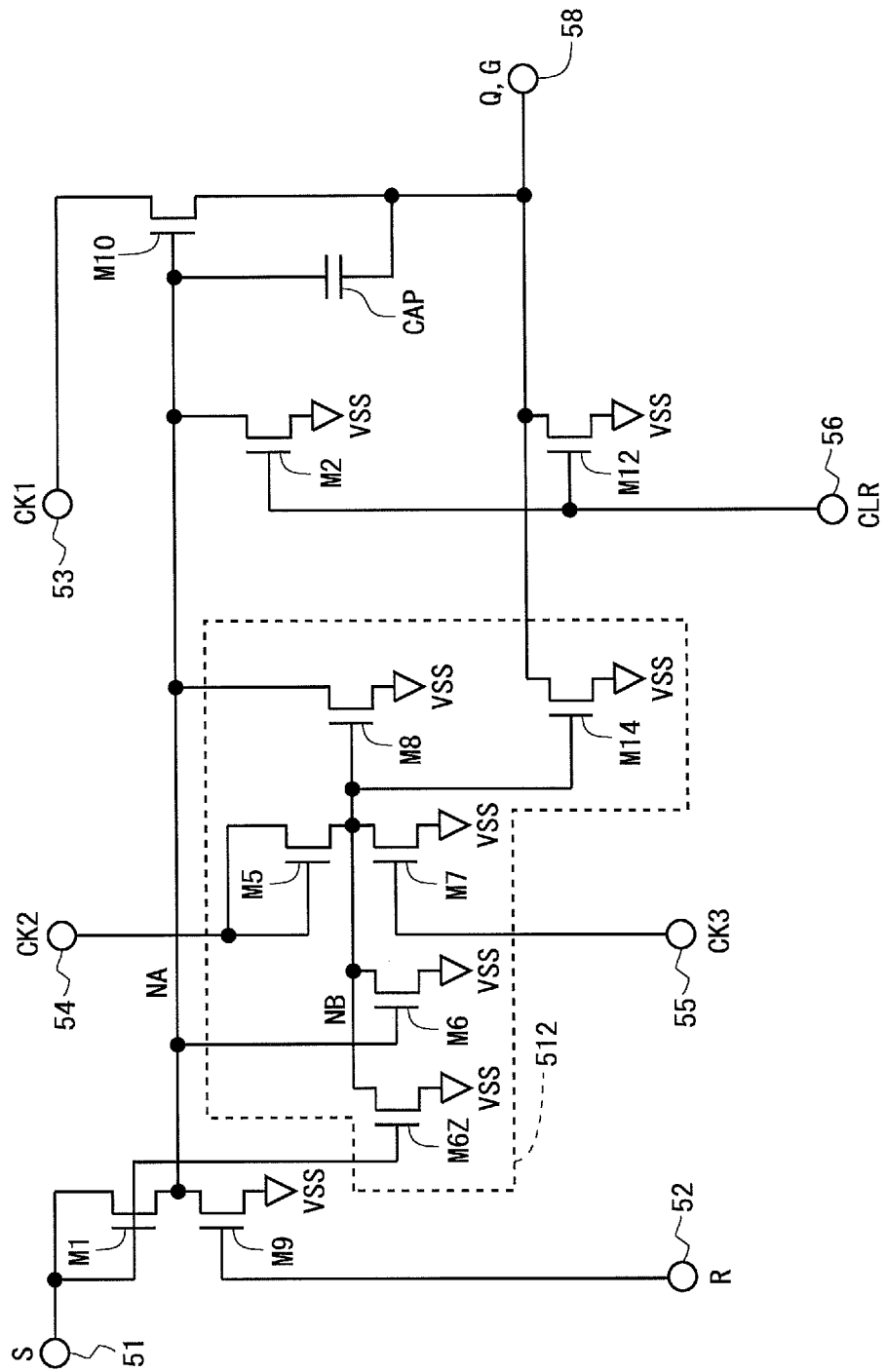
FIG. 19 is a circuit diagram showing a configuration of a unit circuit (a configuration of a portion of the shift register for one stage) of a third variant of the first embodiment.

FIG. 19 is a circuit diagram showing a configuration of a unit circuit 5 (a configuration of a portion of the shift register 510 for one stage) of the third variant of the first embodiment. In the first embodiment, an output signal Q and an output signal G are outputted from different output terminals. On the other hand, in the present variant, the output signal Q and the output signal G are outputted from the same output terminal. In other words, a signal for controlling the operation of other stages and a scanning signal provided to a gate bus line are outputted as one signal from one output terminal 58. When such a configuration is adopted, too, the present invention can be applied.

2. Second Embodiment

A second embodiment of the present invention will be described. An overall configuration and thin film transistors to be used are the same as those of the above-described first embodiment and thus description thereof is omitted (see FIGS. 2 to 7). Note that, in the present embodiment, too, 8-phase clock signals are provided to the shift register 510. Differences from the first embodiment will be mainly described below.

<2.1 Configuration of the Gate Driver>

Figure 20:
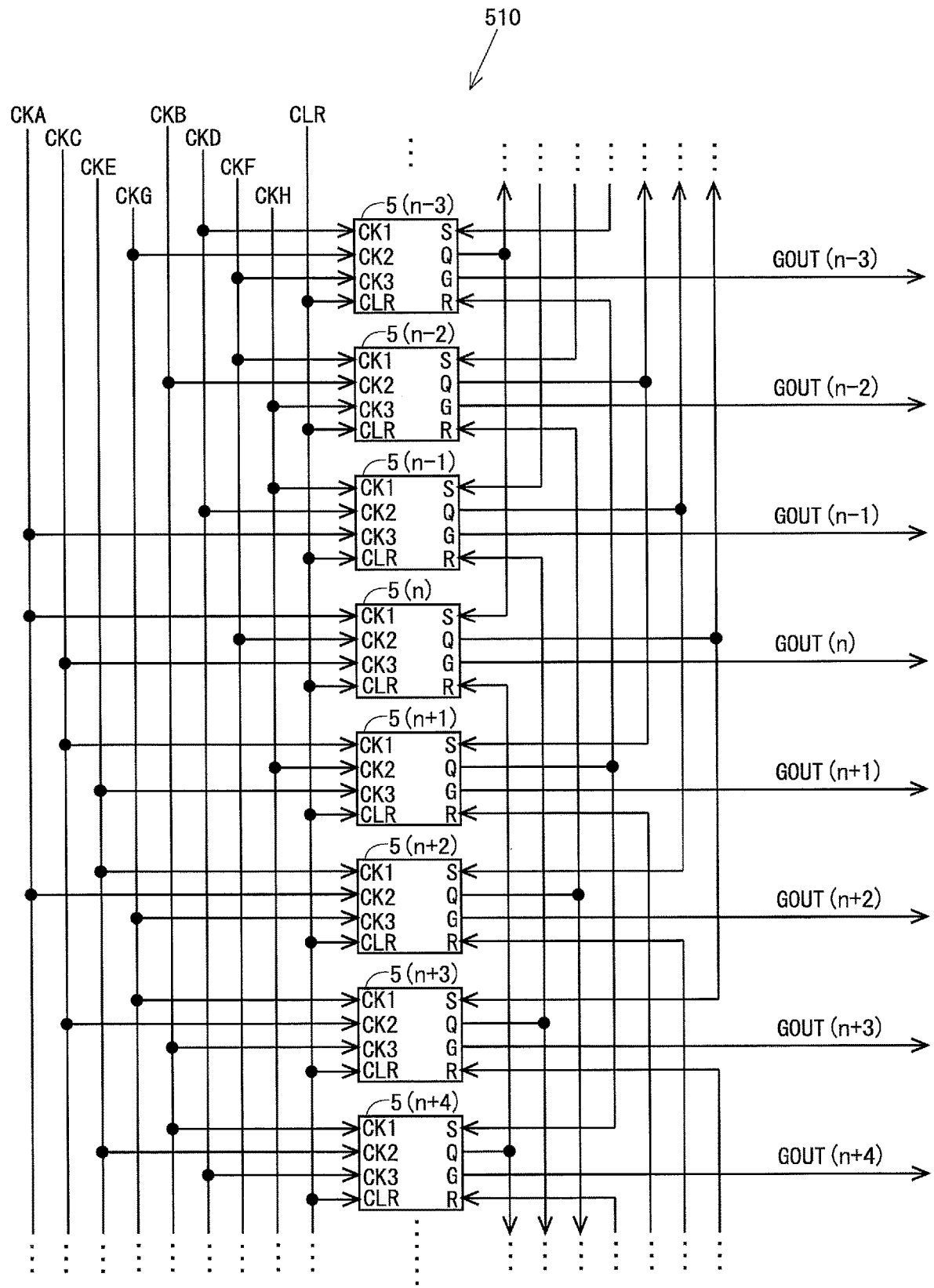
FIG. 20 is a block diagram showing a configuration of a shift register in a gate driver of a second embodiment of the present invention.
Figure 21:
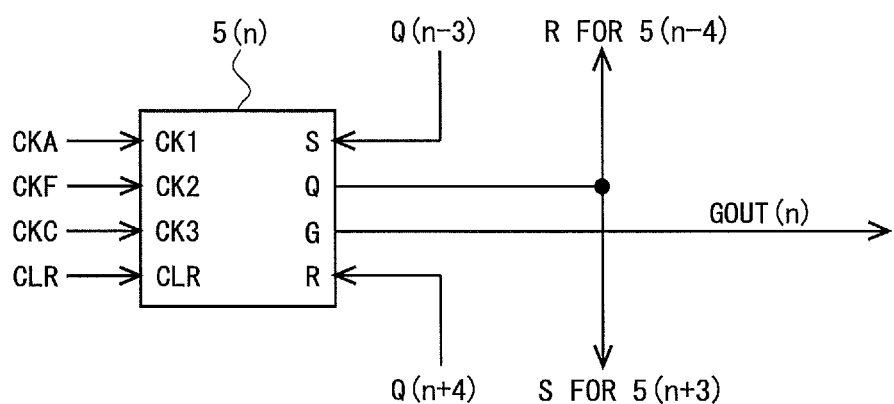
FIG. 21 is a diagram for describing input and output signals to/from a unit circuit of an nth stage of the shift register in the second embodiment.

FIG. 20 is a block diagram, showing a configuration of a shift register 510 in a gate driver 500 of the present embodiment. For clock signals to be provided to each unit circuit 5, in the first embodiment, the phase of the clock signal CK2 is advanced by 45 degrees relative to the phase of the clock signal CK1. On the other hand, in the present embodiment, the phase of the clock signal CK2 is advanced by 90 degrees relative to the phase of the clock signal CK1. Therefore, for example, for a unit circuit 5(n) of an nth stage, as shown in FIG. 21, the clock signal CKA is provided as a clock signal CK1, the clock signal CKF is provided as a clock signal CK2, and the clock signal CKC is provided, as a clock signal CK3. In addition, in the first embodiment, to each stage (each unit circuit 5) is provided, as a set signal S, an output signal Q outputted from a stage two stages before the target stage, and is provided, as a reset signal R, an output signal Q outputted from a stage three stages after the target stage. On the other hand, in the present embodiment, to each stage (each unit circuit 5) is provided, as a set signal S, an output signal Q outputted from a stage three stages before the target stage, and is provided, as a reset signal R, an output signal Q outputted from a stage four stages after the target stage. That is, as shown in FIG. 21, for a unit circuit 5(n) of any stage (here, the nth stage), an output signal Q(n−3) outputted from a unit circuit 5(n−3) of a stage three stages before the nth stage is provided as a set signal S, and an output signal Q(n+4) outputted from a unit circuit 5(n+4) of a stage four stages after the nth stage is provided, as a reset signal R. In addition, as shown in FIG. 21, an output signal Q outputted from the unit circuit 5(n) of any stage is provided as a reset signal R to a unit circuit 5(n−4) of a stage four stages before the nth stage and provided as a set signal S to a unit circuit 5(n+3) of a stage three stages after the nth stage, and an output signal G outputted from the unit circuit 5(n) of any stage is provided as a scanning signal GOUT(n) to a gate bus line GL(n). Note that for the internal configuration of the unit circuit 5, as in the first embodiment, the configuration shown in FIG. 13 is adopted.

<2.2 Operation of the Unit Circuit>

Figure 22:
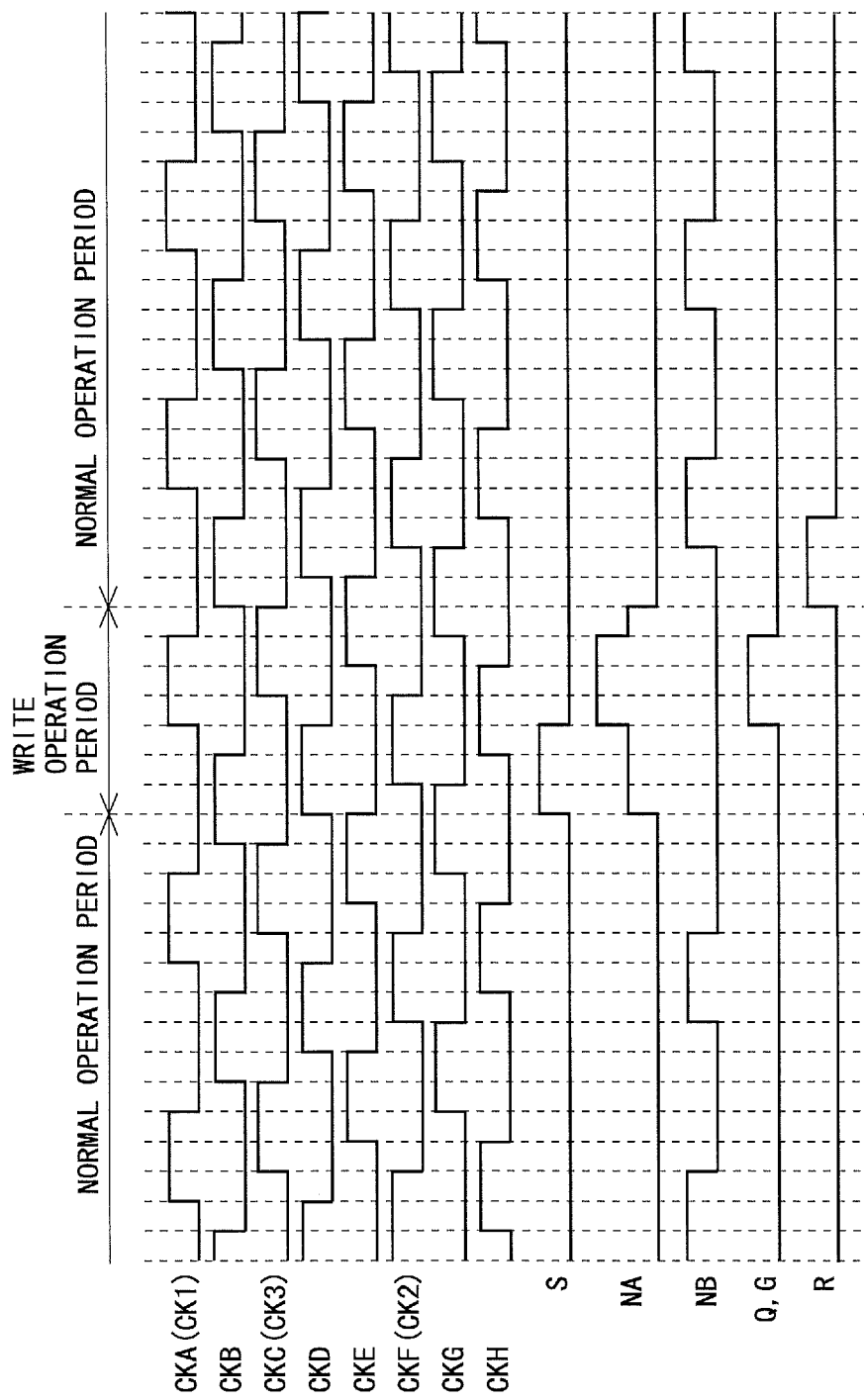
FIG. 22 is an overall signal waveform diagram for an operation period of a liquid crystal display device of the second embodiment.
Figure 23:
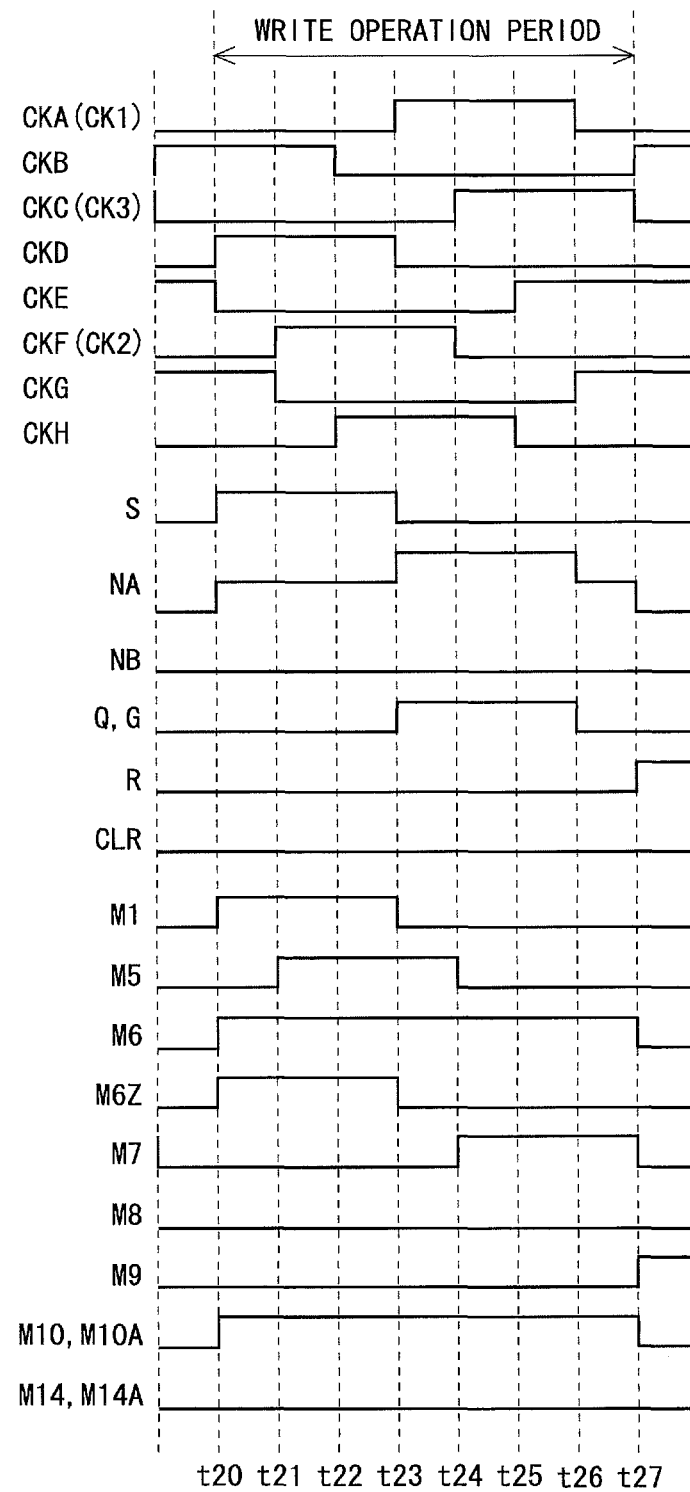
FIG. 23 is a signal waveform, diagram, for describing operation performed during a write operation period in the second embodiment.

Next, the operation of the unit circuit 5 of the present embodiment will be described. Here, too, attention is focused on the unit circuit 5(n) of the nth stage. First, with reference to FIGS. 13, 20, 22, and 23, operation performed during a write operation period will be described. FIG. 22 is an overall signal waveform diagram for an operation period of the liquid crystal display device. FIG. 23 is a signal waveform diagram for describing operation performed during a write operation period. Note that, in the present embodiment, the on-duty (duty cycle) of the 8-phase clock signals is ⅜.

At time point t20, the set signal S (output signal Q(n−3)) changes from a low level to a high level. Hence, the thin film transistor M1 goes into an on state and the capacitor CAP is charged. By this, the potential of the output control node NA increases and the thin film transistors M6, M10, and M10A go into an on state. In addition, by a pulse of the set signal S, the thin film transistor M6Z goes into an on state. By the thin film transistors M6 and M6Z going into an on state, the potential of the stabilization node NB is drawn to the VSS potential. Here, during a period from time point t20 to time point t23, as with the period from time point t00 to time point t02 of the first embodiment, the potential of the output control node NA does not decrease.

At time point t21, the clock signal CKF (CK2) changes from a low level to a nigh level. Hence, the thin film transistor M5 goes into an on state. At this time, since the thin film transistors M6 and M6Z are in the on state, even when the thin film transistor M5 changes from an off state to an on state, the potential of the stabilization node NB is maintained at the low level. At time point t22, the clock signal CKH changes from a low level to a nigh level. Since the clock signal CKH is not provided to the unit circuit 5(n), the internal state of the unit circuit 5(n) does not change at time point t22.

At time point t23, the clock signal CKA (CK1) changes from a low level to a high level. By this, in the same manner as at time point t02 of the first embodiment, a large voltage is applied to the gate terminals of the thin film transistors M10 and M10A, and the potentials of the output signals Q and G (the potentials of the output terminals 58 and 59) increase to a high-level potential of the clock signal CKA (CK1). Here, during a period from time point t23 to time point t26, as with the period from time point t02 to time point t04 of the first embodiment, the potential of the output control node NA, the potential of the output signal Q, and the potential of the output signal G do not decrease.

At time point t24, the clock signal CKC (CK3) changes from a low level to a high level. Hence, the thin film transistor M7 goes into an on state. By this, the potential of the stabilization node NB is drawn to the VSS potential. At time point t25, the clock signal CKE changes from a low level to a high level. Since the clock signal CKE is not provided to the unit circuit 5(n), the internal state of the unit circuit 5(n) does not change at time point t25.

At time point t26, the clock signal CKA (CK1) changes from the nigh level to a low level. By this, with a decrease in the potential of the input terminal 53, the potentials of the output terminals 58 and 59 (the potentials of the output signals Q and G) decrease. When the potential of the output terminal 59 decreases, the potential of the output control node NA also decreases through the capacitor CAP.

At time point t27, the reset signal R (output signal Q(n+4)) changes from a low level to a high level. By this, the potential of the output control node NA goes to a low level.

By each unit circuit 5 performing operation such as that described above, the plurality of gate bus lines GL(1) to GL(i) provided to the liquid crystal display device sequentially go into a selected state, and writing to the pixel capacitances is performed row by row.

Figure 24:
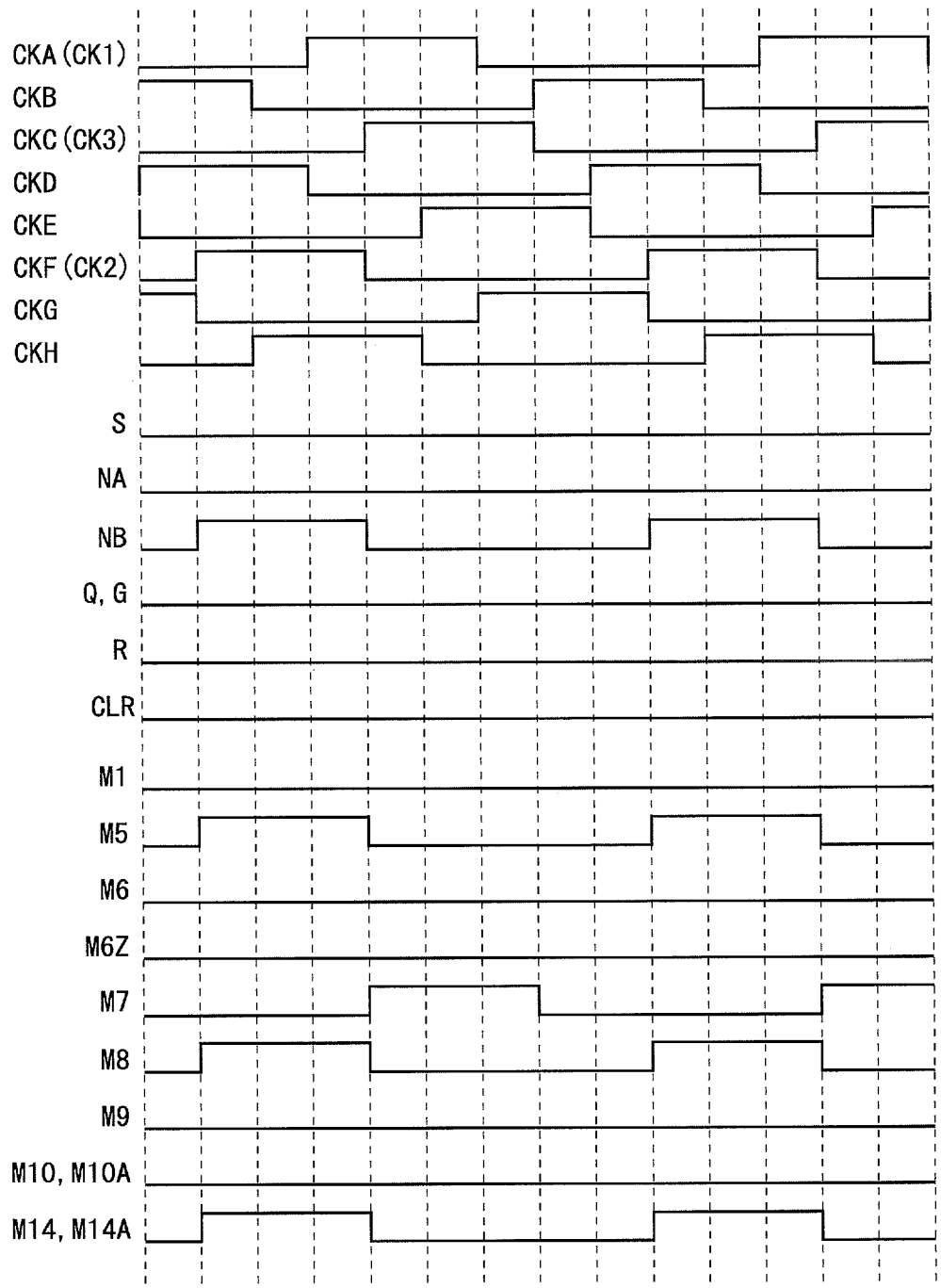
FIG. 24 is a signal waveform diagram for describing operation performed during a normal operation period in the second embodiment.

Next, with reference to FIGS. 13, 20, 22, and 24, operation performed during a normal operation period will be described. FIG. 24 is a signal waveform diagram for describing operation performed during a normal operation period. During the normal operation period, by the clock signal CKF (CK2) changing from a low level to a high level, the thin film transistor M5 goes into an on state and the potential of the stabilization node NB changes from a low level to a high level. In addition, during the normal operation period, by the clock signal CKC (CK3) changing from a low level to a high level, the thin film transistor M7 goes into an on state and the potential of the stabilization node NB changes from the high level to a low level. As such, during the normal operation period, the potential of the stabilization node NB goes to a high level every predetermined period. Therefore, as in the first embodiment, during the normal operation period, even when noise caused by the clock operation of the clock signal CKA (CK1) occurs, the potential of the output control node NA, the potential of the output signal Q, and the potential of the output signal G are maintained at the VSS potential.

<2.3 Effects>

In the present embodiment, too, as in the first embodiment, the occurrence of abnormal operation caused by the clock operation of a clock signal is prevented. Here, in the present embodiment, 8-phase clock signals with an on-duty (duty cycle) of ⅜ are used. In addition, the phase of the clock signal CKC (CK3) that changes the potential of the stabilization node NB from a high level to a low level is delayed by 135 degrees relative to the phase of the clock signal CKF (CK2) that changes the potential of the stabilization node NB from a low level to a high level. By the above, a period during which the potential of the stabilization node NB is at a high level is substantially a ⅜ period of the operation period of the device. On the other hand, as described above, in the conventional configuration, the potential of the stabilization node NB is at a high level for substantially a half-period of the operation period of the device. As such, according to the present embodiment, the length of the period during which the potential of the stabilization node NB is at a high level is shorter than that of the conventional configuration, suppressing the occurrence of a threshold shift of the thin film transistor M8 that contributes to the drawing of the potential of the output control node NA to the VSS potential. By the above, in the present embodiment, too, the reliability of long-term operation regarding the driving of the gate bus lines GL can be increased over the conventional configuration.

3. Third Embodiments

A third embodiment of the present invention will be described. An overall configuration and thin film transistors to be used are the same as those of the above-described first embodiment and thus description thereof is omitted (see FIGS. 2 to 7). Note that, in the present embodiment, too, 8-phase clock signals are provided to the shift register 510. Differences from the first embodiment will be mainly described below.

<3.1 Configuration of the Gate Driver>

Figure 25:
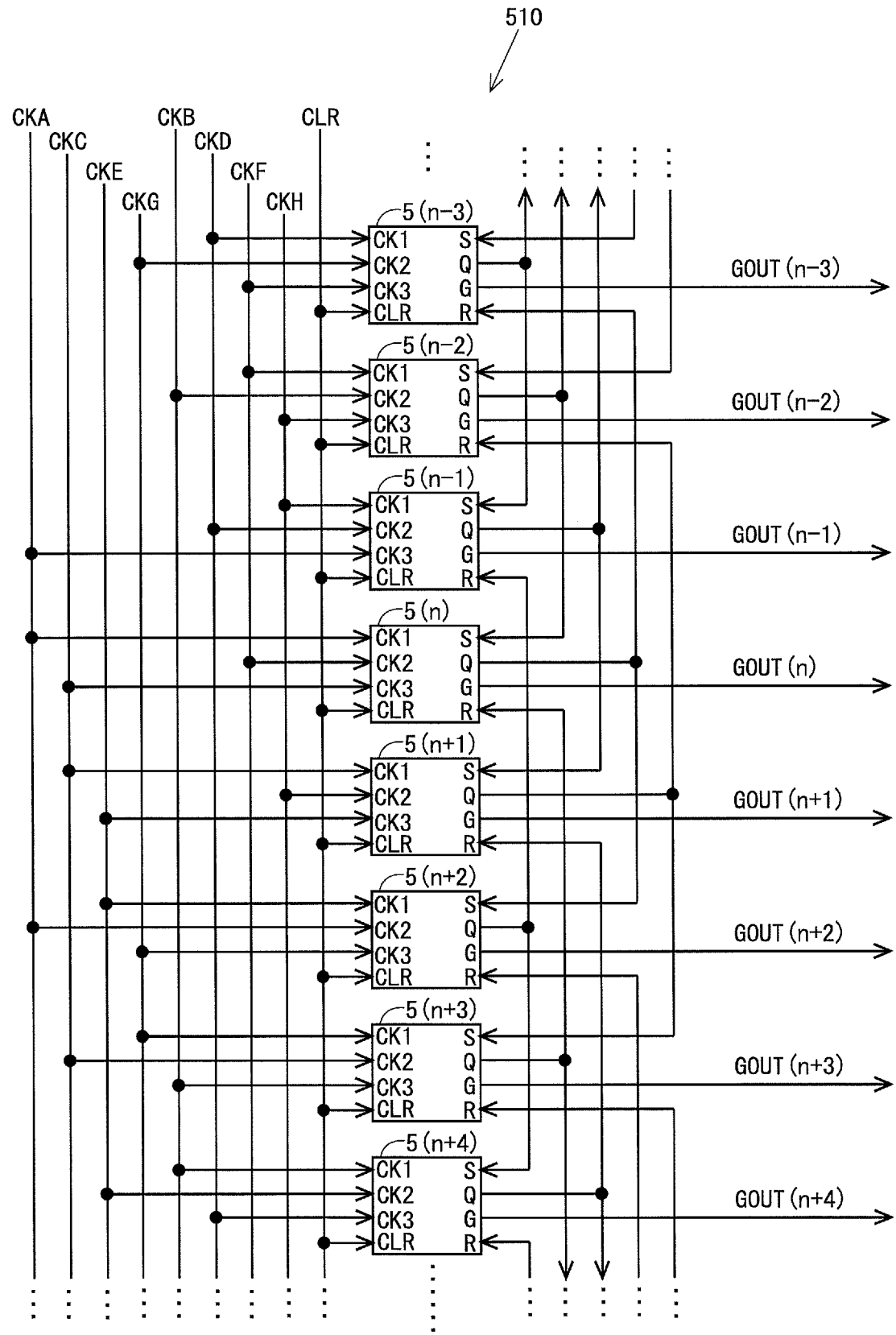
FIG. 25 is a block diagram showing a configuration of a shift register in a gate driver of a third embodiment of the present invention.
Figure 26:
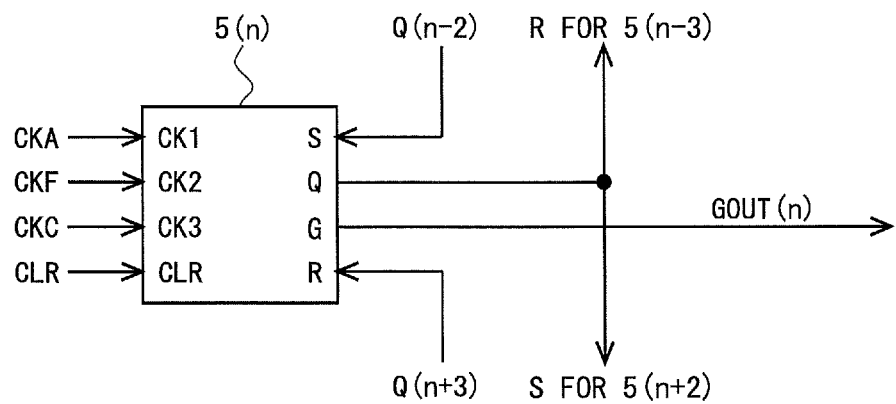
FIG. 26 is a diagram for describing input and output signals to/from a unit circuit of an nth stage of the shift register in the third embodiment.

FIG. 25 is a block diagram showing a configuration of a shift register 510 in a gate driver 500 of the present embodiment. For clock signals to be provided to each unit circuit 5, in the first embodiment, the phase of the clock signal CK2 is advanced by 45 degrees relative to the phase of the clock signal CK1. On the other hand, in the present embodiment, the phase of the clock signal CK2 is advanced by 90 degrees relative to the phase of the clock signal CK1. Therefore, for example, for a unit circuit 5(n) of an nth stage, as shown in FIG. 26, the clock signal CKA is provided as a clock signal CK1, the clock signal CKF is provided as a clock signal CK2, and the clock signal CKC is provided as a clock signal CK3. A set signal S, a reset signal R, an output signal Q, and an output signal G are the same as those of the first embodiment. Note that for the internal configuration of the unit circuit 5, as in the first embodiment, the configuration shown in FIG. 13 is adopted.

<3.2 Operation of the Unit Circuit>

Figure 27:
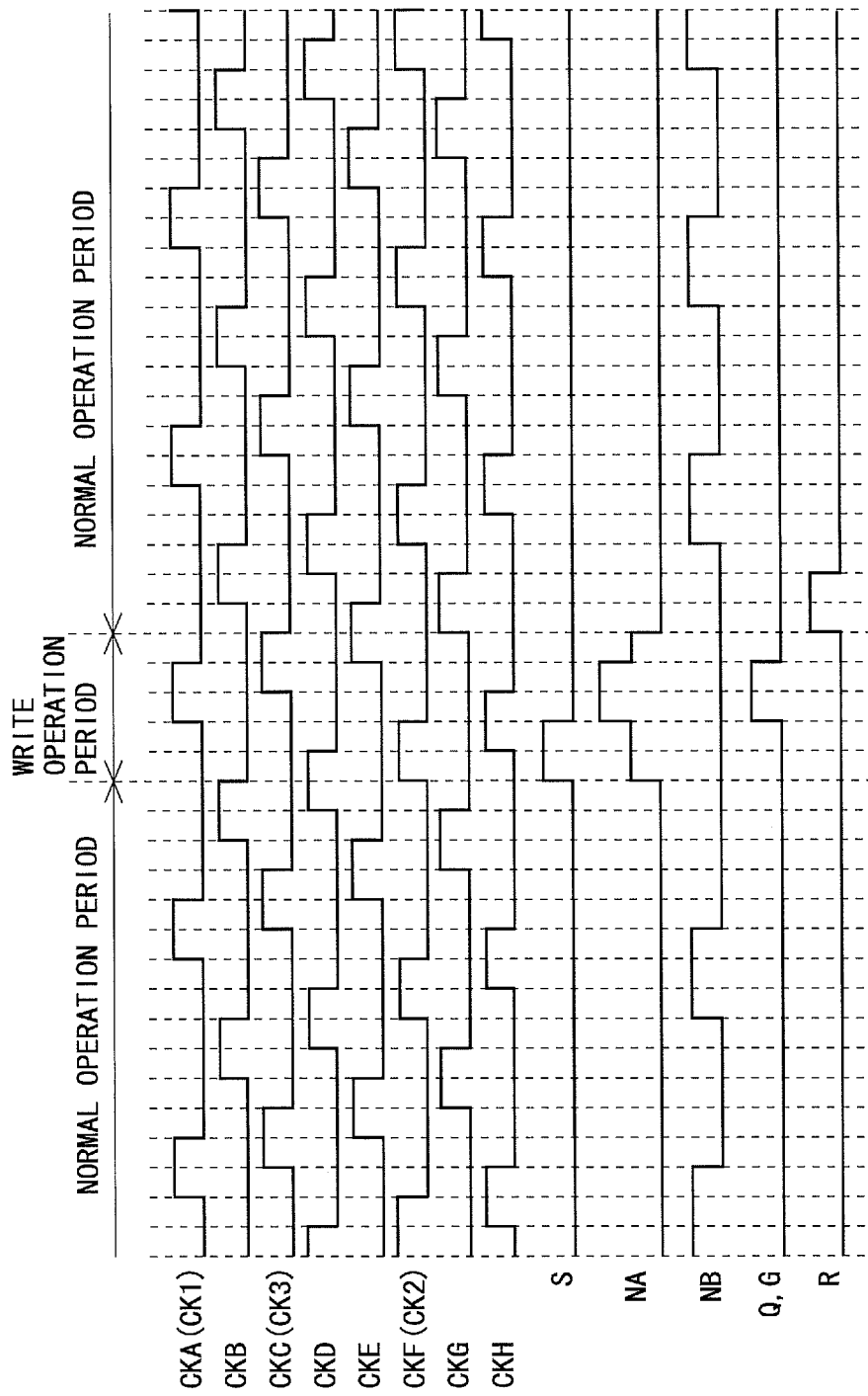
FIG. 27 is an overall signal waveform diagram for an operation period of a liquid crystal display device of the third embodiment.
Figure 28:
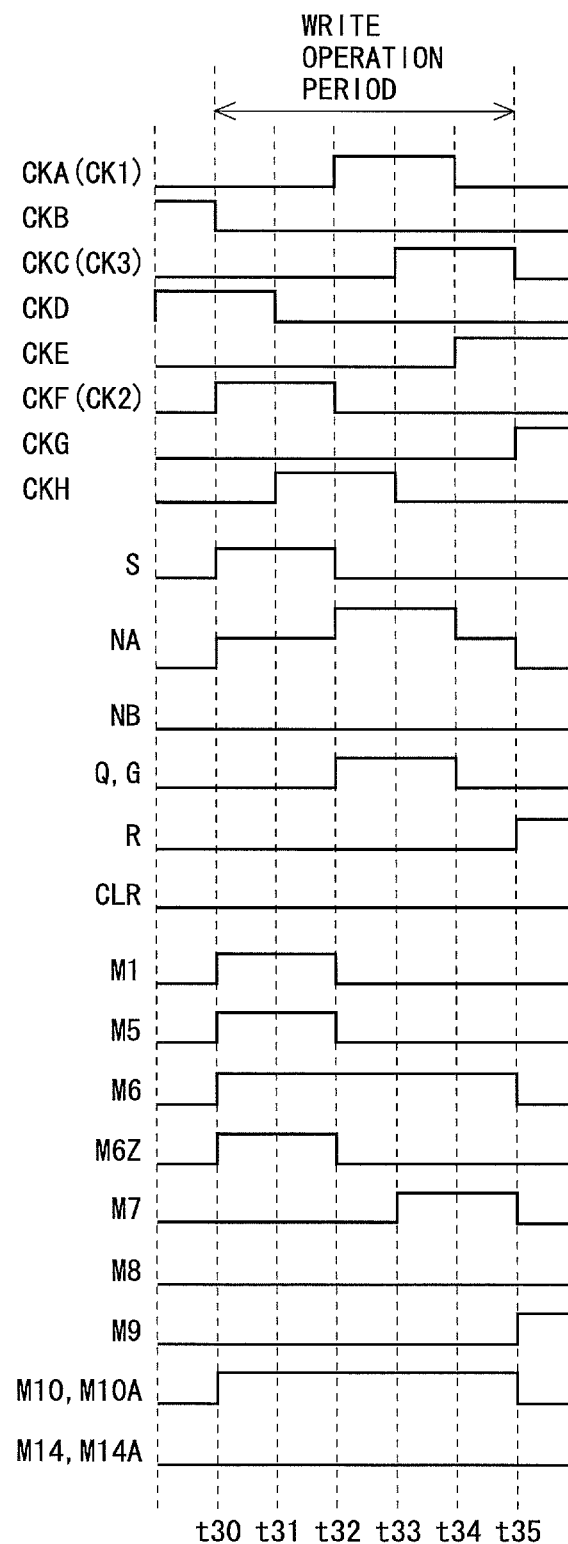
FIG. 28 is a signal waveform, diagram, for describing operation performed during a write operation period in the third embodiment.

Next, the operation of the unit circuit 5 of the present embodiment will be described. Here, too, attention is focused on the unit circuit 5(n) of the nth stage. First, with reference to FIGS. 13, 25, 27, and 28, operation performed during a write operation period will be described. FIG. 27 is an overall signal waveform diagram for an operation period of the liquid crystal display device. FIG. 28 is a signal waveform, diagram for describing operation performed during a write operation period. Note that, in the present embodiment, the on-duty (duty cycle) of the 8-phase clock signals is ⅜.

At time point t30, the set signal S (output signal Q(n−2)) changes from a low level to a high level. Hence, the thin film transistor M1 goes into an on state and the capacitor CAP is charged. By this, the potential of the output control node NA increases and the thin film transistors M6, M10, and M10A go into an on state. In addition, by a pulse of the set signal S, the thin film transistor M6Z goes into an on state. In addition, at time point t30, the clock, signal CKF (CK2) changes from a low level to a high level. Hence, the thin film transistor M5 goes into am on state. At this time, as described above, the thin film transistors M6 and M6Z are in the on state. Therefore, even when the thin film transistor M5 changes from an off state to an on state, the potential of the stabilization node NB is maintained, at a low level. Here, during a period from time point t30 to time point t32, as with the period from time point t00 to time point t02 of the first embodiment, the potential of the output control node NA does not decrease.

At time point t31, the clock signal CKH changes from, a low level to a high level. Since the clock signal CKH is not provided to the unit circuit 5(n), the internal state of the unit circuit 5(n) does not change at time point t31.

At time point t32, the clock signal CKA (CK1) changes from a low level to a high level. By this, in the same manner as at time point t02 of the first embodiment, a large voltage is applied to the gate terminals of the thin film transistors M10 and M10A, and the potentials of the output signals Q and G (the potentials of the output terminals 58 and 59) increase to a high-level potential of the clock signal CKA (CK1). Here, during a period from time point t32 to time point t34, as with the period from time point t02 to time point t04 of the first embodiment, the potential of the output control node NA, the potential of the output signal Q, and the potential of the output signal G do not decrease.

At time point t33, the clock signal CKC (CK3) changes from a low level to a high level. Hence, the thin film transistor M7 goes into an on state. By this, the potential of the stabilization node MB is drawn to the VSS potential.

At time point t34, the clock signal CKA (CK1) changes from, the high level to a low level. By this, with a decrease in the potential of the input terminal 53, the potentials of the output terminals 58 and 59 (the potentials of the output signals Q and G) decrease. When the potential of the output terminal 59 decreases, the potential of the output control node NA also decreases through the capacitor CAP.

At time point t35, the reset signal R (output signal Q(n+3)) changes from a low level to a high level. By this, the potential of the output control node NA goes to a low level.

By each unit circuit 5 performing operation such as that described above, the plurality of gate bus lines GL(1) to GL(i) provided to the liquid crystal display device sequentially go into a selected state, and writing to the pixel capacitances is performed row by row.

Figure 29:
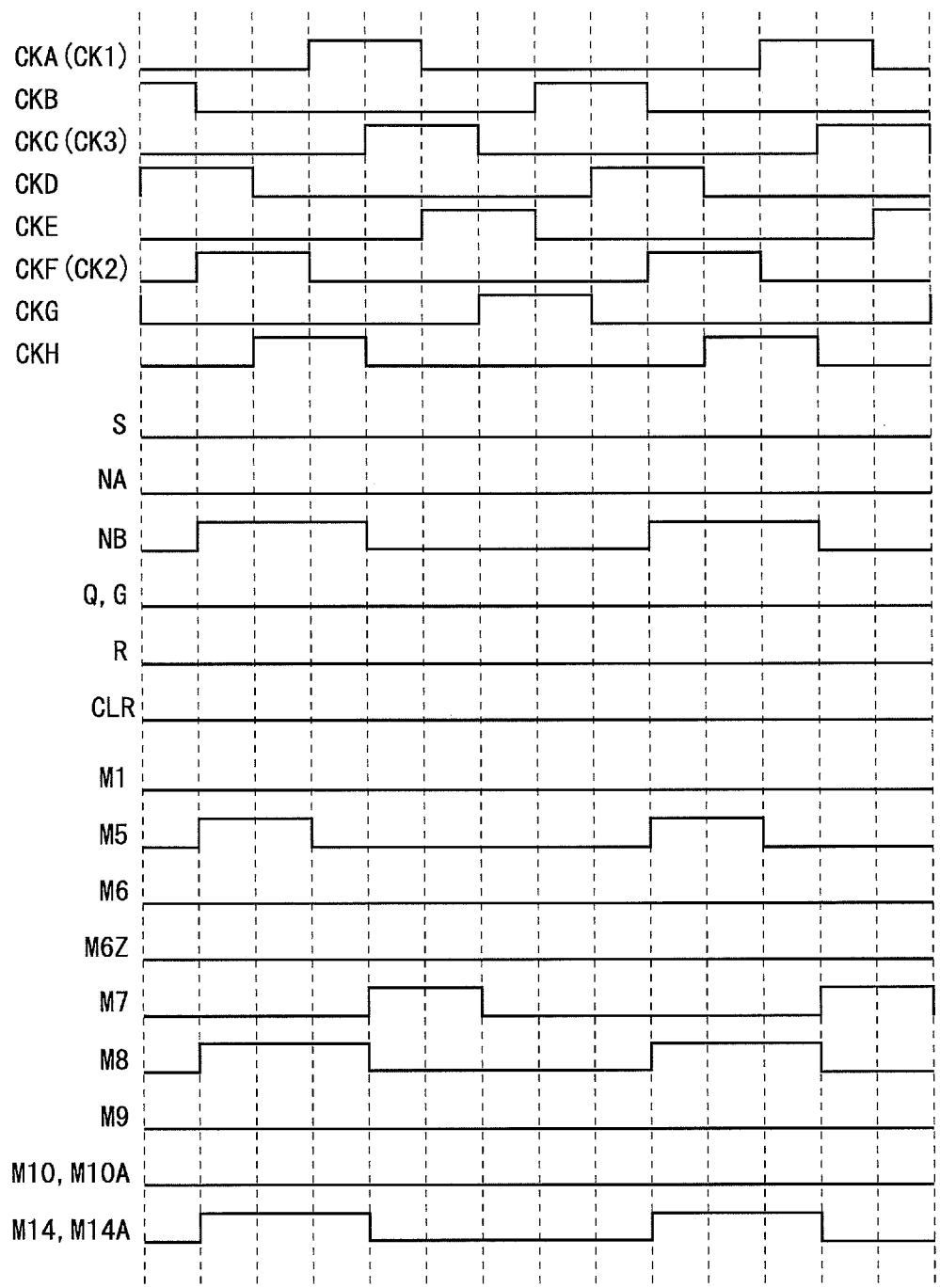
FIG. 29 is a signal waveform diagram for describing operation performed during a normal operation period in the third embodiment.

Next, with reference to FIGS. 13, 25, 27, and 29, operation performed during a normal operation period will be described. FIG. 29 is a signal waveform diagram for describing operation performed during a normal operation period. During the normal operation period, by the clock signal CKF (CK2) changing from a low level to a high level, the thin film transistor M5 goes into an on state and the potential of the stabilization node NB changes from a low level to a high level. In addition, during the normal operation period, by the clock signal CKC (CK3) changing from a low level to a high level, the thin film, transistor M7 goes into an on state and the potential of the stabilization node NB changes from the high level to a low level. As such, during the normal operation period, the potential of the stabilization node NB goes to a high level every predetermined period. Therefore, as in the first embodiment, during the normal operation period, even when noise caused by the clock operation of the clock signal CKA (CK1) occurs, the potential of the output control node NA, the potential of the output signal Q, and the potential of the output signal G are maintained at the VSS potential.

<3.3 Effects>

In the present embodiment, too, as in the first embodiment, the occurrence of abnormal operation caused by the clock operation of a clock signal is prevented. In addition, according to the present embodiment, as in the second embodiment, a period during which the potential of the stabilization node NB is at a high level is substantially a ⅜ period of the operation period of the device. By the above, in the present embodiment, too, the reliability of long-term operation regarding the driving of the gate bus lines GL can be increased over the conventional configuration.

4. Fourth Embodiment

A fourth embodiment of the present invention will be described. An overall configuration and thin film transistors to be used are the same as those of the above-described first embodiment and thus description thereof is omitted (see FIGS. 2 to 7). Note that, in the present embodiment, too, 8-phase clock signals are provided to the shift register 510. Differences from the first embodiment will be mainly described below.

<4.1 Configuration of the Gate Driver>

In the present embodiment, as gate clock signals GCK for allowing the shift register 510 to operate, the same 8-phase clock signals as those of the first embodiment are used. How the 8-phase clock signals are provided to each unit circuit 5 is the same as that of the first embodiment. Thus, for example, for a unit circuit 5(n) of an nth stage, the clock signal CKA is provided as a clock signal CK1, the clock signal CKH is provided as a clock signal CK2, and the clock signal CKC is provided as a clock signal CK3. In addition, when attention is focused on two consecutive unit circuits, to the subsequent unit circuit are provided three clock signals whose phases are delayed by 45 degrees relative to those of three clock signals that are provided to the preceding unit circuit.

Figure 30:
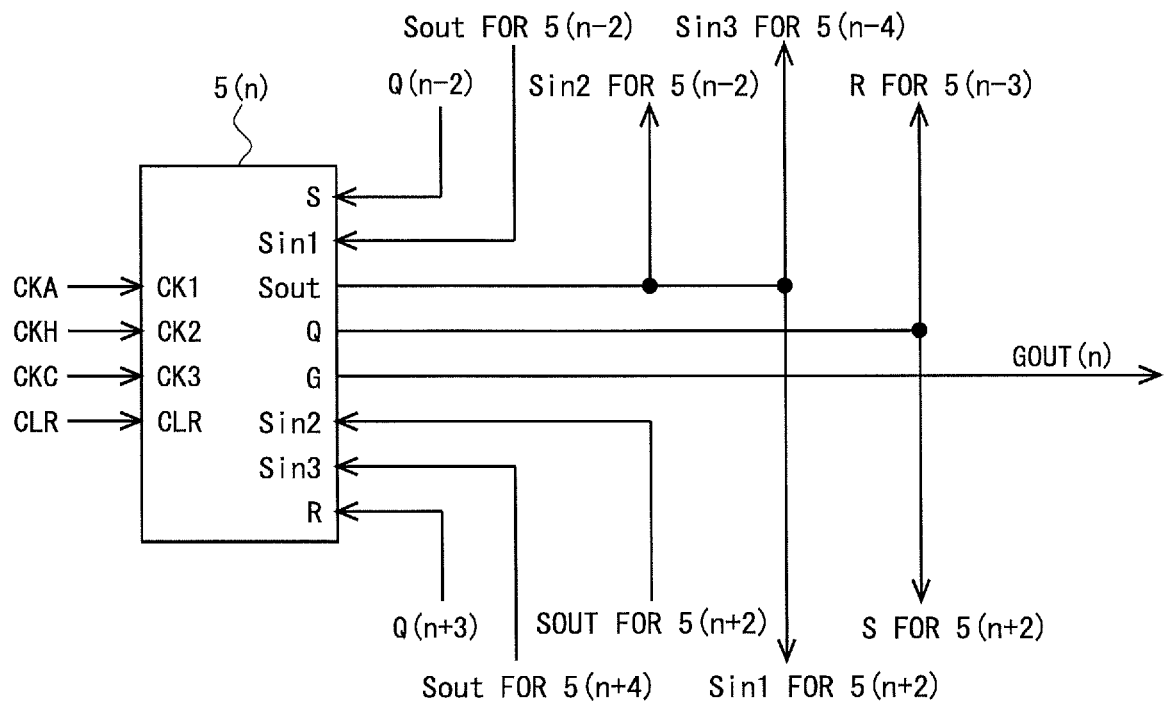
FIG. 30 is a diagram for describing input and output signals to/from a unit circuit of an nth stage of a shift register of a fourth embodiment of the present invention.

FIG. 30 is a diagram for describing input and output signals to/from, the unit circuit 5(n) of the nth stage of the shift register 510. To each unit circuit 5 are inputted, three control signals Sin1 to Sin3 indicating the potentials of stabilization nodes NB in unit circuits 5 of other stages, in addition to input signals of the first embodiment. In addition, from each unit circuit 5 is outputted a control signal Sout that indicates the potential of a stabilization node NB and that controls the operation of unit circuits 5 of other stages, in addition to output signals of the first embodiment. Therefore, the unit circuit 5 of the present embodiment is provided with three input terminals for receiving the control signals Sin1 to Sin3, respectively, and an output terminal for outputting the control signal Sout, in addition to the input and output terminals of the first embodiment (see FIG. 11).

As shown in FIG. 30, for a unit circuit 5(n) of any stage (here, the nth stage), an output signal Q(n−2) outputted from a unit circuit 5(n−2) of a stage two stages before the nth stage is provided as a set signal S, and am output signal Q(n+3) outputted from a unit circuit 5(n+3) of a stage three stages after the nth stage is provided as a reset signal R. Note, however, that for a unit circuit 5(1) of the first stage and a unit circuit 5(2) of the second stage, a gate start pulse signal GSP is provided as a set signal S. In addition, as shown in FIG. 30, an output signal Q outputted from the unit circuit 5(n) of any stage is provided as a reset signal R to a unit circuit 5(n−3) of a stage three stages before the nth stage and provided as a set signal S to a unit circuit 5(n+2) of a stage two stages after the nth stage, and an output signal G outputted from the unit circuit 5(n) of any stage is provided as a scanning signal GOUT(n) to a gate bus line GL(n).

Furthermore, as shown in FIG. 30, for the unit circuit 5(n) of any stage, a control signal Sout outputted from, the unit circuit 5(n−2) of a stage two stages before the nth stage is provided as a control signal Sin1, a control signal Sout outputted from the unit circuit 5(n+2) of a stage two stages after the nth stage is provided as a control signal Sin2, and a control signal Sout outputted from a unit circuit 5(n+4) of a stage four stages after the nth stage is provided as a control signal Sin3. Moreover, as shown in FIG. 30, a control signal Sout outputted from the unit circuit 5(n) of any stage is provided as a control signal Sin1 to the unit circuit 5(n+2) of a stage two stages after the nth stage, provided as a control signal Sin2 to the unit circuit 5(n−2) of a stage two stages before the nth stage, and provided as a control signal Sin3 to a unit circuit 5(n−4) of a stage four stages before the nth stage.

<4.2 Configuration of the Unit Circuit>

Figure 31:
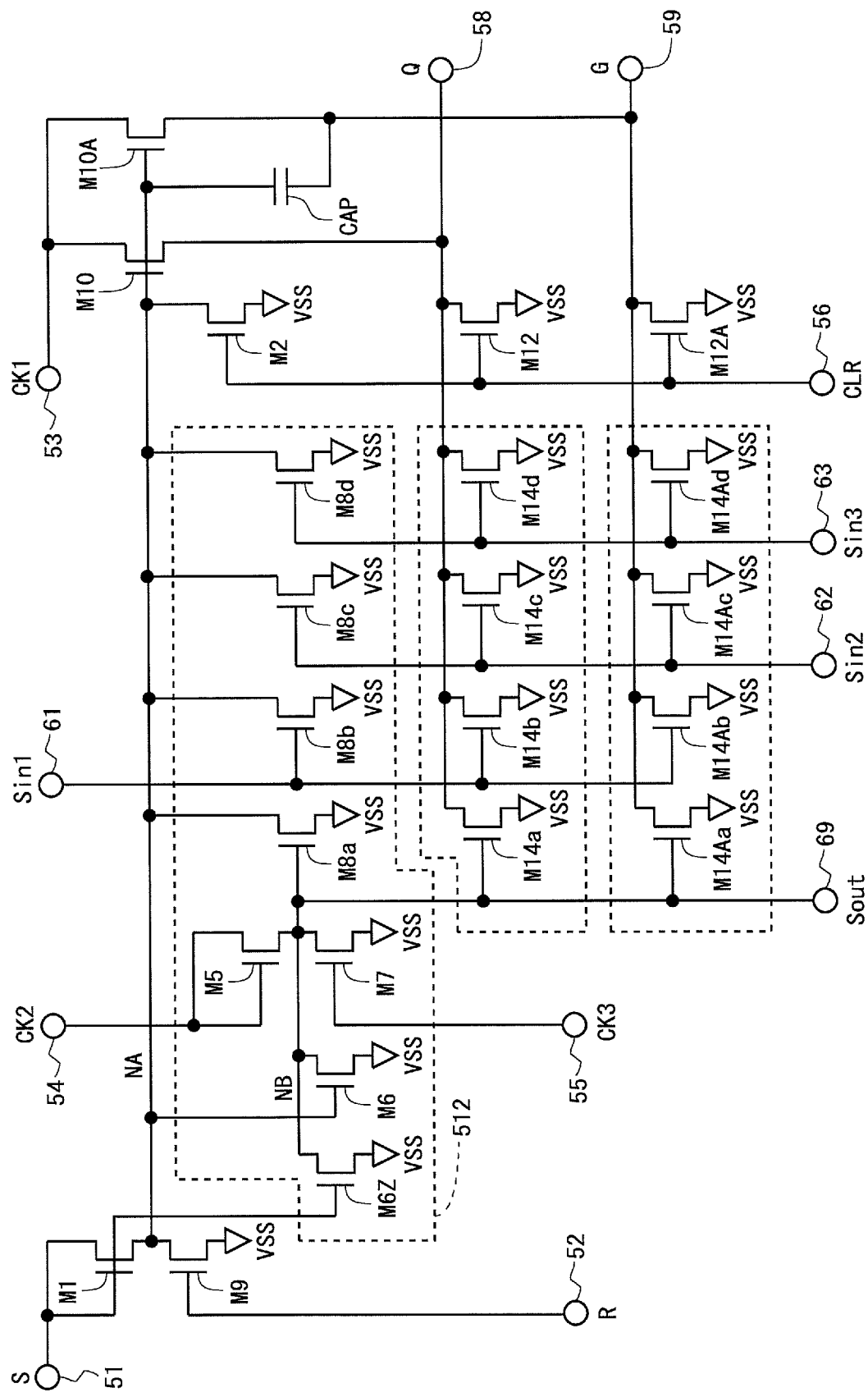
FIG. 31 is a circuit diagram showing a configuration of a unit circuit (a configuration of a portion of the shift register for one stage) of the fourth embodiment.

FIG. 31 is a circuit diagram showing a configuration of a unit circuit 5 (a configuration of a portion of the shift register 510 for one stage) of the present embodiment. As shown in FIG. 31, the unit circuit 5 includes nine thin film transistors M8b, M8c, M8d, M14b, M14c, M14d, M14Ab, M14Ac, and M14Ad, in addition to the components provided in the first embodiment (see FIG. 13). Note that thin film transistors M8a, M14a, and M14Aa of FIG. 31 correspond to the thin film transistors M8, M14, and M14A of FIG. 13, respectively. In addition, the unit circuit 5 has three input terminals 61 to 63 and one output terminal (output node) 69, in addition to the input and output terminals provided in the first embodiment (see FIG. 13). Here, an input terminal that receives a control signal Sin1 is denoted by reference character 61, an input terminal that receives a control signal Sin2 is denoted by reference character 62, and an input terminal that receives a control signal Sin3 is denoted by reference character 63. In addition, the output terminal for outputting a control signal Sout is denoted by reference character 69.

The input terminal 61 is connected to a stabilization node NB in a unit circuit 5(n−2) of a stage two stages before this stage. The input terminal 62 is connected to a stabilization node NB in a unit circuit 5(n+2) of a stage two stages after this stage. The input terminal 63 is connected to a stabilization node NB in a unit circuit 5(n+4) of a stage four stages after this stage. The output terminal 69 is connected to the stabilization node NB in the unit circuit 5(n+2) of a stage two stages after this stage, the stabilization node NB in the unit circuit 5(n−2) of a stage two stages before this stage, and a stabilization node NB in a unit circuit 5(n−4) of a stage four stages before this stage.

The thin film transistor M8b is connected at its gate terminal to the input terminal 61, connected at its drain terminal to an output control node NA, and connected at its source terminal to an input terminal for a direct-current power supply potential VSS. The thin film transistor M8c is connected at its gate terminal to the input terminal 62, connected at its drain terminal to the output control node NA, and connected at its source terminal to an input terminal for a direct-current power supply potential VSS. The thin film transistor M8d is connected at its gate terminal to the input terminal 63, connected at its drain terminal to the output control node NA, and connected at its source terminal to an input terminal for a direct-current power supply potential VSS. The thin film transistor M14b is connected at its gate terminal to the input terminal 61, connected at its drain terminal to an output terminal 58, and connected at its source terminal to an input terminal for a direct-current power supply potential VSS. The thin film transistor M14c is connected at its gate terminal to the input terminal 62, connected at its drain terminal to the output terminal 58, and connected at its source terminal to an input terminal for a direct-current power supply potential VSS. The thin film transistor M14d is connected at its gate terminal to the input terminal 63, connected at its drain terminal to the output terminal 58, and connected at its source terminal to an input terminal for a direct-current power supply potential VSS.

The thin film transistor M14Ab is connected at its gate terminal to the input terminal 61, connected at its drain terminal to an output terminal 59, and connected at its source terminal to an input terminal for a direct-current power supply potential VSS. The thin film transistor M14Ac is connected at its gate terminal to the input terminal 62, connected at its drain terminal to the output terminal 59, and connected at its source terminal to an input terminal for a direct-current power supply potential VSS. The thin film transistor M14Ad is connected at its gate terminal to the input terminal 63, connected at its drain terminal to the output terminal 59, and connected at its source terminal to an input terminal for a direct-current power supply potential VSS. Mote that a stabilization node NB is connected to the output terminal 69.

The thin film transistor M8b changes the potential of the output control node NA toward the VSS potential when the control signal Sin1 is at a high level. The thin film transistor M8c changes the potential of the output control node NA toward the VSS potential when the control signal Sin2 is at a high level. The thin film transistor M8d changes the potential of the output control node NA toward the VSS potential when the control signal Sin3 is at a high level. The thin film transistor M14b changes the potential of the output terminal 58 toward the VSS potential when the control signal Sin1 is at a high level. The thin film transistor M14c changes the potential of the output terminal 58 toward the VSS potential when the control signal Sin2 is at a high level. The thin film transistor M14d changes the potential of the output terminal 58 toward the VSS potential when the control signal Sin3 is at a high level. The thin film transistor M14Ab changes the potential of the output terminal 59 toward the VSS potential when the control signal Sin1 is at a high level. The thin film transistor M14Ac changes the potential of the output terminal 59 toward the VSS potential when the control signal Sin2 is at a high level. The thin film transistor M14Ad changes the potential of the output terminal 59 toward the VSS potential when the control signal Sin3 is at a high level.

Note that, in the present embodiment, target node stabilization transistors are implemented by the thin film transistors M8b, M8c, M8d, M14b, M14c, M14d, M14Ab, M14Ac, and M14Ad. Note also that a first target node stabilization transistor is implemented by the thin film transistors M8b, M14b, and M14Ab, a second target node stabilization transistor is implemented by the thin film transistors M8c, M14c, and M14Ac, and a third target node stabilization transistor is implemented by the thin film transistors M8d, M14d, and M14Ad.

<4.3 Operation of the Unit Circuit>

Figure 32:
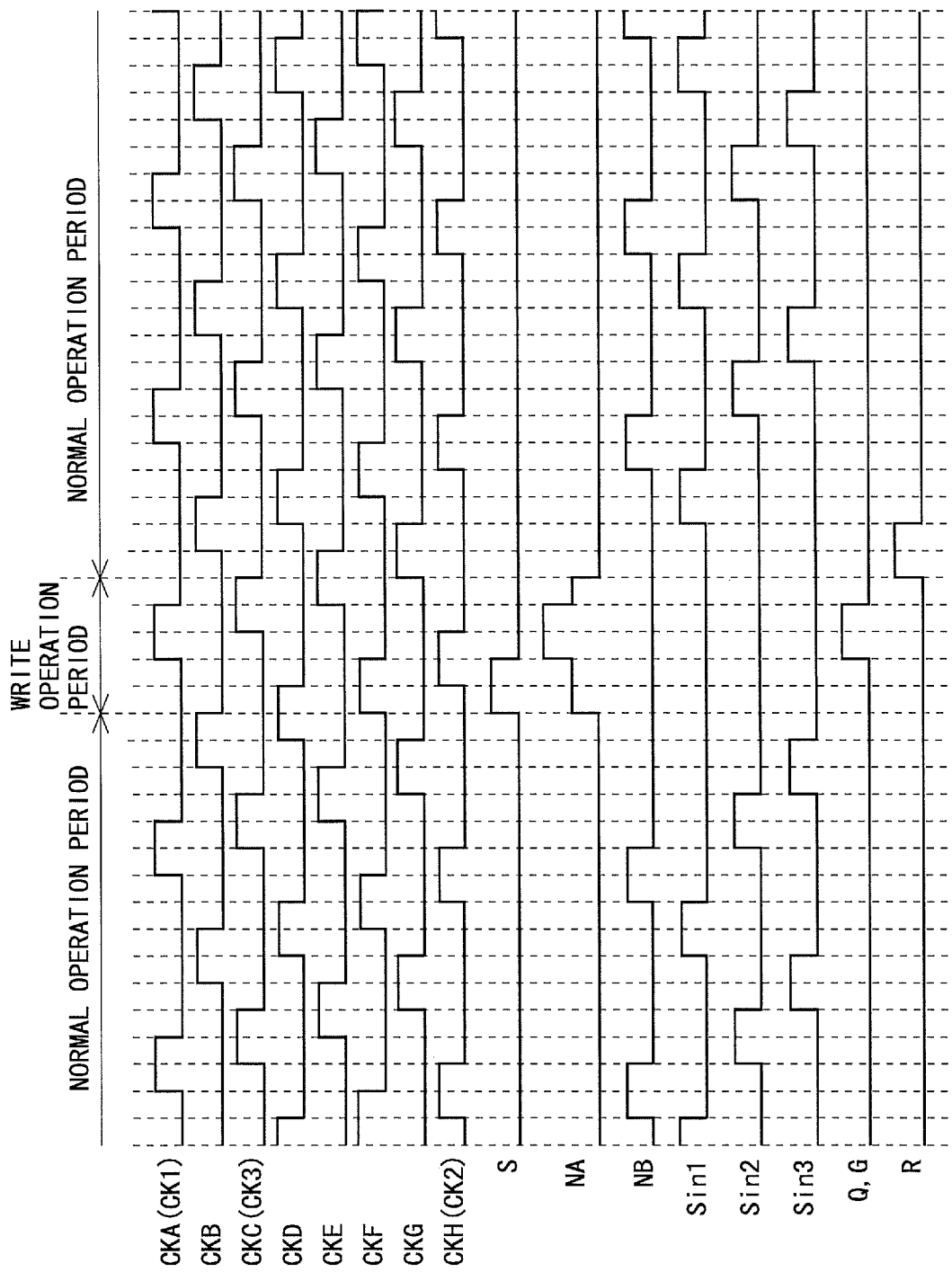
FIG. 32 is an overall signal waveform diagram for an operation period of a liquid crystal display device of the fourth embodiment.
Figure 33:
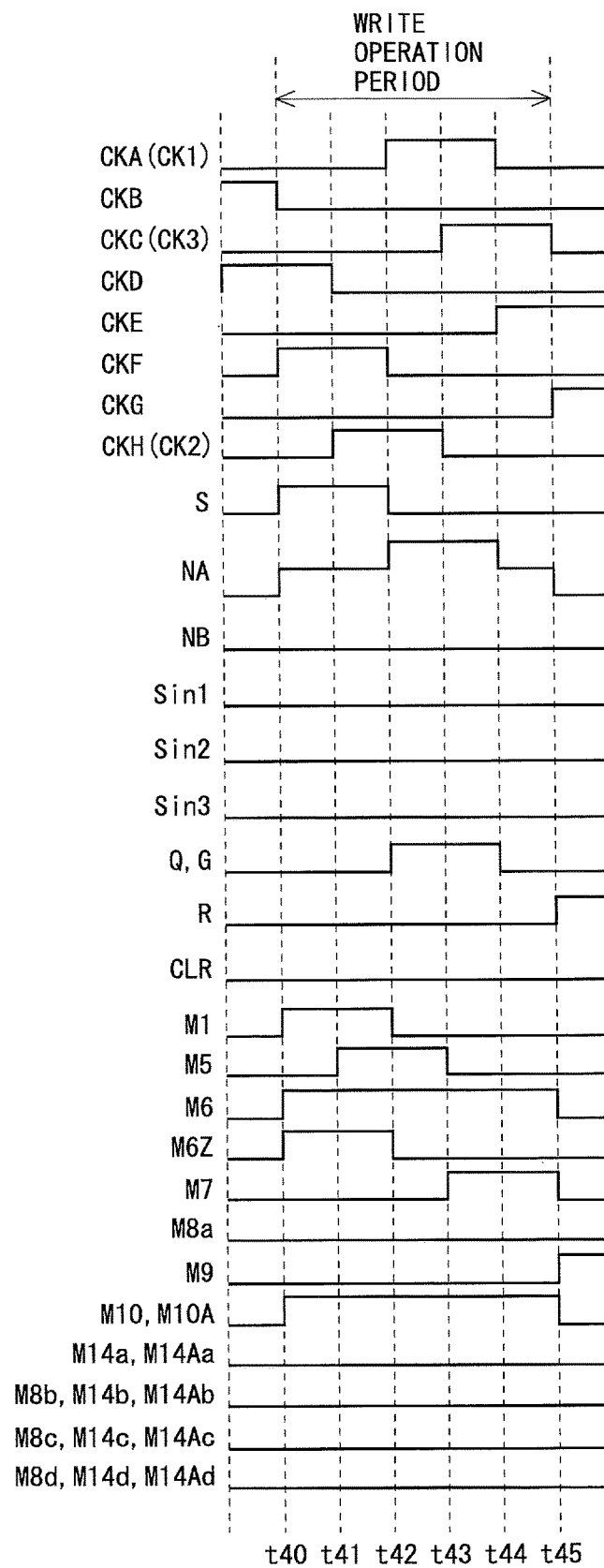
FIG. 33 is a signal waveform diagram for describing operation performed during a write operation period in the fourth embodiment.

Next, the operation of the unit circuit 5 of the present embodiment will be described. Here, too, attention is focused on the unit circuit 5(n) of the nth stage. First, with reference to FIGS. 30, 31, 32, and 33, operation performed during a write operation period will be described. FIG. 32 is an overall signal waveform diagram for an operation period of the liquid crystal display device. FIG. 33 is a signal waveform diagram for describing operation performed during a write operation period. Note that, in the present embodiment, the on-duty (duty cycle) of the 8-phase clock signals is ⅖.

At time point t40, the set signal S (output signal Q(n−2)) changes from a low level to a high level. Hence, the thin film transistor M1 goes into an on state and the capacitor CAP is charged. By this, the potential of the output control node NA increases and the thin film transistors M6, M10, and M10A go into an on state. In addition, by a pulse of the set signal S, the thin film transistor M6Z goes into an on state. By the thin film transistors M6 and M6Z going into an on state, the potential of the stabilization node NB is drawn to the VSS potential. Here, during a period from time point t40 to time point t42, since the reset signal P, (output signal Q(n+3)), the clear signal CLR, and the potential of the stabilization node NB are at a low level, the thin film transistors M9, M2, and M8a are maintained in an off state. In addition, since the control signal Sin1, the control signal Sin2, and the control signal Sin3 are at a low level, the thin film transistors M8b, M8c, and M8d are maintained in an off state. By the above, the potential of the output control node NA does not decrease during the period from time point t40 to time point t42.

At time point t41, the clock signal CKH (CK2) changes from a low level to a high level. Hence, the thin film transistor M5 goes into an on state. At this time, since the thin film transistors M6 and M6Z are in the on state, even when the thin film transistor M5 changes from an off state to an on state, the potential of the stabilization node NB is maintained at the low level.

At time point t42, the clock signal CKA (CK1) changes from a low level to a high level. By this, in the same manner as at time point t02 of the first embodiment, a large voltage is applied to the gate terminals of the thin film transistors M10 and M10A, and the potentials of the output signals Q and G (the potentials of the output terminals 58 and 59) increase to a high-level potential of the clock signal CKA (CK1). Here, during a period from time point t42 to time point t44, since the reset signal R is at the low level, the thin film transistor M9 is maintained in the off state. In addition, during this period, since the clear signal CLR is at the low level, the thin film transistors M2, M12, and M12A are maintained in an off state. Furthermore, during this period, since the potential of the stabilization node NB is at the low level, the thin film transistors M8a, M14a, and M14Aa are maintained in an off state. Moreover, during this period, since the control signal Sin1, the control signal Sin2, and the control signal Sin3 are at the low level, the thin film transistors M8b, M8c, M8d, M14b, M14c, M14d, M14Ab, M14Ac, and M14Ad are maintained in an off state. By the above, the potential of the output control node NA, the potential of the output signal Q, and the potential of the output signal G do not decrease during the period from time point t42 to time point t44.

At time point t43, the clock signal CKC (CK3) changes from a low level to a high level. Hence, the thin film transistor M7 goes into an on state. By this, the potential of the stabilization node NB is drawn to the VSS potential.

At time point t44, the clock signal CKA (CK1) changes from, the high level to a low level. By this, with a decrease in the potential of the input terminal 53, the potentials of the output terminals 58 and 59 (the potentials of the output signals Q and G) decrease. When the potential of the output terminal 59 decreases, the potential of the output control node NA also decreases through the capacitor CAP.

At time point t45, the reset signal R changes from the low level to a high level. By this, the potential of the output, control node NA goes to a low level.

By each unit circuit 5 performing operation such as that described above, the plurality of gate bus lines GL(1) to GL(i) provided to the liquid crystal display device sequentially go into a selected state, and writing to the pixel capacitances is performed row by row.

Figure 34:
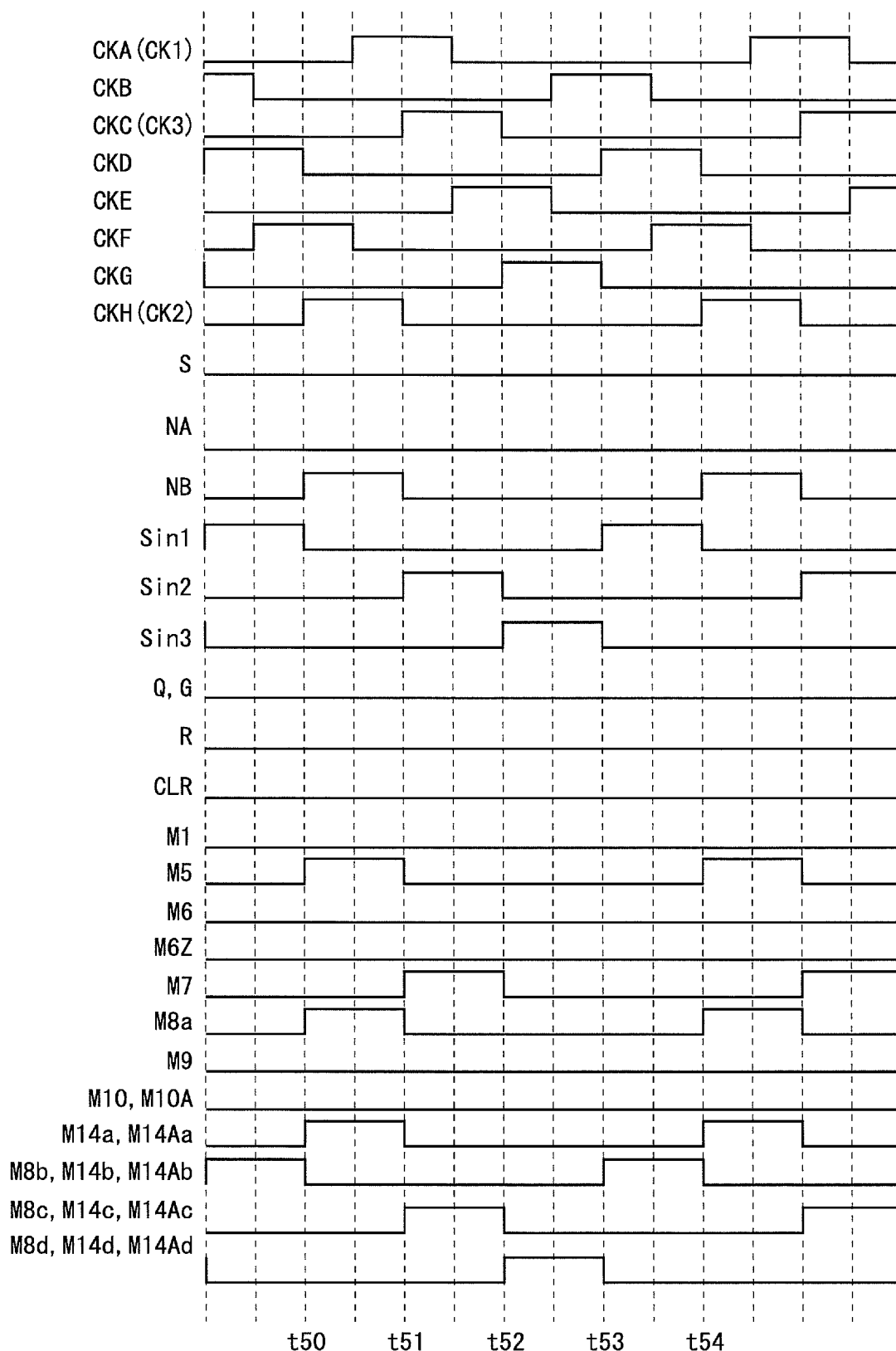
FIG. 34 is a signal waveform diagram for describing operation performed during a normal operation period in the fourth embodiment.

Next, with reference to FIGS. 30, 31, 32, and 34, operation performed during a normal operation period will be described. FIG. 34 is a signal waveform diagram for describing operation performed during a normal operation period. In FIG. 34, attention is focused on a period from time point t50 to time point t54 (a period corresponding to a clock period of the 8-phase clock signals).

At time point, t50, the clock signal CKH (CK2) changes from a low level to a high, level, by which the thin film transistor M5 goes into an on state and the potential of the stabilization node NB changes from a low level to a high level. In addition, at time point t51, the clock signal CKC (CK3) changes from, a low level to a high level, by which the thin film transistor M7 goes into an on state and the potential of the stabilization node NB changes from the nigh level to a low level. By the above, during a period from time point t50 to time point t51, the thin film transistors M8a, M14a, and M14Aa are in an on state. During a period from time point t51 to time point t52, since the control signal Sin2 is at a high level, the thin film transistors M8c, M14c, and M14Ac are in an on state. During a period from time point t52 to time point t53, since the control signal Sin3 is at a high level, the thin film transistors M8d, M14d, and M14Ad are in an on state. During a period from, time point t53 to time point t54, since the control signal Sin1 is at a high level, the thin film transistors M8b, M14b, and M14Ab are in an on state. By the above, the potential of the output control node NA, the potential of the output signal Q, and the potential of the output signal G are always drawn to the VSS potential during the normal operation period.

<4.4 Effects>

According to the present embodiment, as in the first embodiment, a period during which the potential of the stabilization node NB is at a high level is substantially a ¼ period of the operation period of the device. Therefore, as in the first embodiment, the occurrence of a threshold shift of the thin film transistor M8a that contributes to the drawing of the potential of the output control node NA to the VSS potential is suppressed. In addition, according to the present embodiment, the unit circuit 5 is provided with four thin film transistors for drawing the potential of the output control node NA to the VSS potential, four thin film transistors for drawing the potential of the output terminal 58 (the potential of the output signal Q) to the VSS potential, and four thin film transistors for drawing the potential of the output terminal 59 (the potential of the output signal G) to the VSS potential, in addition to thin film transistors that are controlled by the clear signal CLR. Then, the state of each set of four thin film transistors is controlled such that, during the normal operation period, at all times, any one of the four thin film transistors is in an on state. Hence, the potential of the output control node NA, the potential of the output signal Q, and the potential of the output signal G are always drawn to the VSS potential during the normal operation period. By the above, according to the present embodiment, the reliability of long-term operation regarding the driving of the gate bus lines GL can be increased over the conventional configuration, and the stability of circuit operation can be remarkably increased.

5. Fifth Embodiment

A fifth embodiment of the present invention will be described. An overall configuration and thin film transistors to be used are the same as those of the above-described first embodiment and thus description thereof is omitted (see FIGS. 2 to 7). Note that, in the present embodiment, too, 8-phase clock signals are provided to the shift register 510.

<5.1 Configuration of the Gate Driver>

In the present embodiment, as gate clock signals GCK for allowing the shift register 510 to operate, the same 8-phase clock signals as those of the second embodiment are used. How the 8-phase clock signals are provided to each unit circuit 5 is the same as that of the second embodiment. Thus, for example, for a unit circuit 5(n) of an nth stage, the clock signal CKA is provided as a clock signal CK1, the clock signal CKF is provided as a clock signal CK2, and the clock signal CKC is provided as a clock signal CK3. In addition, when attention is focused on two consecutive unit circuits, to the subsequent unit circuit are provided three clock signals whose phases are delayed by 45 degrees relative to those of three clock signals that are provided to the preceding unit circuit.

Figure 35:
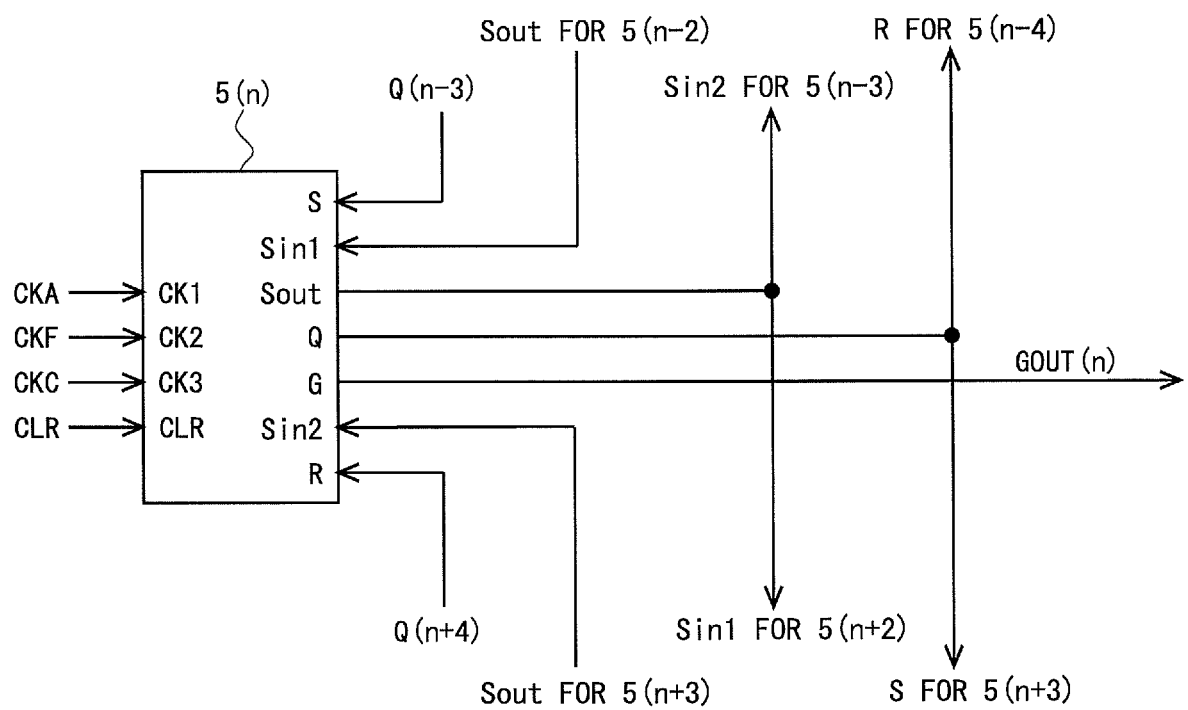
FIG. 35 is a diagram for describing input and output signals to/from a unit circuit of an nth stage of a shift register of a fifth embodiment of the present invention.

FIG. 35 is a diagram for describing input and output signals to/from the unit circuit 5(n) of the nth stage of the shift register 510. Among the input and output terminals provided in the above-described fourth embodiment (see FIG. 30), an input terminal for receiving a control signal Sin3 is not provided to each unit circuit 5.

As shown in FIG. 35, for a unit circuit 5(n) of any stage (here, the nth stage), an output signal Q(n−3) outputted from a unit circuit 5(n−3) of a stage three stages before the nth stage is provided as a set signal S, and an output signal Q(n+4) outputted from a unit circuit 5(n+4) of a stage four stages after the nth stage is provided as a reset signal R. Note, however, that for a unit circuit 5(1) of the first stage and a unit circuit 5(2) of the second stage, a gate start pulse signal GSP is provided as a set signal S. In addition, as shown in FIG. 35, an output signal Q outputted from the unit circuit 5(n) of any stage is provided as a reset signal R to a unit circuit 5(n−4) of a stage four stages before the nth stage and provided as a set signal S to a unit circuit 5(n+3) of a stage three stages after the nth stage, and an output signal G outputted from the unit circuit 5(n) of any stage is provided as a scanning signal GOUT(n) to a gate bus line GL(n).

Furthermore, as shown in FIG. 35, for the unit circuit 5(n) of any stage, a control signal Sout outputted from a unit circuit 5(n−2) of a stage two stages before the nth stage is provided as a control signal Sin1, and a control signal Sout outputted from the unit circuit 5(n+3) of a stage three stages after the nth stage is provided as a control signal Sin2. Moreover, as shown in FIG. 35, a control signal Sout outputted from the unit circuit 5(n) of any stage is provided as a control-signal Sin1 to a unit circuit 5(n+2) of a stage two stages after the nth stage, and provided as a control signal Sin2 to the unit circuit 5(n−3) of a stage three stages before the nth stage.

<5.2 Configuration of the Unit Circuit>

Figure 36:
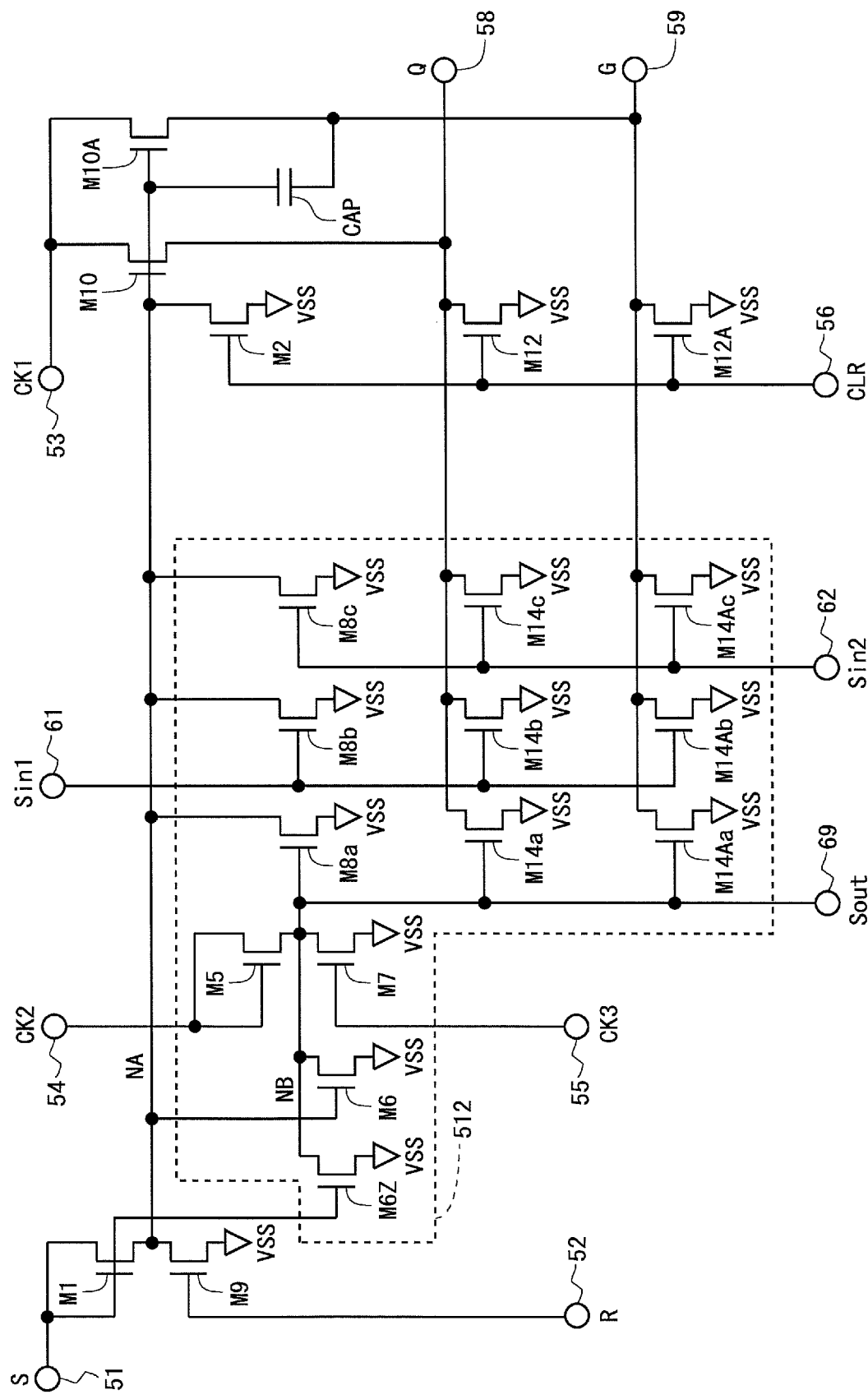
FIG. 36 is a circuit diagram showing a configuration of a unit circuit (a configuration of a portion of the shift register for one stage) of the fifth embodiment.

FIG. 36 is a circuit diagram showing a configuration of a unit circuit 5 (a configuration of a portion of the shift register 510 for one stage) of the present embodiment. Among the components provided in the fourth embodiment (see FIG. 31), the thin film transistors M8d, M14d, and M14Ad are not provided to the unit circuit 5. That is, in the present embodiment, as thin film transistors for drawing the potential of the output control node NA to the VSS potential, three thin film transistors M8a, M8b, and M8c are provided in addition to a thin film transistor M2 which is controlled by a clear signal CLR; as thin film transistors for drawing the potential of the output terminal 58 (the potential of the output signal Q) to the VSS potential, three thin film transistors M14a, M14b, and M14c are provided in addition to a thin film transistor M12 which is controlled by the clear signal CLR; and as thin film transistors for drawing the potential of the output terminal 59 (the potential of the output signal G) to the VSS potential, three thin film transistors M14Aa, M14Ab, and M14Ac are provided in addition to a thin film transistor M12A which is controlled by the clear signal CLR.

In the present embodiment, the input terminal 61 is connected to a stabilization node NB in the unit circuit 5(n−2) of a stage two stages before this stage, and the input terminal 62 is connected to a stabilization node NB in the unit circuit 5(n+3) of a stage three stages after this stage. In addition, the output terminal 69 is connected to a stabilization node NB in the unit circuit 5(n+2) of a stage two stages after this stage and a stabilization node NB in the unit circuit 5(n−3) of a stage three stages before this stage.

Note that, in the present embodiment, target node stabilization transistors are implemented by the thin film transistors M8b, M8c, M14b, M14c, M14Ab, and M14Ac. Note also that a first target node stabilization transistor is implemented by the thin film transistors M8b, M14b, and M14Ab and a second target node stabilization transistor is implemented by the thin film transistors M8c, M14c, and M14Ac.

<5.3 Operation of the Unit Circuit>

Figure 37:
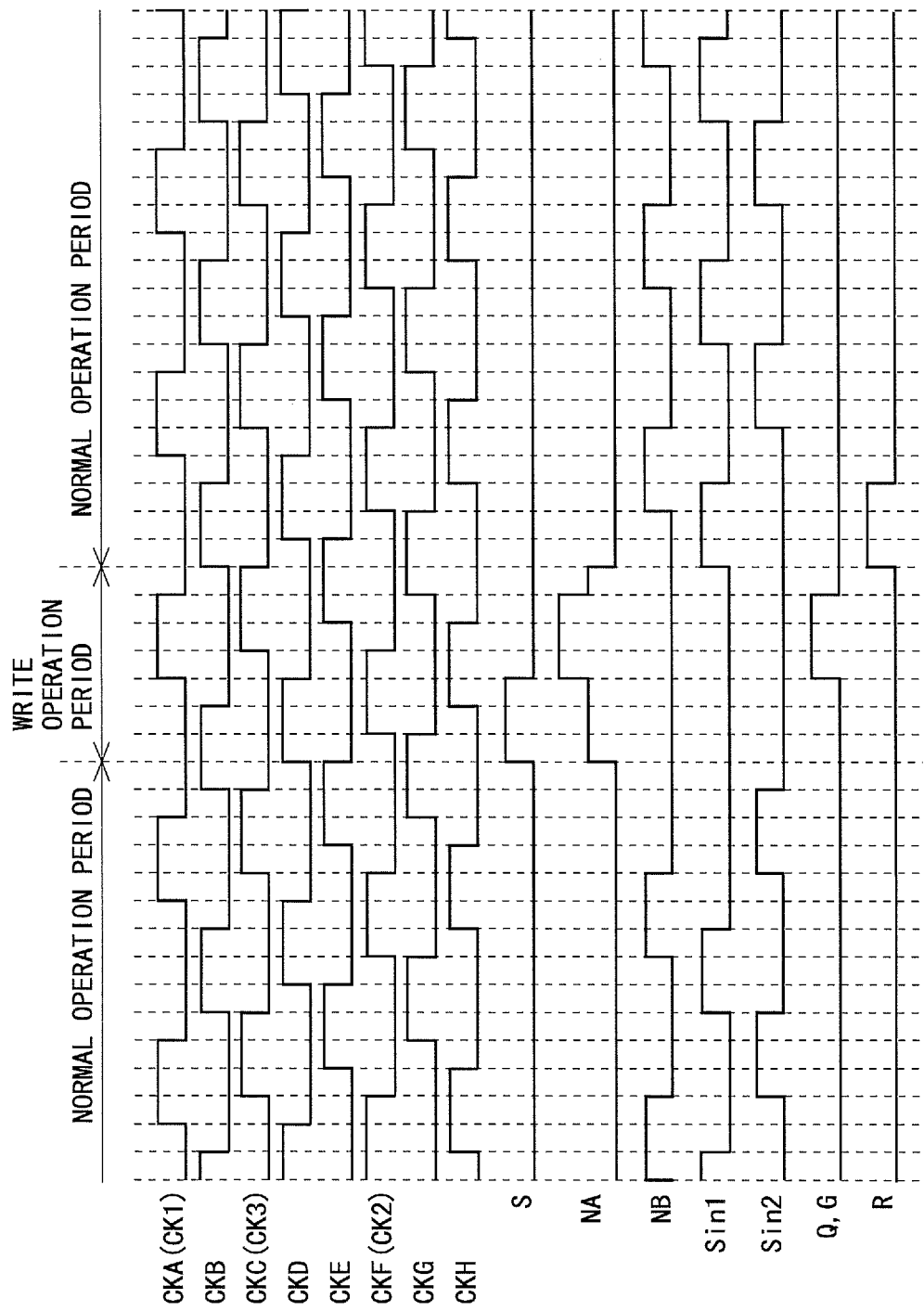
FIG. 37 is an overall signal waveform diagram for an operation period of a liquid crystal display device of the fifth embodiment.
Figure 38:
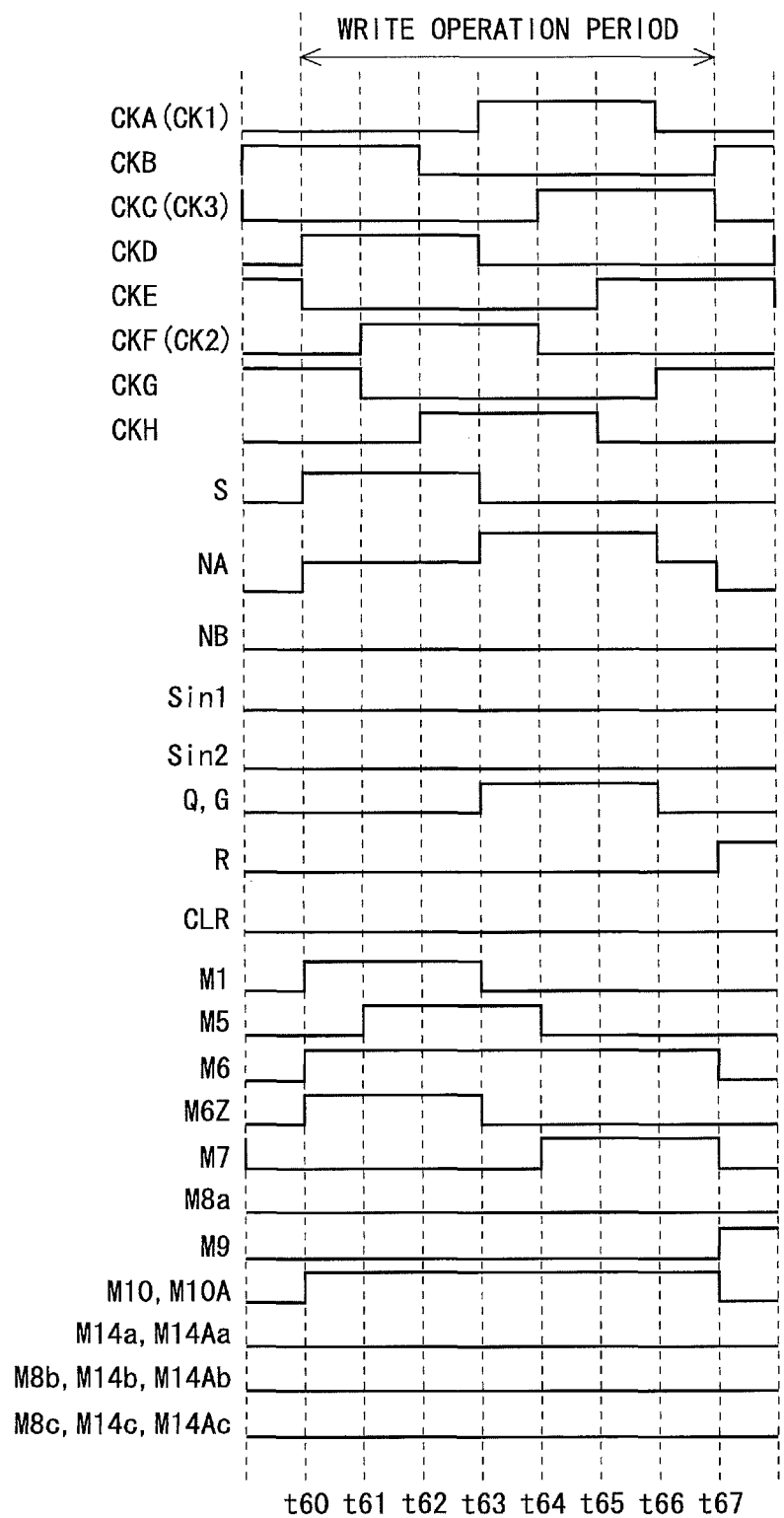
FIG. 38 is a signal waveform, diagram, for describing operation, performed during a write operation period in the fifth embodiment.

Next, the operation of the unit circuit 5 of the present embodiment will be described. Here, too, attention is focused on the unit circuit 5(n) of the nth stage. First, with reference to FIGS. 35, 36, 37, and 38, operation performed during a write operation period will be described. FIG. 37 is an overall signal waveform diagram for an operation period of the liquid crystal display device. FIG. 38 is a signal waveform diagram for describing operation performed during a write operation period. Note that, in the present embodiment, the on-duty (duty cycle) of the 8-phase clock signals is ⅜.

At time point t60, the set signal S (output signal Q(n−3)) changes from a low level to a high level. Hence, the thin film transistor M1 goes into an on state and the capacitor CAP is charged. By this, the potential of the output control node NA increases and the thin film transistors M6, M10, and M10A go into an on state. In addition, by a pulse of the set signal S, the thin film transistor M6Z goes into an on state. By the thin film transistors M6 and M6Z going into an on state, the potential of the stabilization node NB is drawn to the VSS potential. Here, during a period from time point t60 to time point t63, since the reset signal R (output signal Q(n+4)), the clear signal CLR, and the potential of the stabilization node NB are at a low level, the thin film transistors M9, M2, and M8a are maintained in an off state. In addition, during this period, since the control signal Sin1 and the control signal Sin2 are at a low level, the thin film transistors M8b and M8c are maintained in an off state. By the above, the potential of the output control node NA does not decrease during the period from time point t60 to time point t63.

At time point t61, the clock signal CKF (CK2) changes from a low level to a high level. Hence, the thin film transistor M5 goes into an on state. At this time, since the thin film transistors M6 and M6Z are in the on state, even when the thin film transistor M5 changes from an off state to an on state, the potential of the stabilization node NB is maintained at the low level. At time point t62, the clock signal CKH changes from a low level to a high level. Since the clock signal CKH is not provided to the unit circuit 5(n), the internal, state of the unit circuit 5(n) does not change at time point t62.

At time point t63, the clock signal CKA (CK1) changes from a low level to a high level. By this, in the same manner as at time point t02 of the first embodiment, a large voltage is applied to the gate terminals of the thin film transistors M10 and M10A, and the potentials of the output signals Q and G (the potentials of the output terminals 58 and 59) increase to a high-level potential of the clock signal CKA (CK1). Here, during a period from time point t63 to time point t66, since the reset signal R is at the low level, the thin film transistor M9 is maintained in the off state. In addition, during this period, since the clear signal CLR is at the low level, the thin film transistors M2, M12, and M12A are maintained in an off state. Furthermore, during this period, since the potential of the stabilization node MB is at the low level, the thin film transistors M8a, M14a, and M14Aa are maintained in an off state. Moreover, during this period, since the control signal Sin1 and the control signal Sin2 are at the low level, the thin film transistors M8b, M8c, M14b, M14c, M14Ab, and M14Ac are maintained in an off state. By the above, the potential of the output control node NA, the potential of the output signal Q, and the potential of the output signal G do not decrease during the period from time point t63 to time point t66.

At time point t64, the clock signal CKC (CK3) changes from, a low level to a high level. Hence, the thin, film transistor M7 goes into an on state. By this, the potential of the stabilization node NB is drawn to the VSS potential. At time point t65, the clock signal CKE changes from a low level to a high level. Since the clock signal CKE is not provided to the unit circuit 5(n), the internal state of the unit circuit 5(n) does not change at time point t65.

At time point t66, the clock signal CKA (CK1) changes from the high level to a low level. By this, with a decrease in the potential of the input terminal 53, the potentials of the output terminals 58 and 59 (the potentials of the output signals Q and G) decrease. When, the potential of the output terminal 59 decreases, the potential of the output control node NA also decreases through the capacitor CAP.

At time point t67, the reset signal R changes from the low level to a high level. By this, the potential of the output-control node NA goes to a low level.

By each unit circuit 5 performing operation such as that described above, the plurality of gate bus lines GL(1) to GL(i) provided to the liquid crystal display device sequentially go into a selected state, and writing to the pixel capacitances is performed row by row.

Figure 39:
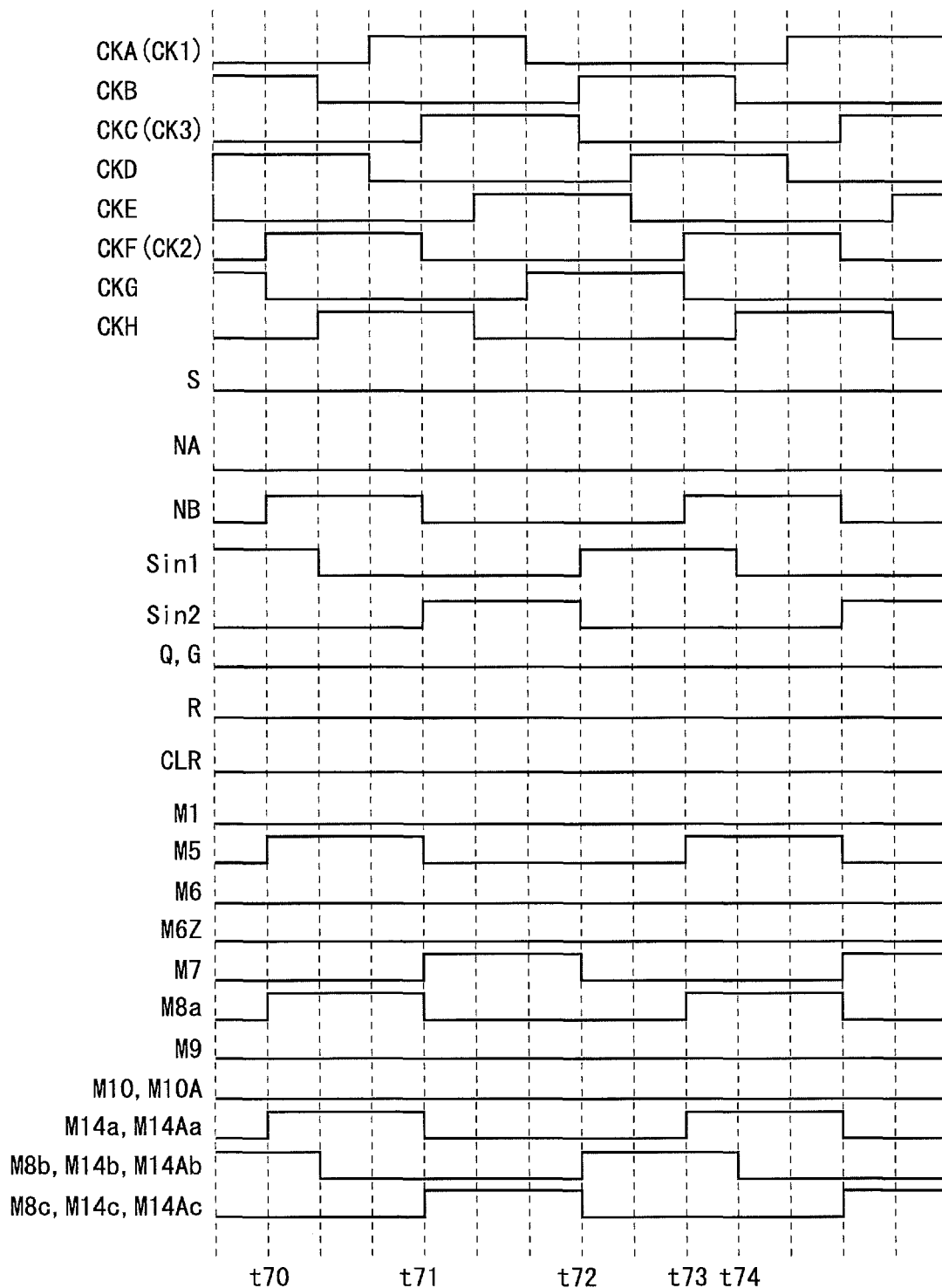
FIG. 39 is a signal waveform diagram for describing operation performed during a normal operation period in the fifth embodiment.

Next, with reference to FIGS. 35, 36, 37, and 39, operation performed during a normal operation period will be described. FIG. 39 is a signal waveform diagram for describing operation performed during a normal operation period. In FIG. 39, attention is focused on a period from time point t70 to time point t74. Note that a period, from time point t70 to time point t73 corresponds to a clock period of the 8-phase clock signals.

At time point t70, the clock signal CKF (CK2) changes from, a low level to a high level, by which the thin film transistor M5 goes into an on state and the potential of the stabilization node NB changes from a low level to a high level. In addition, at time point t71, the clock signal CKC (CK3) changes from a low level to a high level, by which the thin film transistor M7 goes into an on state and the potential of the stabilization node NB changes from the high level to a low level. By the above, during a period from time point t70 to time point t71, the thin film transistors M8a, M14a, and M14Aa go into an on state. During a period from time point t71 to time point t72, since the control signal Sin2 is at a high level, the thin film transistors M8c, M14c, and M14Ac are in an on state. During a period, from time point t72 to time point t74, since the control signal Sin1 is at a high level, the thin film transistors M8b, M14b, and M14Ab are in an on state. By the above, the potential of the output control node NA, the potential of the output signal Q, and the potential of the output signal G are always drawn to the VSS potential during the normal operation period.

<5.4 Effects>

According to the present embodiment, as in the first embodiment, a period during which the potential of the stabilization node NB is at a high level is substantially a ⅜ period of the operation period of the device. Therefore, as in the second embodiment, the occurrence of a threshold shift of the thin film transistor M8a that contributes to the drawing of the potential of the output control node NA to the VSS potential is suppressed. In addition, according to the present embodiment, the unit circuit 5 is provided with three thin film transistors for drawing the potential of the output control node NA to the VSS potential, three thin film transistors for drawing the potential of the output terminal 58 (the potential of the output signal Q) to the VSS potential, and three thin film transistors for drawing the potential of the output terminal 59 (the potential of the output signal G) to the VSS potential, in addition to thin film transistors that are controlled by the clear signal CLR. Then, the state of each set of three thin film transistors is controlled such that, during the normal operation period, at all times, at least one of the three thin film transistors is in an on state. Hence, the potential of the output control node NA, the potential of the output signal Q, and the potential of the output signal G are always drawn to the VSS potential during the normal operation period. By the above, according to the present embodiment, as in the fourth embodiment, the reliability of long-term operation regarding the driving of the gate bus lines GL can be increased over the conventional configuration, and the stability of circuit operation can be remarkably increased.

6. Sixth Embodiment

<6.1 Overview>

Figure 40:
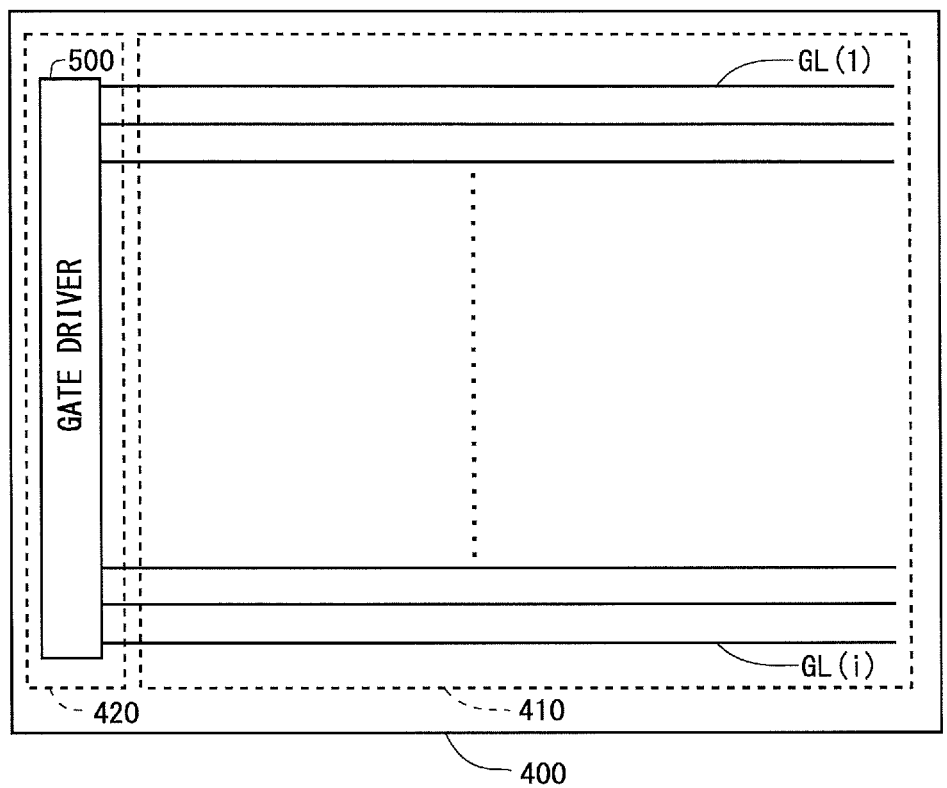
FIG. 40 is a diagram showing a positional relationship between a display unit and a gate driver of a sixth embodiment of the present invention.

A sixth embodiment of the present invention will be described. In the present embodiment, a positional relationship between a display unit 410 and a gate driver 500 differs from that of the above-described first to fifth embodiments (see FIG. 5). In the present embodiment, as shown in FIG. 40, a gate driver 500 is formed in a region outside a display unit (display region) 410 in a liquid crystal panel 400. The region in which the gate driver 500 is thus formed is hereinafter referred to as a drive circuit formation region. The drive circuit formation region is denoted by reference character 420. Note that the source driver 300 can also be formed in the drive circuit formation region 420.

In the present embodiment, for a pixel TFT (the thin film transistor 41 of FIG. 4), for example, an oxide semiconductor TFT having an In—Ga—Zn—O-based semiconductor film as an active layer is used. In addition, for a TFT (circuit TFT) that forms the gate driver 500, for example, a crystalline silicon TFT having a polycrystalline silicon film as an active layer is used.

For the configuration and operation of the gate driver 500 and the configuration and operation of the unit circuit 5, the same ones as those of any of the above-described first to fifth embodiments can be adopted. Therefore, description thereof is omitted.

<6.2 For an Active Matrix Substrate>

Figure 41:
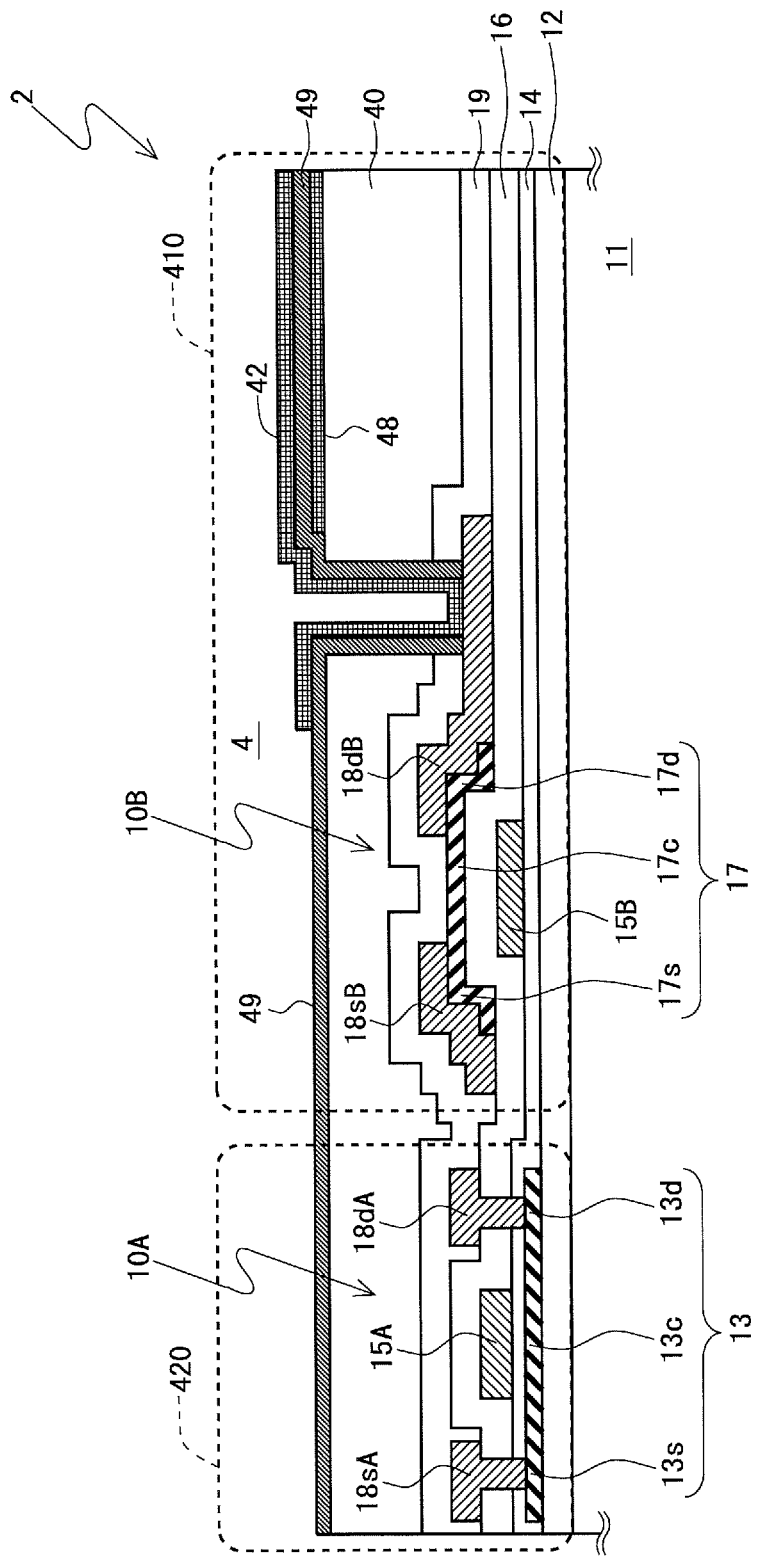
FIG. 41 is a schematic cross-sectional view of an active matrix substrate of the sixth embodiment.

With reference to FIG. 41, an active matrix substrate 2 which is a substrate of a liquid crystal panel 400 of the present embodiment will be described in detail below. FIG. 41 shows the cross-sectional structures of a crystalline silicon TFT (hereinafter, referred to as "first thin film transistor") 10A and an oxide semiconductor TFT (hereinafter, referred to as "second thin film transistor") 10B in the active matrix substrate 2. As shown in FIG. 41, in the active matrix substrate 2, the second thin film transistor 10B is formed as a pixel TFT in each pixel formation portion 4 (see FIG. 4) in the display unit 410, and the first thin film transistor 10A is formed as a circuit TFT in the drive circuit formation region 420.

The active matrix substrate 2 includes a substrate 11, a base film 12 formed on a surface of the substrate 11, the first thin film transistor 10A formed on the base film 12, and the second thin film transistor 10B formed on the base film 12. The first thin film transistor 10A has an active region that mainly includes crystalline silicon. The second thin film transistor 10B has an active region that mainly includes an oxide semiconductor. The first thin film transistor 10A and the second thin film transistor 10B are integrally fabricated on the substrate 11. Note that the "active region" used herein indicates a region of a semiconductor layer in which a channel is formed, the semiconductor layer serving as an active layer of a TFT.

The first thin film transistor 10A has a crystalline silicon semiconductor layer (e.g., a low-temperature polysilicon layer) 13 formed on the base film 12; a first insulating layer 14 that covers the crystalline silicon semiconductor layer 13; and a gate electrode 15A provided on the first insulating layer 14. A portion of the first insulating layer 14 located between the crystalline silicon semiconductor layer 13 and the gate electrode 15A functions as a gate insulating film of the first thin film transistor 10A. The crystalline silicon semiconductor layer 13 has a region (active region) 13c in which a channel is formed, and a source region 13s and a drain region 13d located on both sides of the active region, respectively. In this example, a portion of the crystalline silicon semiconductor layer 13 that overlaps the gate electrode 15A with the first insulating layer 14 therebetween serves as the active region 13c. The first thin film transistor 10A also has a source electrode 18sA and a drain electrode 18dA which are connected to the source region 13s and the drain region 13d, respectively. The source electrode 18sA and the drain electrode 18dA are provided on an interlayer insulating film (here, a second insulating layer 16) that covers the gate electrode 15A and the crystalline silicon semiconductor layer 13, and are connected to the crystalline silicon semiconductor layer 13 in contact holes made in the interlayer insulating film.

The second thin film transistor 10B has a gate electrode 15B provided on the base film 12; the second insulating layer 16 that covers the gate electrode 15B; and an oxide semiconductor layer 17 placed on the second insulating layer 16. As shown in FIG. 41, the first insulating layer 14 which is the gate insulating film of the first thin film transistor 10A may be extended to a region in which the second thin film transistor 10B is to be formed. In this case, the oxide semiconductor layer 17 may be formed on the first insulating layer 14. A portion of the second insulating layer 16 located between the gate electrode 15B and the oxide semiconductor layer 17 functions as a gate insulating film of the second thin film transistor 10B. The oxide semiconductor layer 17 has a region (active region) 17c in which a channel is formed; and a source contact region 17s and a drain contact region 17d located on both sides of the active region, respectively. In this example, a portion of the oxide semiconductor layer 17 that overlaps the gate electrode 15B with the second insulating layer 16 therebetween serves as the active region 17c. In addition, the second thin film transistor 10B further has a source electrode 18sB and a drain electrode 18dB which are connected to the source contact region 17s and the drain contact region 17d, respectively. Note that a configuration in which the base film. 12 is not provided on the substrate 11 can also be adopted.

The first thin film transistor 10A and the second thin film transistor 10B are covered with a passivation film 19 and a planarization film 40. In the second thin film transistor 10B that functions as a pixel TFT, the gate electrode 15B is connected to a gate bus line, the source electrode 18sB is connected to a source bus line, and the drain electrode 18dB is connected to a pixel electrode 42. In this example, the drain electrode 18dB is connected to its corresponding pixel electrode 42 in an opening portion made in the passivation film 19 and the planarization film 40. A video signal is supplied to the source electrode 18sB through the source bus line, and a required charge is written to the pixel electrode 42 based on a gate signal from the gate bus line.

Note that, as shown in FIG. 41, a transparent conductive layer 48 (corresponding to the common electrode 45 of FIG. 4) may be formed on the planarization film 40, and a third insulating layer 49 may be formed between the transparent conductive layer 48 and the pixel electrode 42. In this case, a slit-like opening may be provided in the pixel electrode 42. Such an active matrix substrate 2 can be applied to, for example, a display device of a fringe field switching (FFS) mode.

In the example shown in FIG. 41, the first thin film transistor 10A has a top-gate structure in which the crystalline silicon semiconductor layer 13 is placed between the gate electrode 15A and the substrate 11 (the base film 12). On the other hand, the second thin film transistor 10B has a bottom-gate structure in which the gate electrode 15B is placed between the oxide semiconductor layer 17 and the substrate 11 (the base film 12). By adopting such structures, upon integrally forming two types of thin film transistors (here, the first thin film transistor 10A and the second thin film transistor 10B) on the same substrate 11, an increase in the number of manufacturing steps and manufacturing cost can be more effectively suppressed. Note that the TFT structures of the first thin film transistor 10A and the second thin film transistor 10B are not limited to the example shown in FIG. 41.

<6.3 Effects>

According to the present embodiment, for a substrate of the liquid crystal panel 400, the active matrix substrate 2 having a structure in which an oxide semiconductor TFT is adopted as a pixel TFT which is provided in the display unit (display region) 410 and a crystalline silicon TFT is adopted as a circuit TFT which is provided in the drive circuit formation region 420 is used. In such a case, too, by adopting the same configurations and operation of the gate driver 500 and the unit circuit 5 as those of any of the above-described first to fifth embodiments, the reliability of long-term operation regarding the driving of the gate bus lines can be increased over the conventional configuration.

7. Others

In the first to fifth embodiments, the gate drivers 500 are formed in the display unit 410. However, the present invention is not limited thereto. For example, also in the case where the gate driver 500 is formed in a picture-frame region as in the sixth embodiment, the present invention can be applied. In addition, although the first to fifth embodiments describe an example in which the present invention is applied to a so-called oddly shaped display (see FIG. 6), the present invention is not limited thereto, and the present invention can also be applied to a liquid crystal display device having a general rectangular display unit 410.

In addition, although 8-phase clock signals are used as gate clock signals GCK in each embodiment, the present invention is not limited thereto. For example, by using clock signals whose number of phases is greater than 8 phases, such as 16-phase clock signals, a period during which the potential of the stabilization node NB is at a high level may be set to a period less than half the operation period of the device.

Furthermore, regarding the configuration of the unit circuit 5 of each embodiment, the present invention can also be applied to a case in which only one or two of the three thin film transistors M8, M14, and M14A which function as a stabilization transistor is (are) provided. Note, however, that the stability of circuit operation becomes somewhat poorer.

Figure 42:
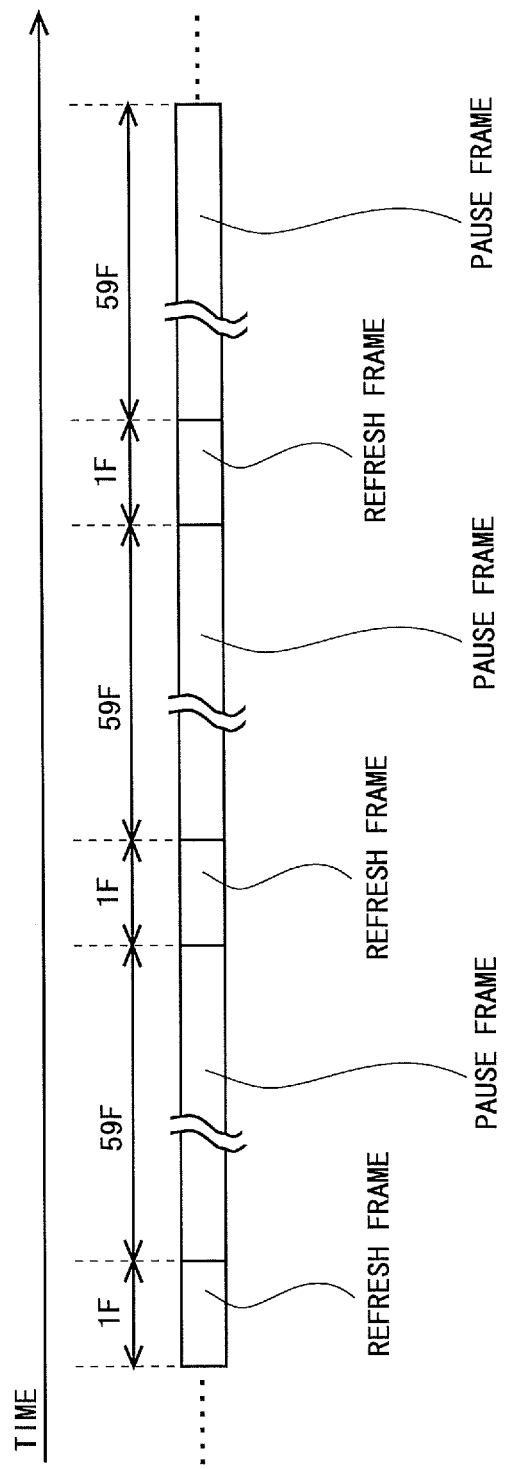
FIG. 42 is a diagram for describing an example of pause driving.
Figure 43:
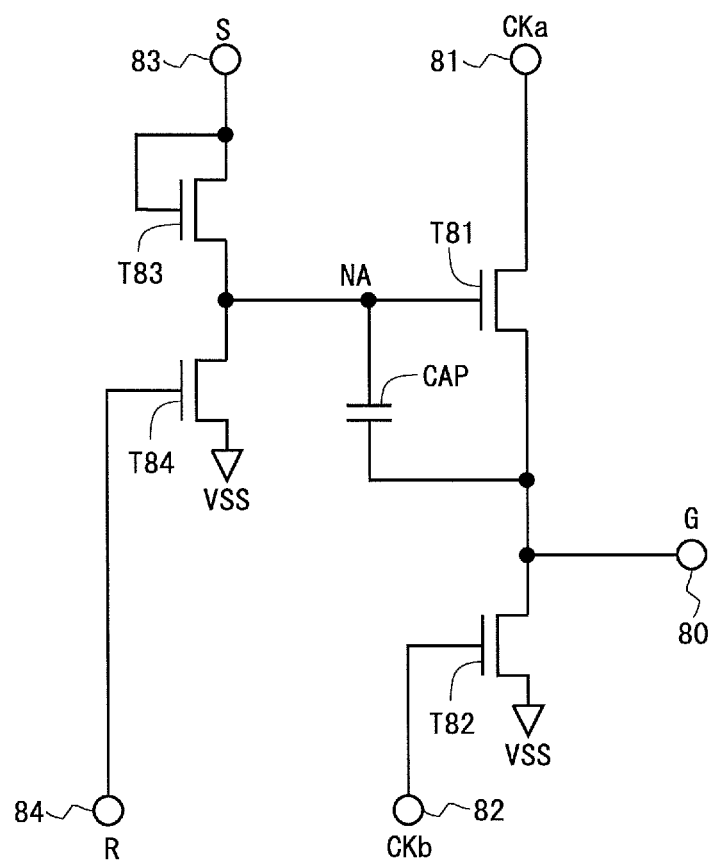
FIG. 43 is a circuit diagram of a conventional unit circuit having the simplest configuration.
Figure 44:
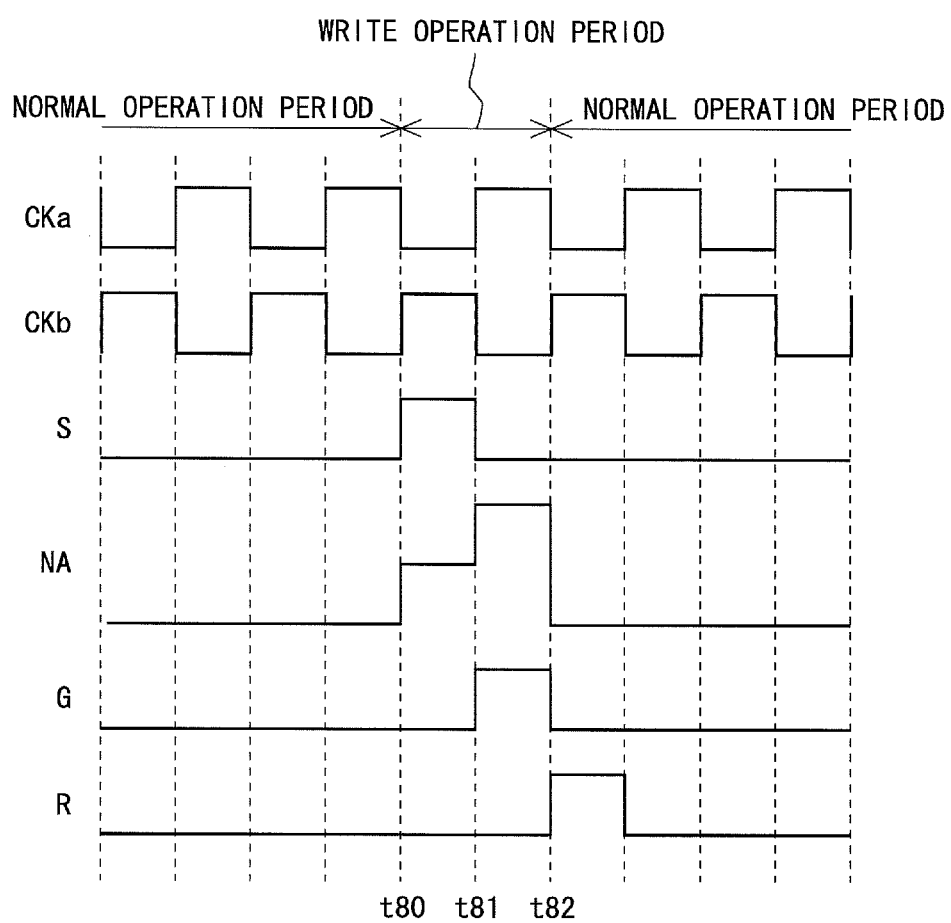
FIG. 44 is a signal waveform, diagram for describing the operation of the unit circuit of the configuration shown in FIG. 43.
Figure 45:
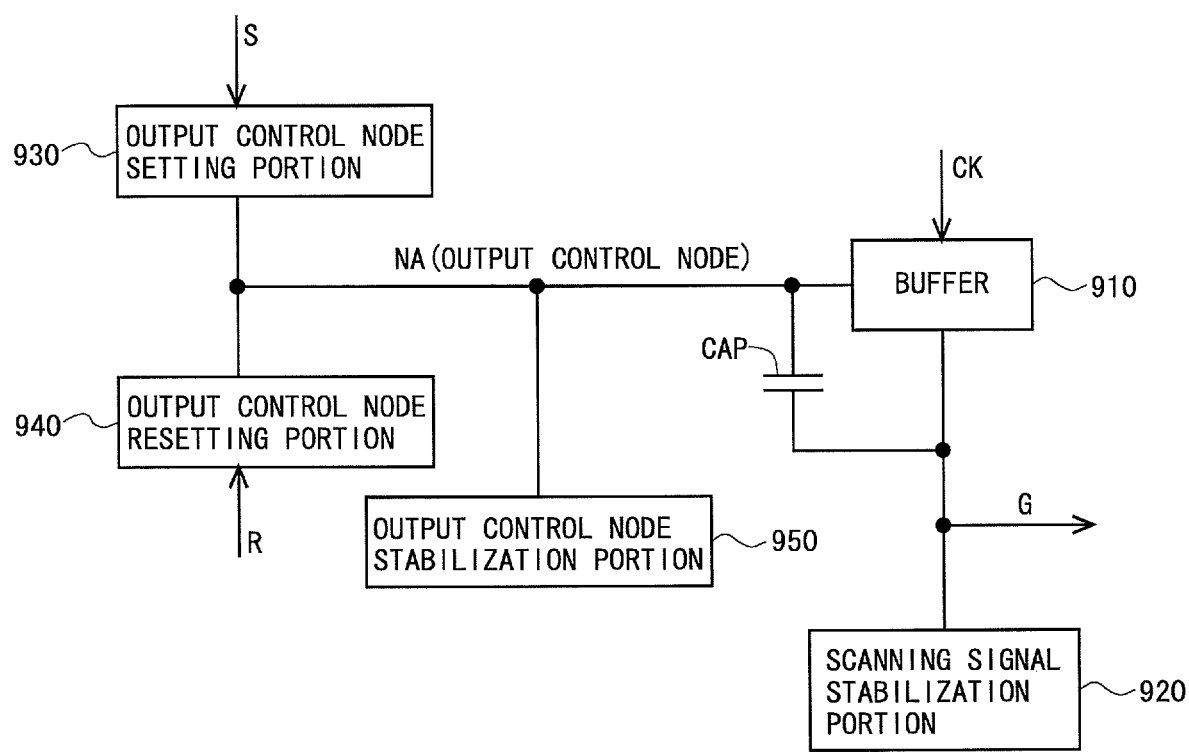
FIG. 45 is a diagram schematically showing a configuration of a unit circuit having an output control node stabilization portion.

Moreover, the present invention can also be applied to a liquid crystal display device that adopts pause driving. The pause driving refers to a drive method in which a pause frame (pause period) during which write operation is paused by bringing ail gate bus lines into a non-scanning state is provided between a refresh frame; (write period) and a refresh frame (write period). Here, the refresh frame refers to a frame during which charging of the pixel capacitances in the display unit is performed based on an image signal for one frame (for one screen). Note that the pause driving is also called low-frequency driving. FIG. 42 is a diagram for describing an example of the pause driving. In the example shown in FIG. 42, a refresh frame for one frame (one frame period is 16.67 ms) of a general liquid crystal display device whose refresh rate (driving frequency) is 60 Hz and a pause frame for 59 frames appear alternately. In a liquid crystal display device that adopts such pause driving, during a pause frame, signals for control, etc., do not need to be provided to drive circuits (a gate driver and a source driver). Hence, the driving frequency of the drive circuits as a whole decreases, enabling to achieve low power consumption.

In the present invention, a thin film transistor to be adopted is not limited to any, but when a thin film transistor with a large threshold shift is adopted, effects are more remarkably obtained. That is, when a thin film transistor having amorphous silicon or an etch-stop oxide semiconductor TFT is adopted, more effects are obtained.

Note that this application claims priority to Japanese Patent Application No. 2015-205265 titled "Shift Register and Display Device Including Same" filed Oct. 19, 2015, the content of which is included herein by reference.

DESCRIPTION OF REFERENCE CHARACTERS

4: PIXEL FORMATION PORTION
5 and 5(1) to 5(i): UNIT CIRCUIT
41: THIN FILM TRANSISTOR (IN A PIXEL FORMATION PORTION)
200: DISPLAY CONTROL CIRCUIT
300: SOURCE DRIVER (VIDEO SIGNAL LINE DRIVE CIRCUIT)
400: LIQUID CRYSTAL PANEL
410: DISPLAY UNIT
500: GATE DRIVER (SCANNING SIGNAL LINE DRIVE CIRCUIT)
510: SHIFT REGISTER
512: TARGET NODE CONTROL PORTION
CAP: CAPACITOR (CAPACITIVE ELEMENT)
M1, M2, M5, M6, M6Z, M7, M8, M8a, M8b, M8c, M8d, M9, M10, M10A, M12, M12A, M14, M14a, M14b, M14c, M14d, M14A, M14Aa, M14Ab, M14Ac, and M14Ad: THIN FILM TRANSISTOR (IN A UNIT CIRCUIT)
NA: OUTPUT CONTROL NODE
NB: STABILIZATION NODE
GL(1) to GL(1): GATE BUS LINE
SL(1) to SL(j): SOURCE BUS LINE
GCK: GATE CLOCK SIGNAL
CKA, CKB, CKC, CKD, CKE, CKF, CKG, CKH, CK1, CK2, and CK3: CLOCK SIGNAL
S: SET SIGNAL
R: RESET SIGNAL
G and Q: OUTPUT SIGNAL
GOUT and GOUT(1) to GOUT(i): SCANNING SIGNAL
VSS: LOW-LEVEL DIRECT-CURRENT POWER SUPPLY POTENTIAL

The invention claimed is:

1. A shift register for driving scanning signal lines, the shift register including a plurality of stages and sequentially outputting active output signals from the plurality of stages based on a plurality of clock signals that periodically repeat an on level and an off level, wherein
a unit circuit that forms each of the plurality of stages includes:
an output node configured to output the output signal;
an output control transistor having a control terminal, a first conduction terminal to which one of the plurality of clock signals is provided, and a second conduction terminal connected to the output node;
an output control node connected to the control terminal of the output control transistor;
an output control node setting portion configured to bring the output control node to an on level, based on an output signal outputted from a preceding stage; and
a target node control portion configured to maintain a target node at an off level during a normal operation period, the target node being at least one of the output node and the output control node,
the target node control portion includes:
at least one stabilization transistor having a control terminal, a first conduction terminal connected to a corresponding target node, and a second conduction terminal to which an off-level potential is provided;
a stabilization node connected to the control terminal of the stabilization transistor, and
a stabilization node control portion configured to control a level of the stabilization node,
the plurality of clock signals are clock signals of eight or more phases with an on-duty of less than ½, and
the stabilization node control portion brings the stabilization node to an on level for a period less than 50 percent of the normal operation period, based on two or more clock signals among the plurality of clock signals.

2. The shift register according to claim 1, wherein
the target node control portion regards both of the output node and the output control node as target nodes, and
the stabilization transistor includes:
an output control node stabilization transistor having a first conduction terminal connected to the output control node; and
an output node stabilization transistor having a first conduction terminal connected to the output node.

3. The shift register according to claim 1, wherein
the plurality of clock signals are 8-phase clock signals with an on-duty of ¼, and
during the normal operation period, the stabilization node control portion brings the stabilization node to an on level, based on a clock signal whose phase is advanced by 45 degrees relative to a phase of the clock signal provided to the first conduction terminal of the output control transistor, and brings the stabilization node to an off level, based on a clock signal whose phase is delayed by 45 degrees relative to the phase of the clock signal provided to the first conduction terminal of the output control transistor.

4. The shift register according to claim 1, wherein
the plurality of clock signals are 8-phase clock signals with an on-duty of ⅜, and
during the normal operation period, the stabilization node control portion brings the stabilization node to an on level, based on a clock signal whose phase is advanced by 90 degrees relative to a phase of the clock signal provided to the first conduction terminal of the output control transistor, and brings the stabilization node to an off level, based on a clock signal whose phase is delayed by 45 degrees relative to the phase of the clock signal provided to the first conduction terminal of the output control transistor.

5. The shift register according to claim 1, wherein
the plurality of clock signals are 8-phase clock signals with an on-duty of ¼, and
during the normal operation period, the stabilization node control portion brings the stabilization node to an on level, based on a clock signal whose phase is advanced by 90 degrees relative to a phase of the clock signal provided to the first conduction terminal of the output control transistor, and brings the stabilization node to an off level, based on a clock signal whose phase is delayed by 45 degrees relative to the phase of the clock signal provided to the first conduction terminal of the output control transistor.

6. The shift register according to claim 1, wherein
the target node control portion further includes a plurality of target node stabilization transistors per target node, each of the plurality of target node stabilization transistors having a control terminal connected to a stabilization node in a unit circuit forming a stage other than this stage, a first conduction terminal connected to a corresponding target node, and a second conduction terminal to which an off-level potential is provided, and
during a period in the normal operation period other than a period during which the stabilization node in the unit circuit forming this stage is at an on level, at all times, at least one of the stabilization nodes connected to the respective control terminals of the plurality of target node stabilization transistors is at an on level.

7. The shift register according to claim 6, wherein
the plurality of clock signals are 8-phase clock signals with an on-duty of ¼,
during the normal operation period, the stabilization node control portion brings the stabilization node to an on level, based on a clock signal whose phase is advanced by 45 degrees relative to a phase of the clock signal provided to the first conduction terminal of the output control transistor, and brings the stabilization node to an off level, based on a clock signal whose phase is delayed by 45 degrees relative to the phase of the clock signal provided to the first conduction terminal of the output control transistor, and
the plurality of target node stabilization transistors include:
  a first target node stabilization transistor having a control terminal connected to a stabilization node in a unit circuit forming a stage two stages before this stage;
  a second target node stabilization transistor having a control terminal connected to a stabilization node in a unit circuit forming a stage two stages after this stage; and
  a third target node stabilization transistor having a control terminal connected to a stabilization node in a unit circuit forming a stage four stages after this stage.

8. The shift register according to claim 6, wherein
the plurality of clock signals are 8-phase clock signals with an on-duty of ⅜,
during the normal operation period, the stabilization node control portion brings the stabilization node to an on level, based on a clock signal whose phase is advanced by 90 degrees relative to a phase of the clock signal provided to the first conduction terminal of the output control transistor, and brings the stabilization node to an off level, based on a clock signal whose phase is delayed by 45 degrees relative to the phase of the clock signal provided to the first conduction terminal of the output control transistor, and
the plurality of target node stabilization transistors include:
  a first target node stabilization transistor having a control terminal connected to a stabilization node in a unit circuit forming a stage two stages before this stage; and
  a second target node stabilization transistor having a control terminal connected to a stabilization node in a unit circuit forming a stage three stages after this stage.

9. The shift register according to claim 1, wherein the transistors included in the unit circuit are thin film transistors having amorphous silicon.

10. The shift register according to claim 1, wherein the transistors included in the unit circuit are thin film transistors having an oxide semiconductor layer.

11. A display device comprising:
a display unit in which a plurality of scanning signal lines are disposed; and
a shift register according to claim 1, the shift register including a plurality of stages provided so as to have a one-to-one correspondence with the plurality of scanning signal lines.

12. The display device according to claim 11, wherein the shift register is formed in the display unit.

* * * * *